US006861742B2

(12) United States Patent
Miyamoto et al.

(10) Patent No.: US 6,861,742 B2
(45) Date of Patent: Mar. 1, 2005

(54) WAFER LEVEL CHIP SIZE PACKAGE HAVING REROUTING LAYERS

(75) Inventors: Toshio Miyamoto, Kokubunji (JP); Ichiro Anjo, Koganei (JP); Asao Nishimura, Koganei (JP); Mitsuaki Katagiri, Nishi-Tokyo (JP); Yuji Shirai, Hamura (JP); Yoshihide Yamaguchi, Fujisawa (JP)

(73) Assignee: Renesas Technology Corp., Tokyo (JP)

( * ) Notice: Subject to any disclaimer, the term of this patent is extended or adjusted under 35 U.S.C. 154(b) by 4 days.

(21) Appl. No.: 10/046,446

(22) Filed: Jan. 16, 2002

(65) Prior Publication Data

US 2002/0093082 A1 Jul. 18, 2002

(30) Foreign Application Priority Data

Jan. 18, 2001 (JP) ........................................ 2001-010821

(51) Int. Cl.[7] .............................................. H01L 23/48
(52) U.S. Cl. ........................................ 257/693; 257/698
(58) Field of Search ............................... 257/678, 680, 257/690, 691, 692, 693, 698, 707, 723, 779, 784, 758, 369

(56) References Cited

U.S. PATENT DOCUMENTS

| 6,103,552 | A | * | 8/2000 | Lin .............................. 438/113 |
| 6,469,393 | B2 | * | 10/2002 | Oya ............................. 257/779 |
| 6,621,164 | B2 | * | 9/2003 | Hwang et al. ............... 257/738 |
| 2002/0076913 | A1 | * | 6/2002 | Lee .............................. 438/614 |
| 2002/0125568 | A1 | * | 9/2002 | Jiang et al. .................. 257/737 |
| 2003/0153099 | A1 | * | 8/2003 | Jiang et al. .................... 438/1 |

FOREIGN PATENT DOCUMENTS

| JP | 7-161761 | 6/1995 |
| JP | 11-40563 | 2/1999 |
| WO | WO 99/23696 | 5/1999 |

OTHER PUBLICATIONS

"Electronics Mount Technology Extra Edition 2000", Gijyutsu–chyuosa–kai Corp., issued May 28, 2000, pp. 81–113.

* cited by examiner

Primary Examiner—Eddie Lee
Assistant Examiner—Douglas W. Owens
(74) Attorney, Agent, or Firm—Mattingly, Stanger & Malur, P.C.

(57) ABSTRACT

A semiconductor integrated circuit device includes a semiconductor substrate, a circuit element formed on one major surface of the semiconductor substrate and constituting an integrated circuit having a plurality of functions or a plurality of characteristics, an internal connection terminal, connected to the integrated circuit, for selecting one of the plurality of functions or one of the characteristics in the integrated circuit, an insulating layer covering the internal connection terminal such that the internal connection terminal is selectively exposed, and an external connection terminal arranged on the insulating layer. One of the plurality of functions or one of the plurality of characteristics is selected by a connection state between the internal connection terminal and the external connection terminal.

19 Claims, 51 Drawing Sheets

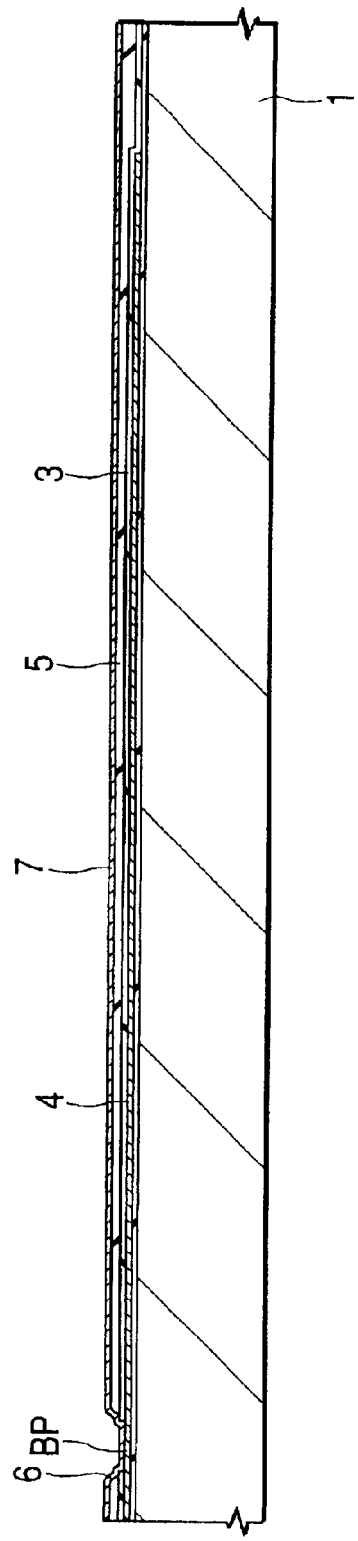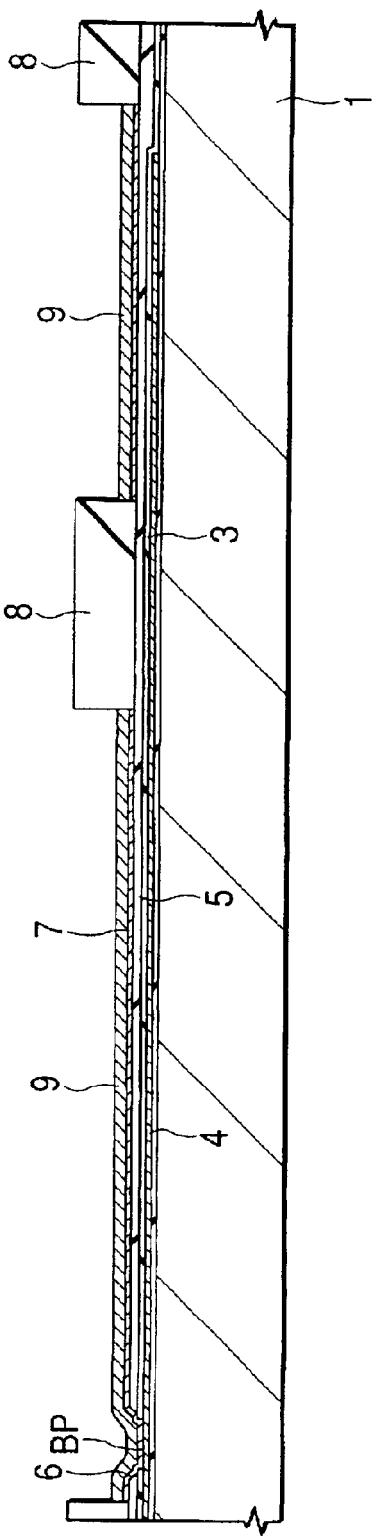

| FUNCTION | PAD | | BIT STRUCTURE | ACTION MODE | |
|---|---|---|---|---|---|
| | BP1 | BP2 | | DDR | SYNCHRONOUS |
| FUNCTION 1 | Vdd | Vdd | ×32Bit | ○ | — |
| FUNCTION 2 | Vdd | Vss | ×32Bit | — | ○ |
| FUNCTION 3 | Vss | Vdd | ×64Bit | ○ | — |
| FUNCTION 4 | Vss | Vss | ×64Bit | — | ○ |

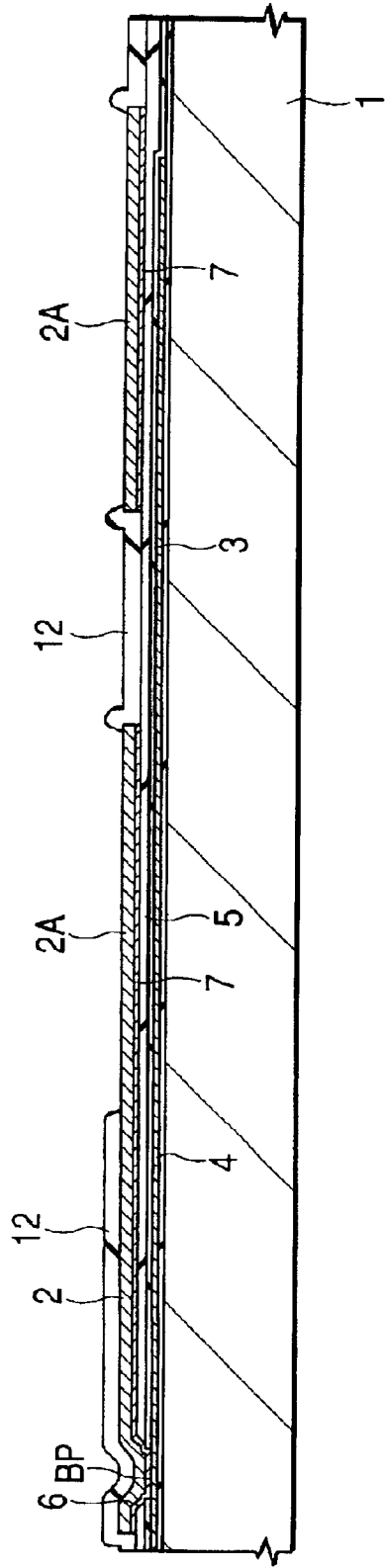
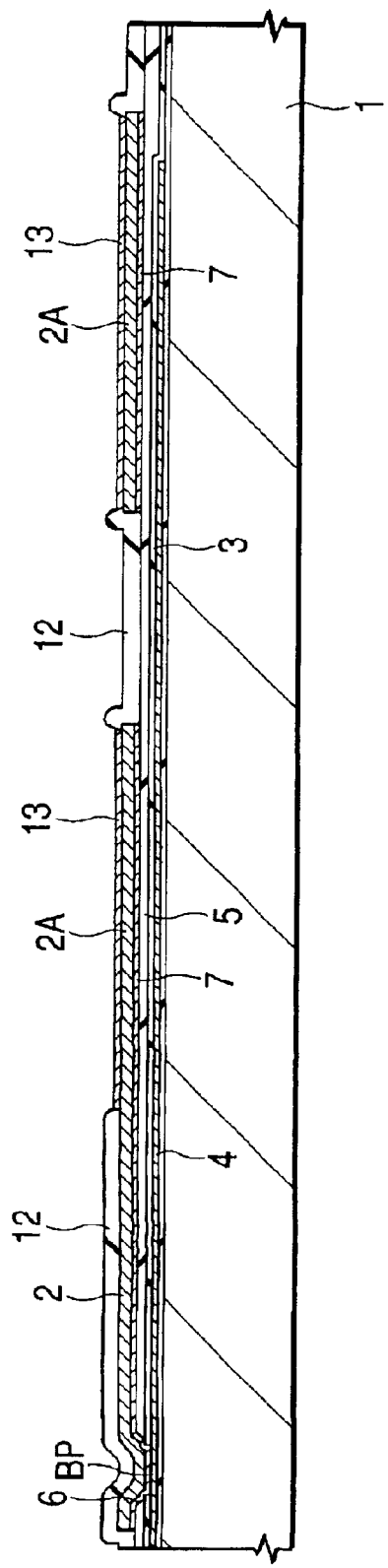

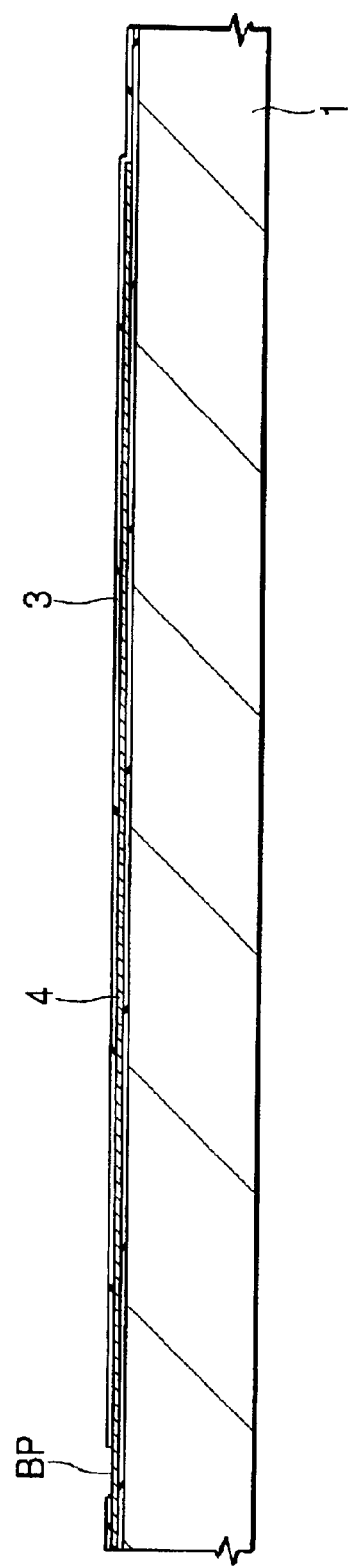
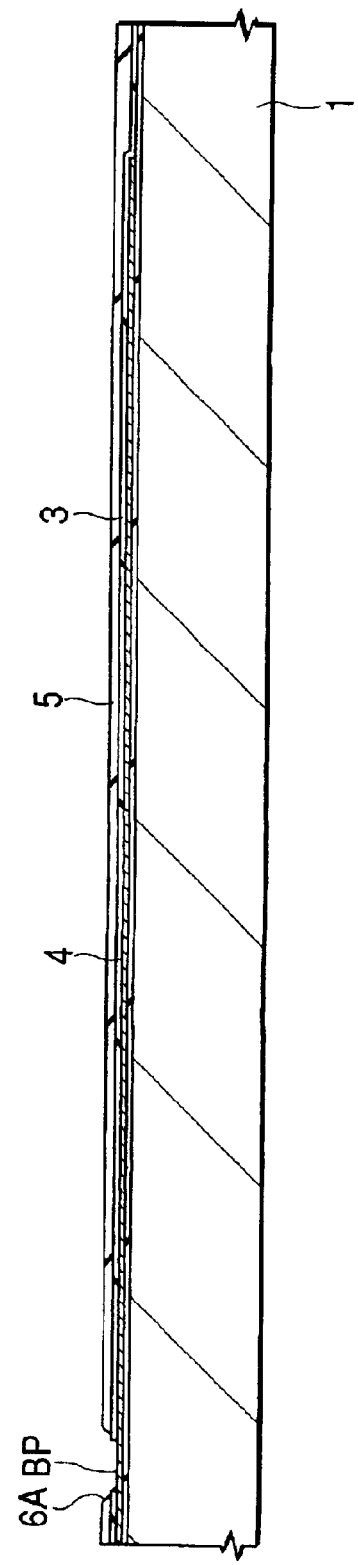

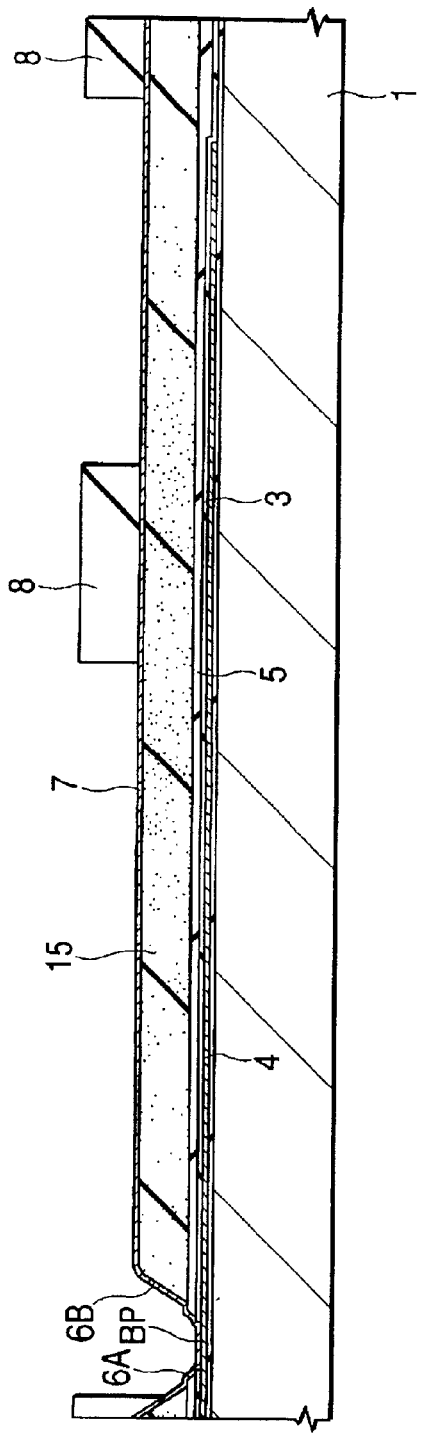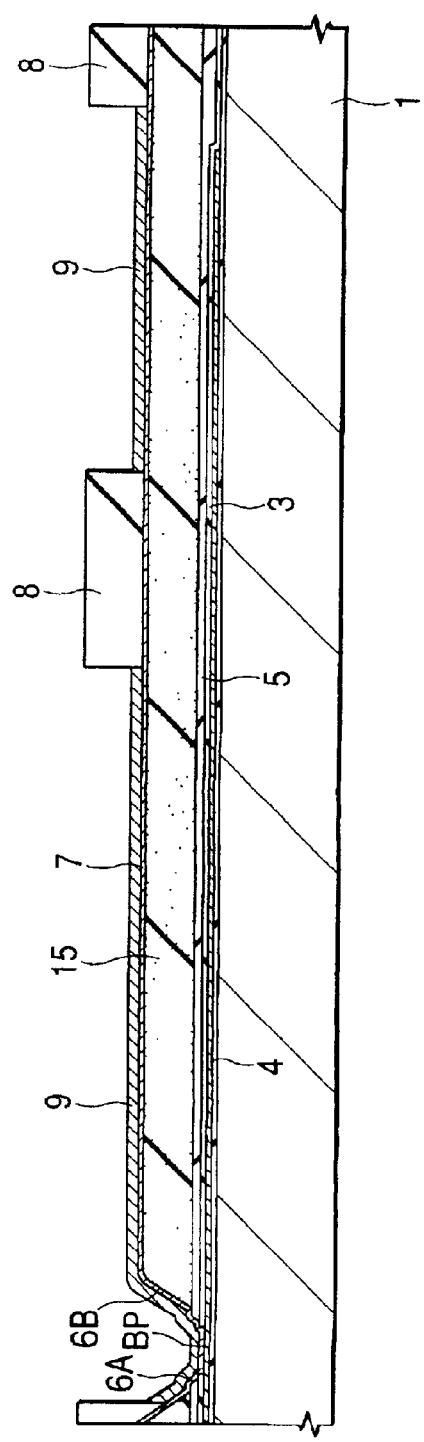

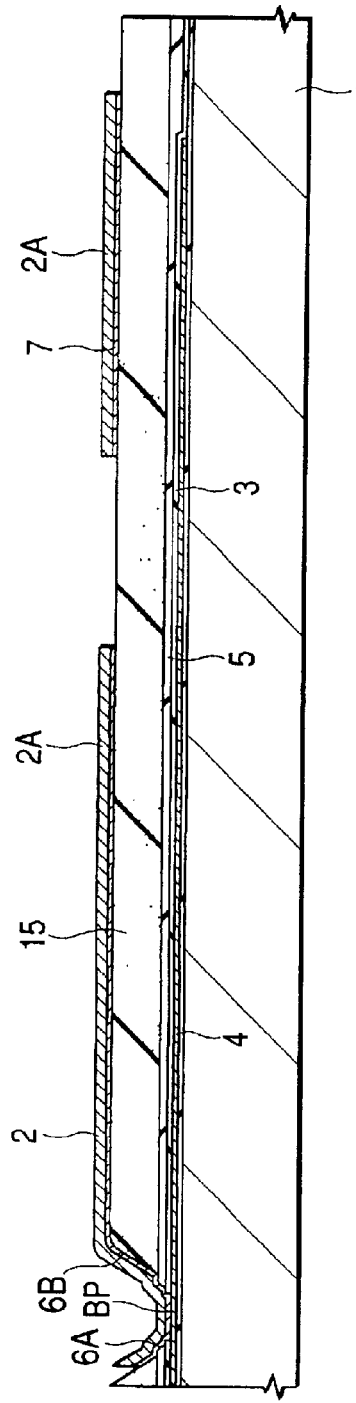
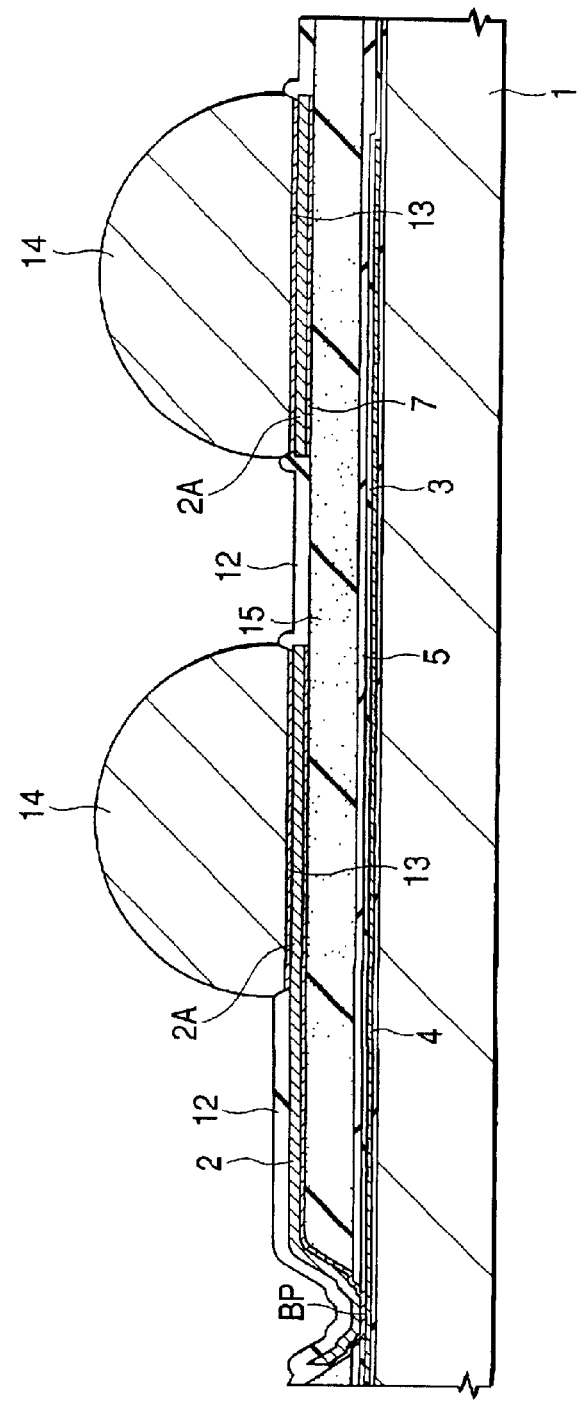

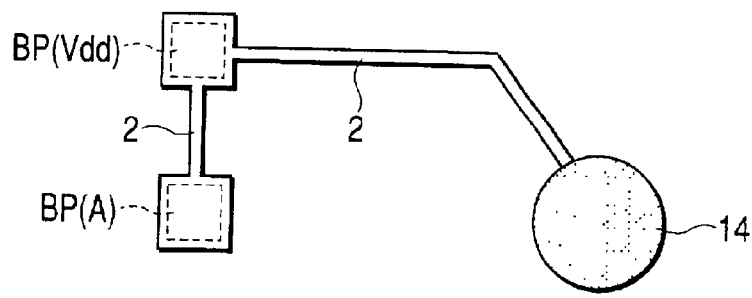
FIG. 48(a)
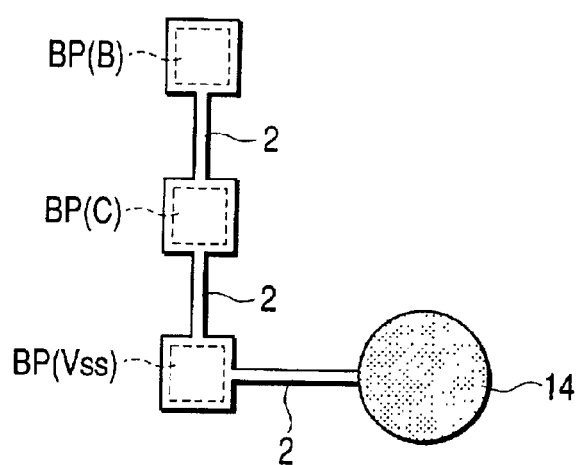
FIG. 48(b)
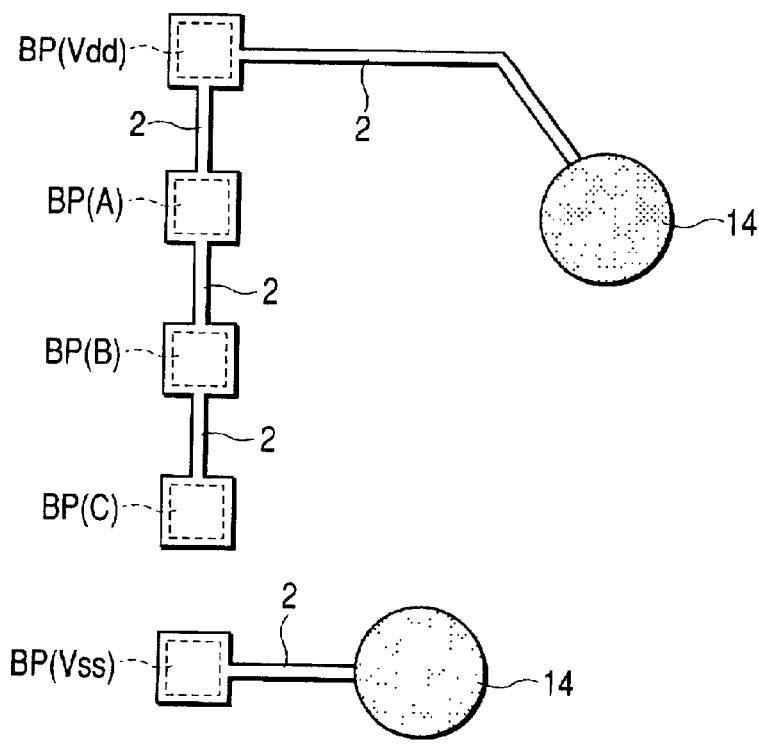

VARIABLE VOLTAGE AMPLITUDE
CIRCUIT FOR I/O BUFFER

INTERNAL POWER SUPPLY STEP DOWN CIRCUIT

FIG. 51

| VOLTAGE LEVEL AT "1" | VOLTAGE LEVEL AT "A/B/C" | "On/Off" OF SWITCH "a/b/c" | VOLTAGE LEVEL AT "VCL-out" |
|---|---|---|---|
| "NO INPUT" | "High/Low/Low" | "On/Off/Off" | "vddq" |
| "High" | "Low/High/Low" | "Off/On/Off" | "vddq1" |
| "Low" | "Low/Low/High" | "Off/Off/On" | "vddq2" |

I/O DRIVER CIRCUIT FOR
DEFINITION OF DRIVERABILITY

THE BIGGER THE SLEW RATE IS THE SMOOTHER
THE WAVE FORM.

VARIABLE SLEW RATE CIRCUIT

SLEW RATE CONTROL SWITCH CIRCUIT

SLEW RATE CONTROL SWITCH CIRCUIT

FIG. 63

LOGIC DIAGRAM FOR LOGIC CIRCUIT (TABLE)

| VOLTAGE LEVEL OF "1" | VOLTAGE LEVEL AT "A/B/C" | "On/Off" OF SWITCH "a/b/c" | SLEW RATE |
|---|---|---|---|
| "NO INPUT" | "High/Low/Low" | "On/Off/Off" | ×1 (I/O DRIVER CIRCUIT A) |
| "High" | "Low/High/Low" | "Off/On/Off" | ×2 (I/O DRIVER CIRCUIT B) |
| "Low" | "Low/Low/High" | "Off/Off/On" | ×3 (I/O DRIVER CIRCUIT C) |

THE BIGGER THE SLEW RATE IS THE SMOOTHER THE WAVE FORM.

WAFER LEVEL CHIP SIZE PACKAGE HAVING REROUTING LAYERS

TECHNICAL FIELD OF THE INVENTION

The present invention relates to a semiconductor integrated circuit device and a method of manufacturing the same, and a technique which is effectively applied to a CSP (chip size package), i.e., a so-called wafer level CSP (WL-CSP) or a wafer process package which is a scheme in which a packaging step is completed in a wafer state.

BACKGROUND OF THE INVENTION

A scheme in which a packaging process (post-process) and a wafer process (pre-process) are integrated to each other to complete a packaging step in a wafer state, i.e., a technique so-called a wafer level CSP has the following advantage. That is, since a packaging process is performed by applying a wafer process, the number of steps can be made considerably smaller than that of a conventional method in which a packaging process (post-process) is performed to each chip cut from a wafer. The wafer level CSP is also called a wafer process package (WPP).

In the wafer level CSP, a wiring layer in the CSP called an interposer for converting the pitch of bonding pads into the pitch of solder bumps can be replaced with rerouting layers formed on a wafer. For this reason, the wafer level CSP is expected to achieve the reduction in number of steps and a reduction in manufacturing cost of a CSP.

The wafer level CSP is described in, e.g., "Electronics Mount Technology extra edition 2000" issued by Gijyutsu-chyosa-kai Corporation (issued on May, 28, 2000) pp. 81 to 113, International Patent Publication No. WO99/23696, and the like.

In a conventional method in which a package process (post-process is performed to each chip cut from a wafer, in order to rapidly cope with a demand of a client, in, e.g., a memory LSI (DRAM: Dynamic Random Access Memory), operation modes such as word configurations and bit configurations are changed (product type switching) by a bonding option. As a technique which performs a change of electric characteristics for respective divided chips, i.e., a bonding option, techniques described in Japanese Patent Application Laid-Open No. 11-40563 and Japanese Patent Application Laid-Open No. 7-161761 are known.

In Japanese Patent Application Laid-Open No. 11-40563 of these publications, the three following methods are described. That is, (1) two wirings having different electric characteristics are formed to be connected to bonding pads (semiconductor element electrodes arranged on a semiconductor chip) to which bonding wires, tape leads, or external connection balls are connected, and any one of the wirings is cut by a laser depending on required electric characteristics, (2) nodes of bonding wires which connect semiconductor element electrodes (bonding pads) arranged on a semiconductor chip and electrode portions of a semiconductor package to each other are changed, and (3) arrangement positions of external connection balls connected to electrodes (bonding pads) of a semiconductor chip are changed in a CSP.

Japanese Patent Application Laid-Open No. 7-161761 describes the following method. That is, in a semiconductor device in which bonding pads on the surface of a semiconductor element are connected to a plurality of leads with bonding wires, plural lines of pad groups each constituted by arranging a plurality of bonding pads having the same function in a line are arranged at the central portion of the semiconductor element, and bonding pads to which the bonding wires are connected are changed, so that connection relations between the leads and the bonding pads are changed depending on product types.

SUMMARY OF THE INVENTION

On the other hand, since a wafer level CSP starts a wafer process after a product type has been fixed and performs steps until formation of external connection terminals (solder bumps) in the wafer process, operation modes cannot be changed after a chip is divided into chips. Therefore, a turn around time from an order to a delivery becomes long disadvantageously. When a wafer process is started in expectation of the amounts of orders to shorten the turn around time, the manufacturing cost is inevitably increased by holding unnecessary stocks.

In a package such as a CSP, arrangements of terminals each having a specific function may have to be changed by a user option. However, in a wafer level CSP, pin arrangements cannot be changed after a wafer is divided into chips.

It is an object of the present invention to provide a technique that shortens a turn around time of a wafer level CSP.

It is another object of the present invention to provide a technique that reduces the manufacturing cost of a wafer level CSP.

It is still another object of the present invention to provide a technique that can reduce stocks held by anticipated production.

It is still another object of the present invention to provide a technique that can switch product types in units of wafers.

The above objects, other objects, and novel characteristics of the present invention will be apparent by the description of this specification and the accompanying drawings.

A typical one of the aspects of the invention disclosed in this application will be briefly described below.

More specifically, according to the aspect of the present invention, there is provided a semiconductor integrated circuit device including a semiconductor substrate, a circuit element formed on one major surface of the semiconductor substrate and constituting an integrated circuit having a plurality of functions or a plurality of characteristics, an internal connection terminal, connected to the integrated circuit, for selecting one of the plurality of functions or one of the characteristics in the integrated circuit, an insulating layer covering the internal connection terminal such that the internal connection terminal is selectively exposed, and an external connection terminal arranged on the insulating layer, wherein one of the plurality of functions or one of the plurality of characteristics is selected by a connection state between the internal connection terminal and the external connection terminal.

BRIEF DESCRIPTION OF THE DRAWINGS

FIG. 11 is a sectional view of a main part of the chip area showing the rerouting forming step.

FIG. 12 is a sectional view of a main part of the chip area showing the rerouting forming step.

FIG. 20 is a sectional view of a main part of a chip area showing the solder bump forming step.

FIG. 21 is a sectional view of a main part of the chip area showing the solder bump forming step.

FIG. 27 is a sectional view of a main part of a chip area showing the rerouting forming step.

FIG. 28 is a sectional view of a main part of the chip area showing the rerouting forming step.

FIG. 31 is a sectional view of a main part of the chip area showing the rerouting forming step.

FIG. 32 is a sectional view of a main part of the chip area showing the rerouting forming step.

FIG. 33 is a sectional view of a main part of the chip area showing the rerouting forming step.

FIG. 34 is a sectional view of a main part of a chip area showing the solder bump forming step.

FIGS. 48(a) and 48(b) are plan views showing a method of selecting an I/O driver circuit.

FIG. 51 is a logic diagram showing an operation of a logic circuit.

FIG. 63 is a logic diagram showing an operation of a logic circuit.

DESCRIPTION OF THE PREFERRED EMBODIMENTS

Figure 1:
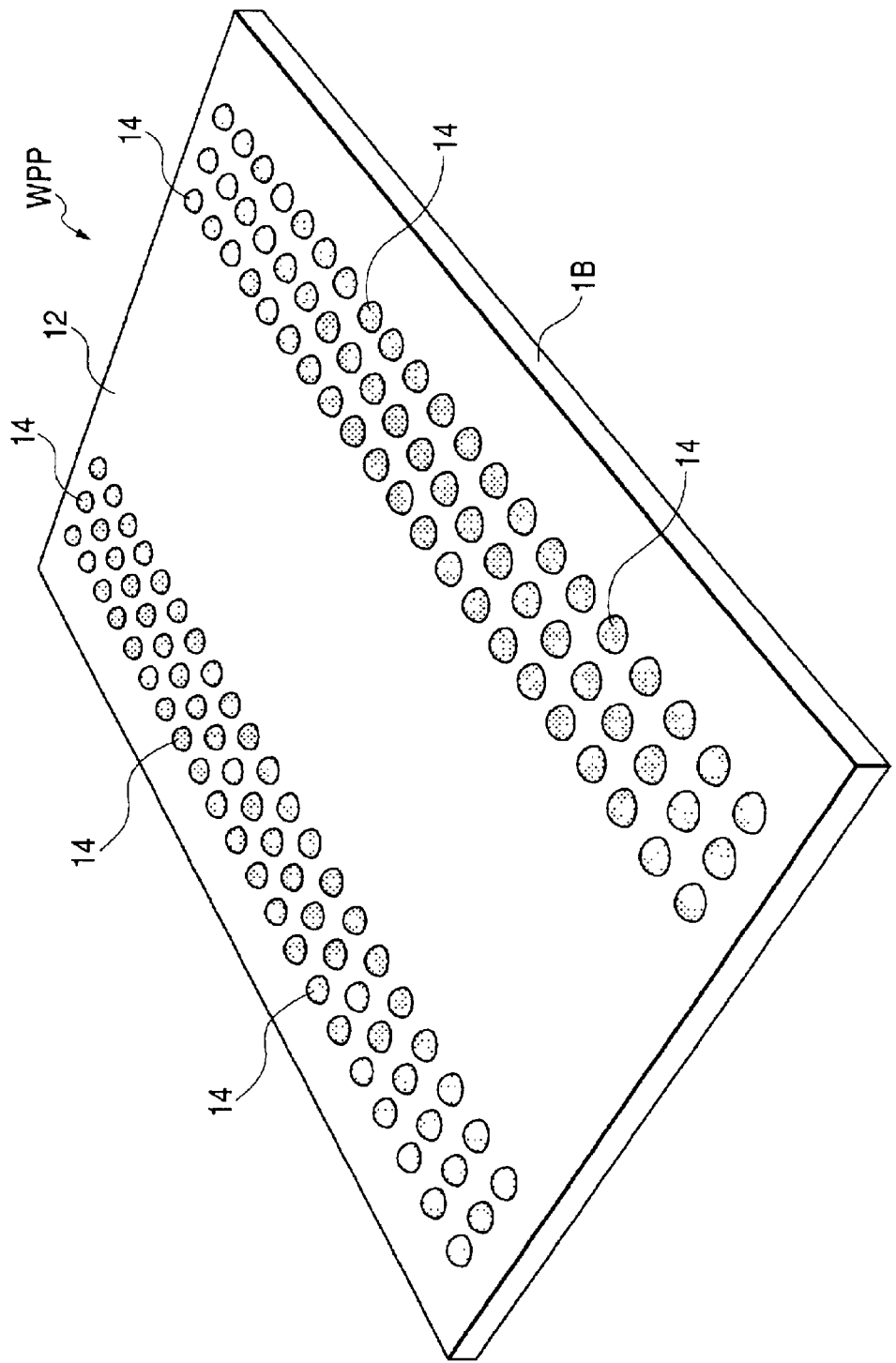
FIG. 1 is a perspective view showing a completion state of a semiconductor integrated circuit device according to an embodiment of the present invention.

Embodiments of the present invention will be described below with reference to the accompanying drawings. The same reference numerals as in all the drawings denote parts having the same functions in the drawings, and a description thereof will be omitted in principle.

A bonding pad in the following embodiments is to indicate an internal connection terminal or an electrode in the claims.

A wiring on the uppermost layer in the following embodiments is to indicate a first wiring or a first conductive layer in the claims.

An organic protection layer in the following embodiments is to indicate an insulating layer, or an insulating layer or an organic insulating layer in the claims.

A rerouting layer in the following embodiments is to indicate a second wiring or a second conductive layer formed on the upper side of an insulating layer, or an insulating layer or an organic insulating layer in the claims.

A solder bump in the following embodiments is to indicate an external connection terminal in the claims.

The following Embodiments 1 to 7 will describe a method of selecting a function (bit structure, action (operation) mode, or the like) of a semiconductor integrated circuit device by partially changing rerouting patterns. The following embodiments 8 to 10 will describe a method of selecting a characteristic (output impedance, operation voltage, slew rate, or the like) of a semiconductor integrated circuit device by changing rerouting patterns.

Embodiment 1

Figure 2:
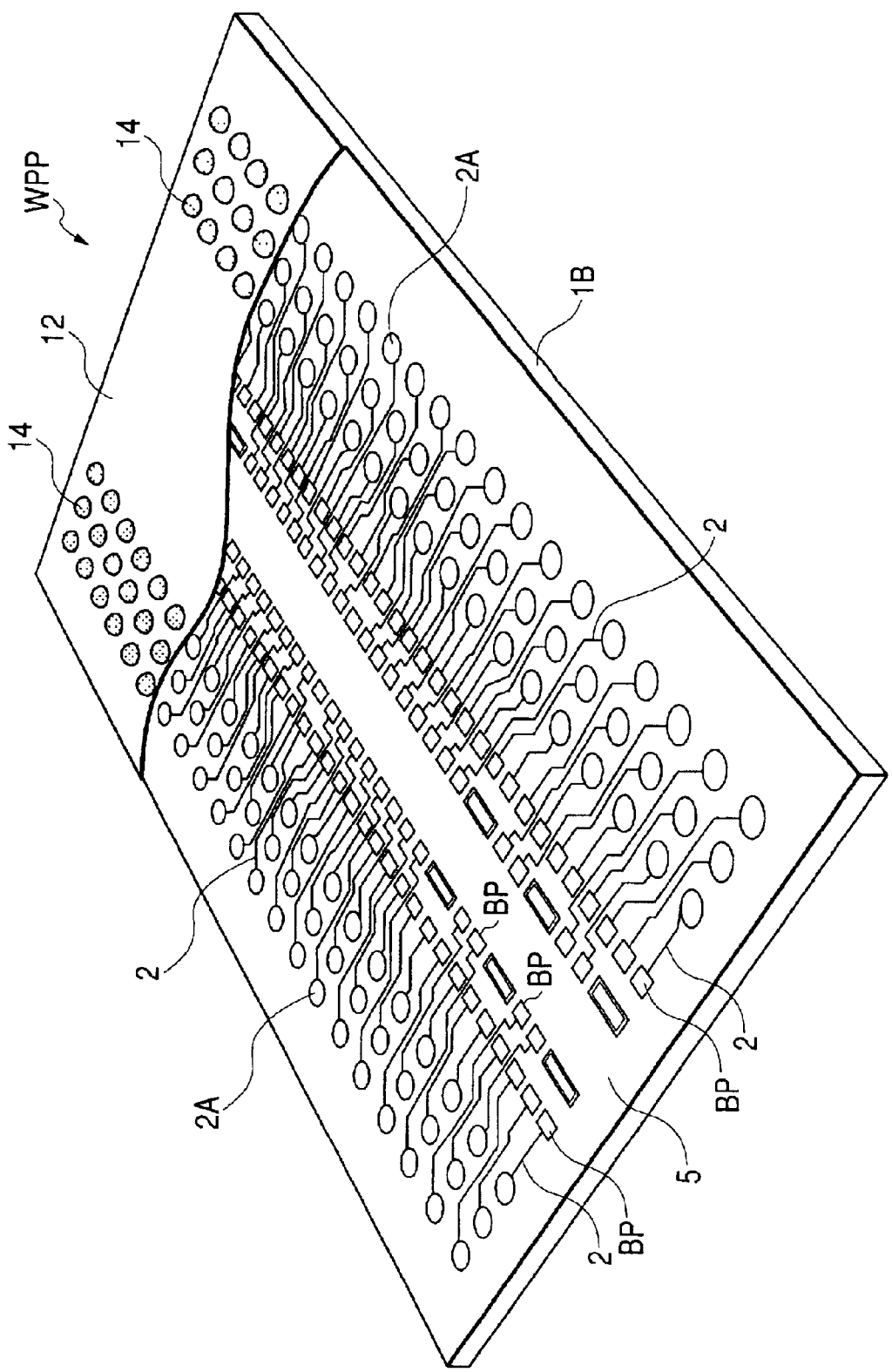
FIG. 2 is a perspective view showing rerouting (rerouting layers) and bonding pads of the semiconductor integrated circuit device shown in FIG. 1.
Figure 3:
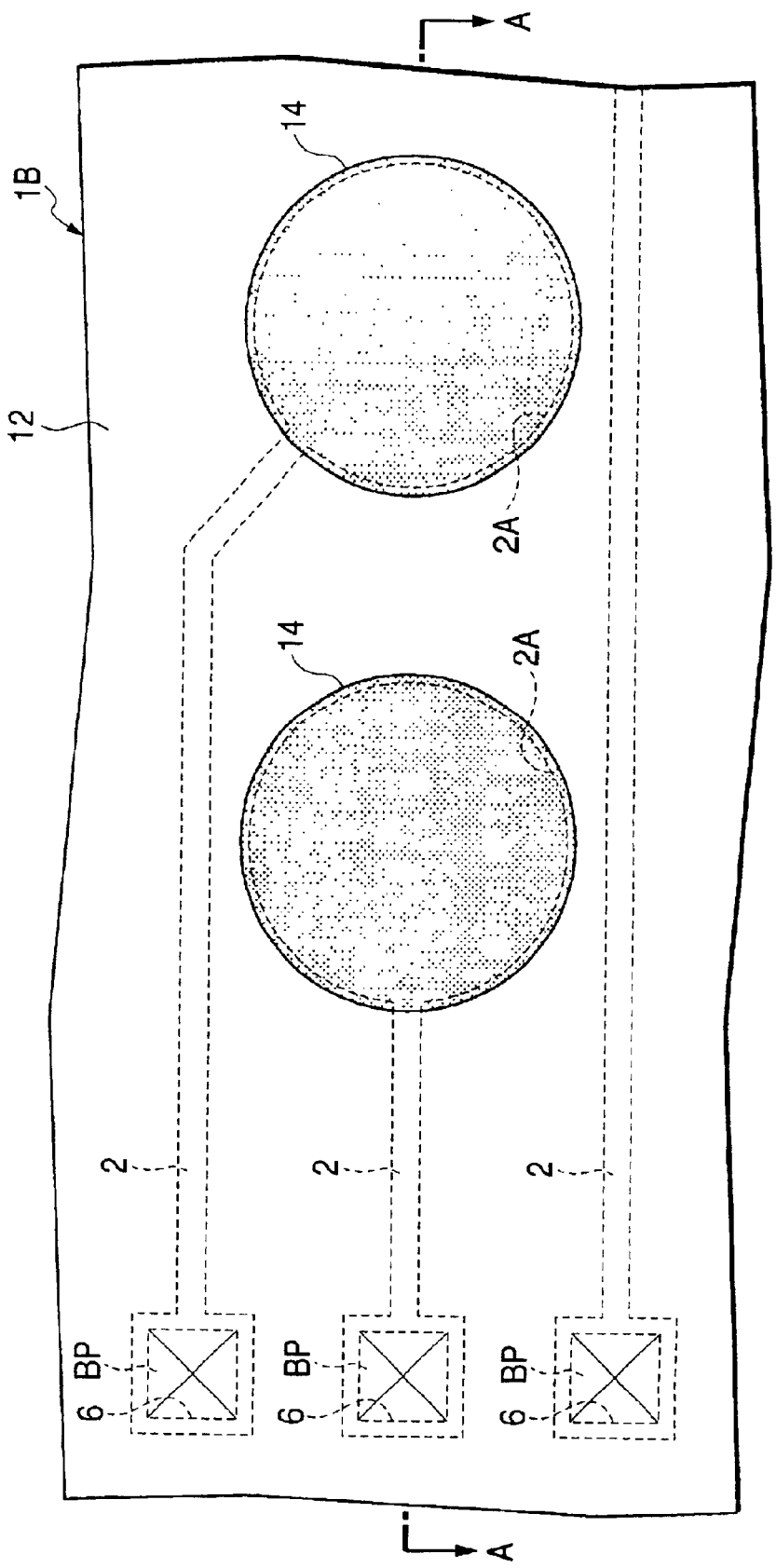
FIG. 3 is an enlarged plan view showing a main part of FIG. 2.
Figure 4:
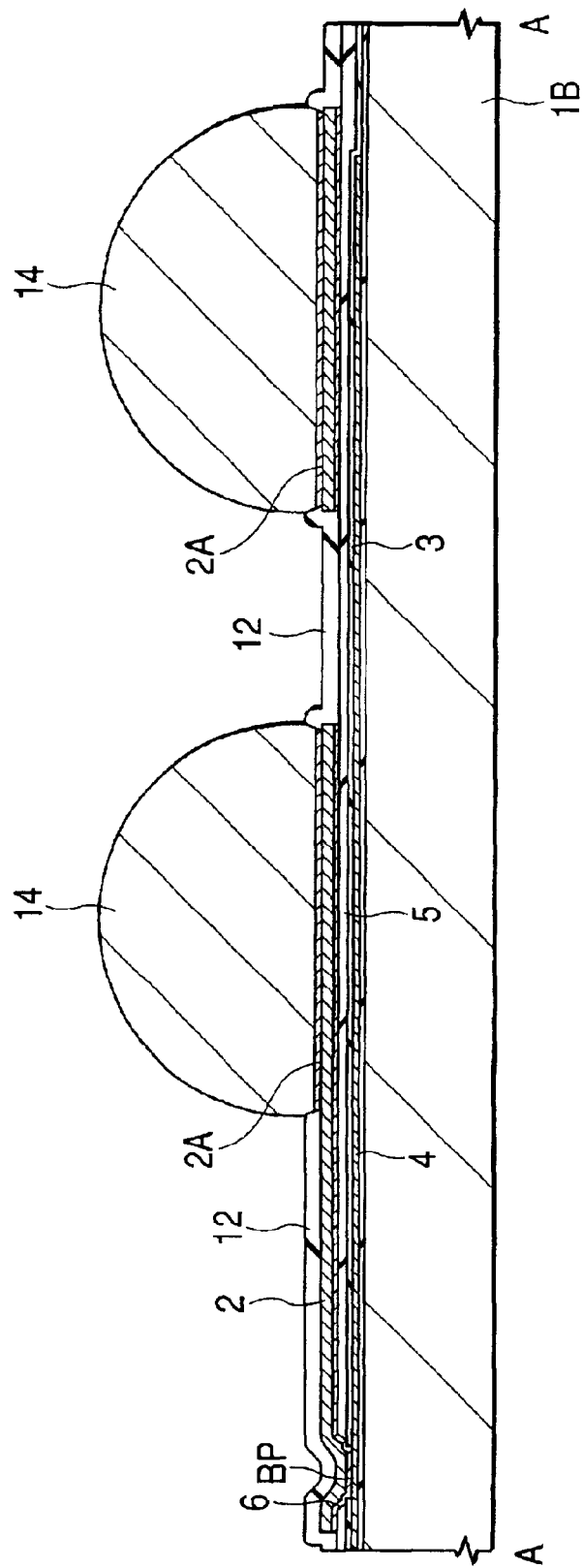
FIG. 4 is a sectional view showing the structure along an A—A line in FIG. 3.
Figure 5:
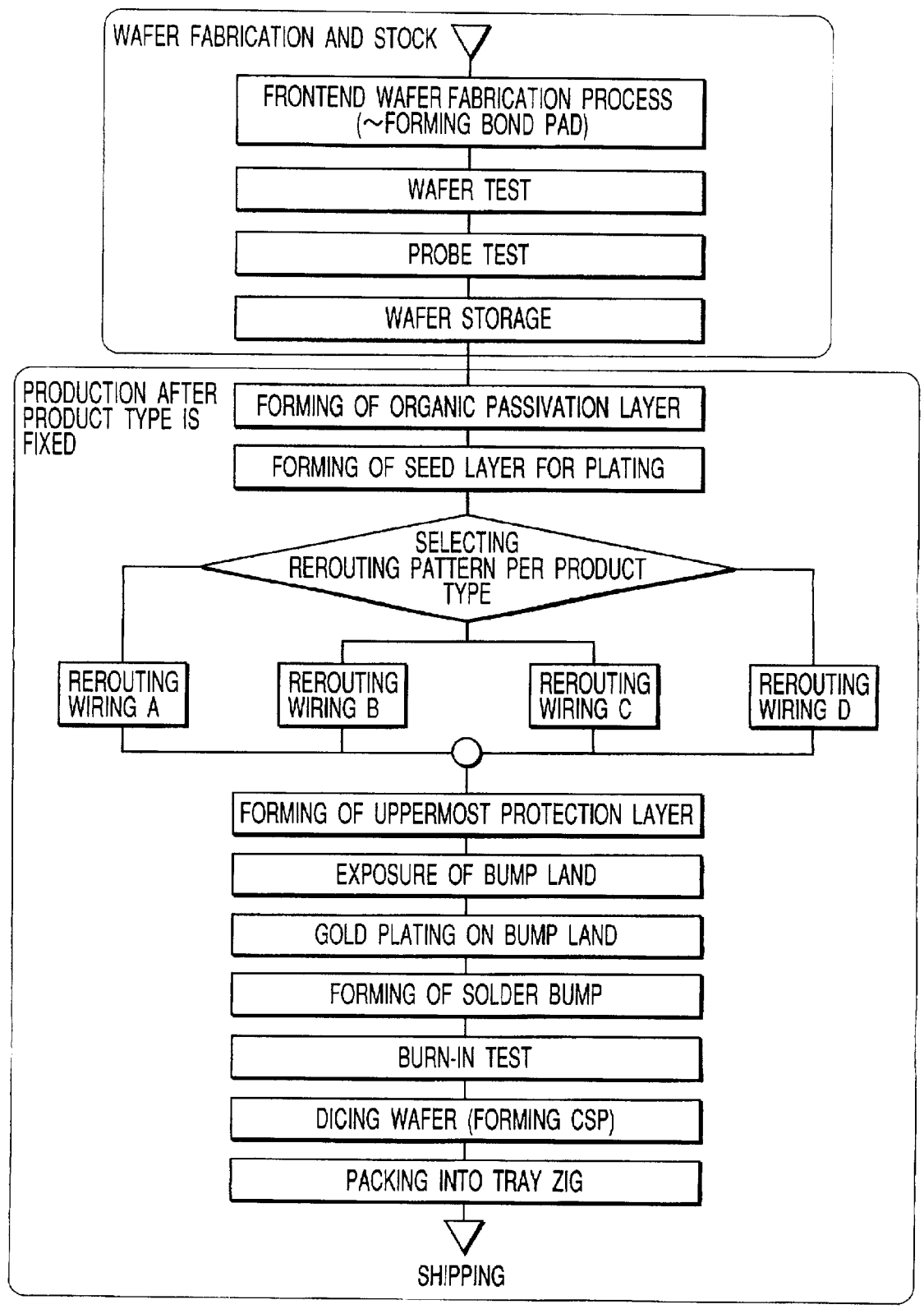
FIG. 5 is a manufacturing flow chart showing an example of the steps in manufacturing the semiconductor integrated circuit device shown in FIGS. 1 to 4.
Figure 6:
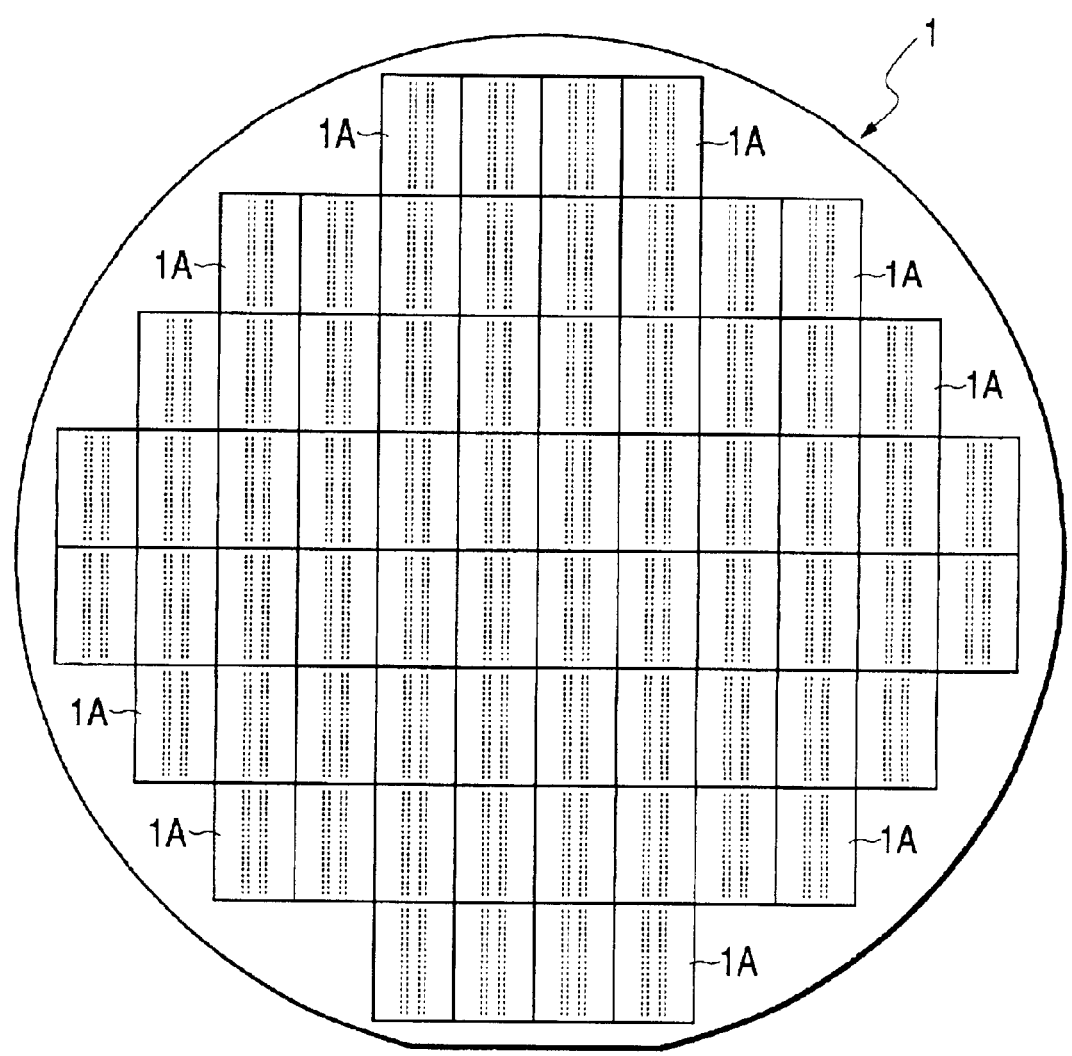
FIG. 6 is a plan view of a semiconductor wafer which has an integrated circuit element formed on a major surface of the semiconductor wafer and which is obtained before rerouting layers are formed.
Figure 7:
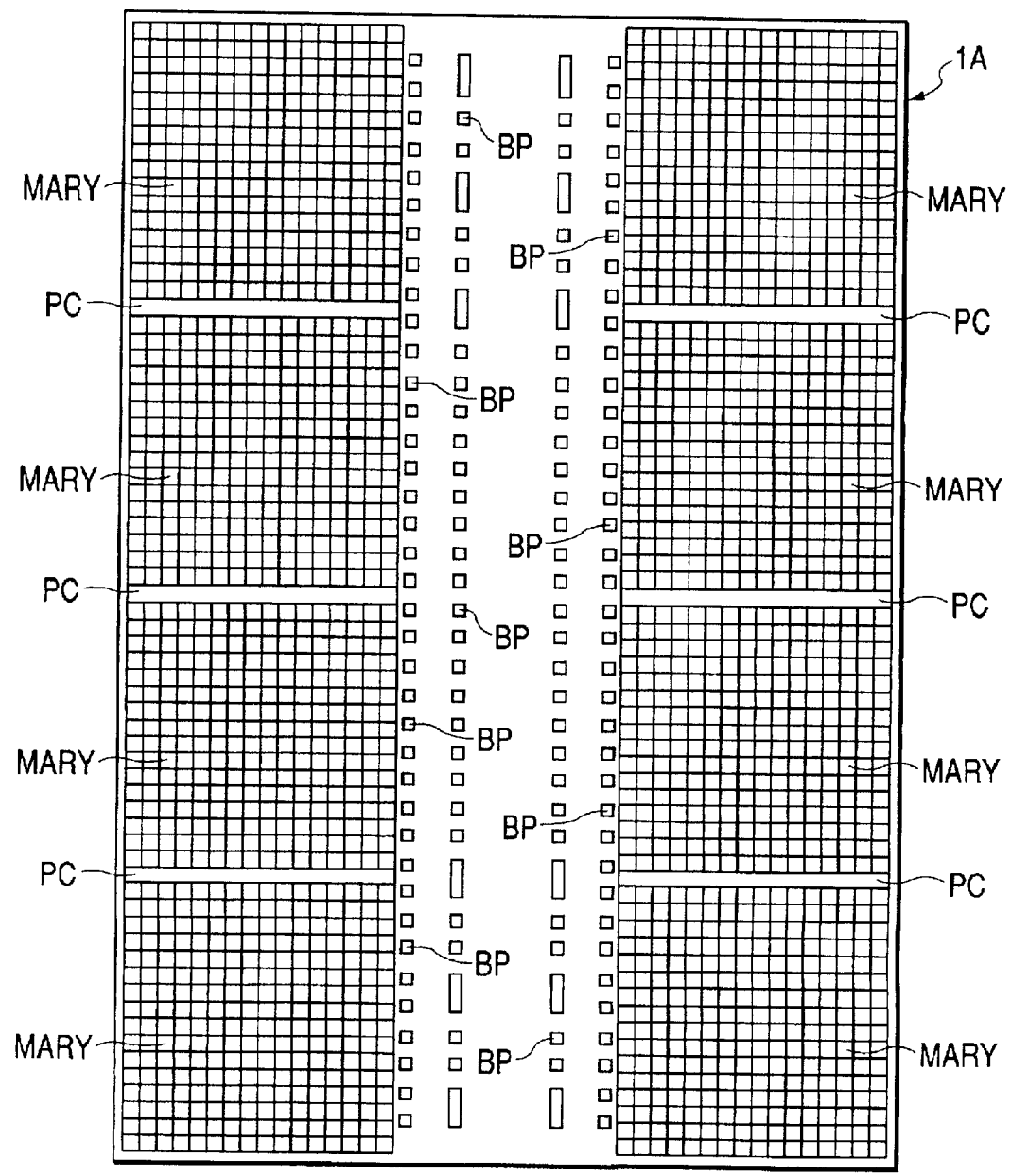
FIG. 7 is a plan view showing a chip area of the semiconductor wafer shown in FIG. 6.
Figure 8:
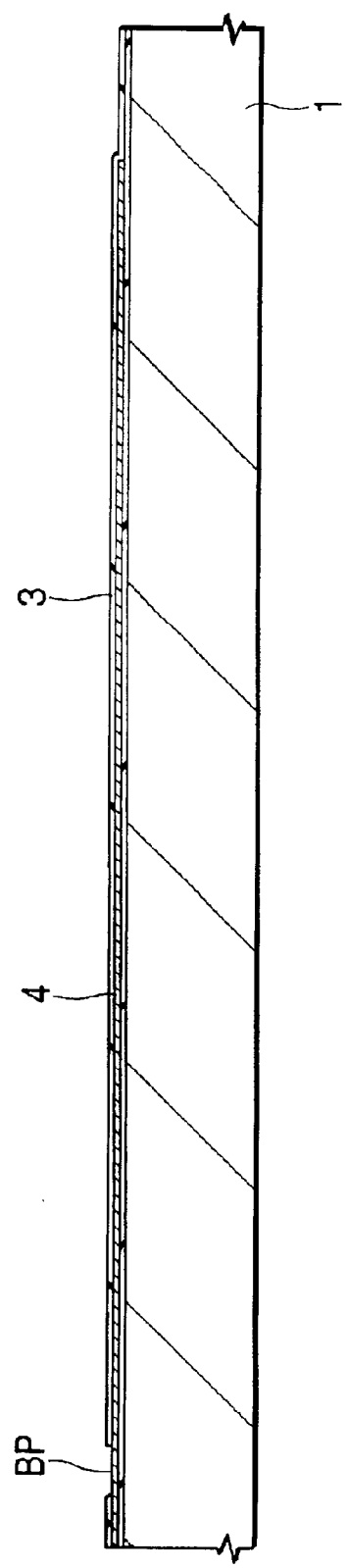
FIG. 8 is a sectional view showing a main part of the chip area shown in FIG. 7.
Figure 9:
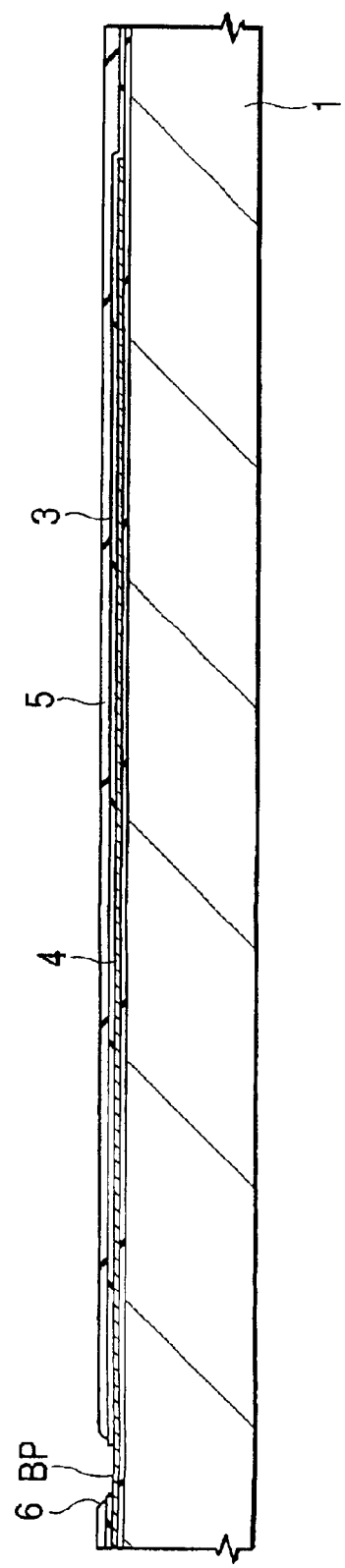
FIG. 9 is a sectional view of a main part of a chip area showing a state in which an insulating interlayer is formed on the semiconductor wafer.
Figure 18A:
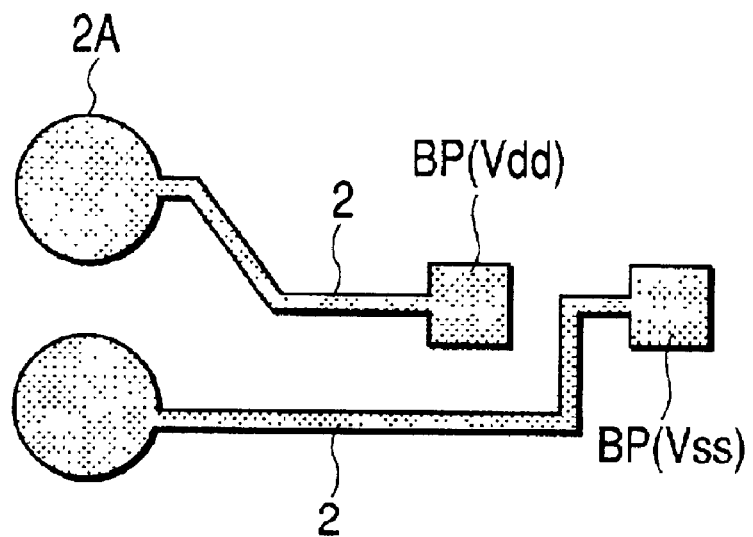
FIG. 18(a) is a plan view showing an example of connection between bonding pads for selecting functions and bump lands and FIG. 18(b) is also a plan view showing an example of connection between bonding pads for selecting functions and bump lands, in which the connection is switched to each other.
Figure 18B:
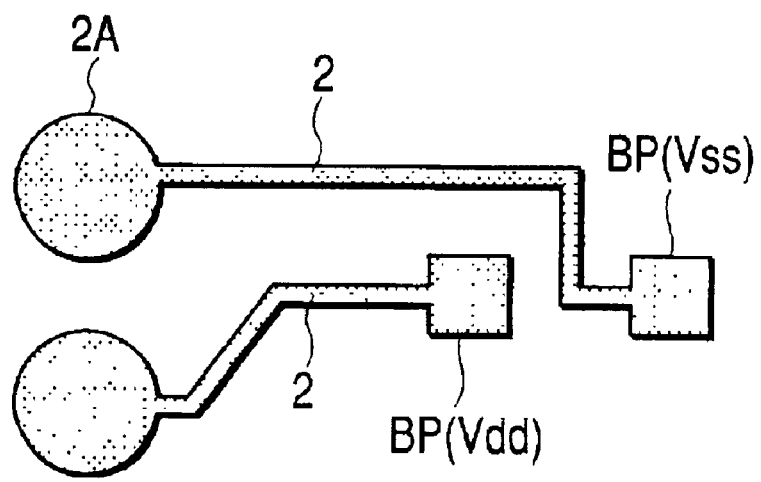
Figure 19:
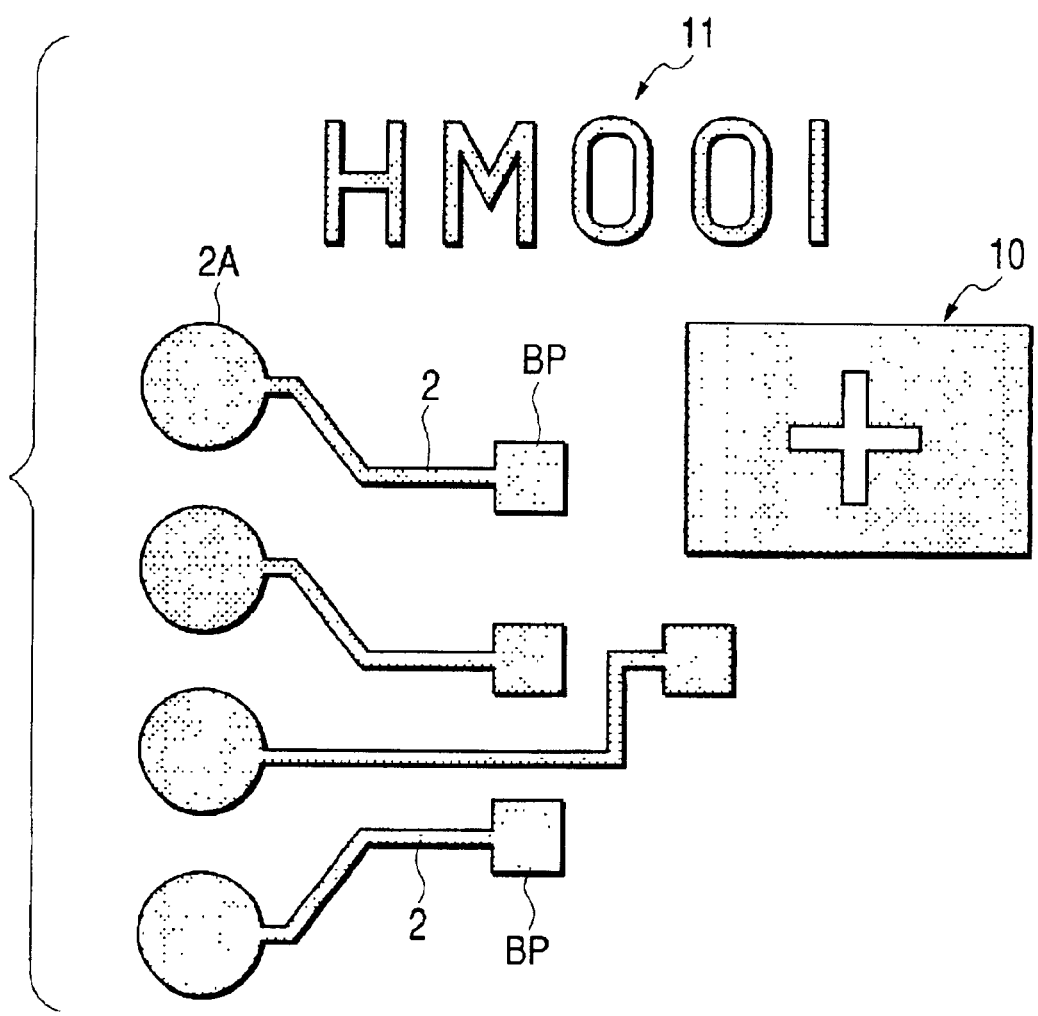
FIG. 19 is a plan view showing recognition marks and product names formed by the same wiring material as the material of the rerouting.
Figure 22:
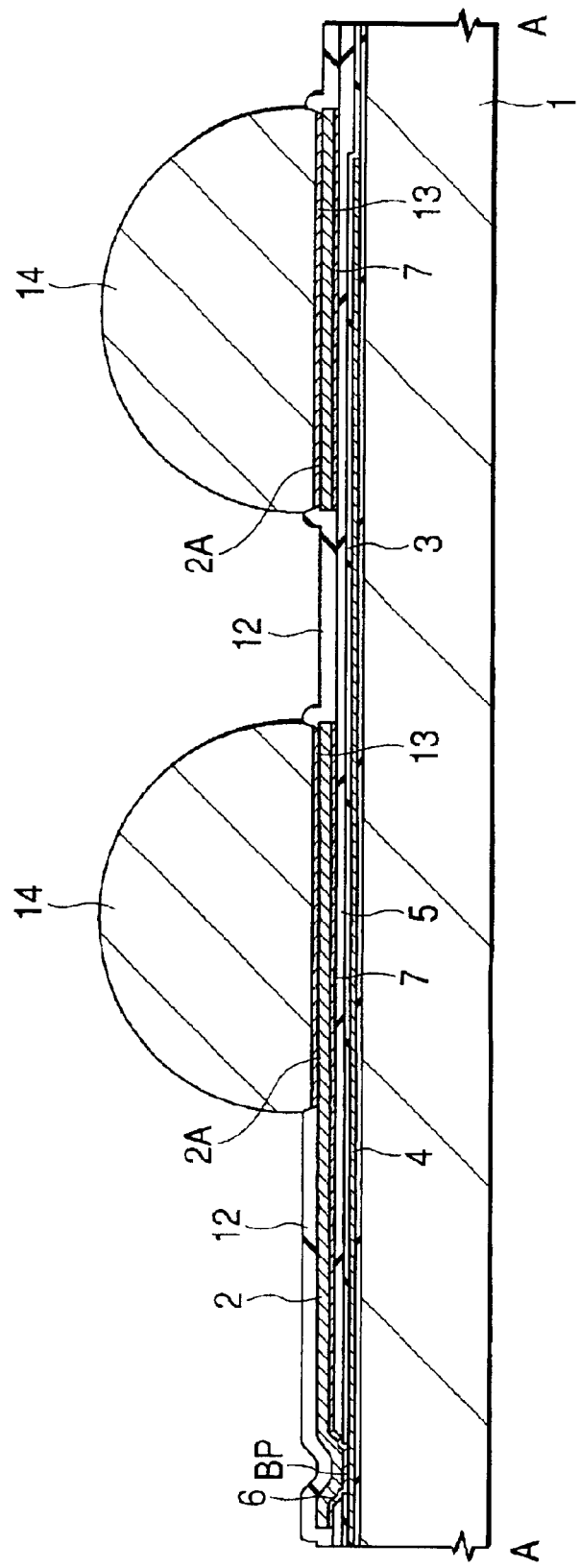
FIG. 22 is a sectional view of a main part of the chip area showing the solder bump forming step.
Figure 23:
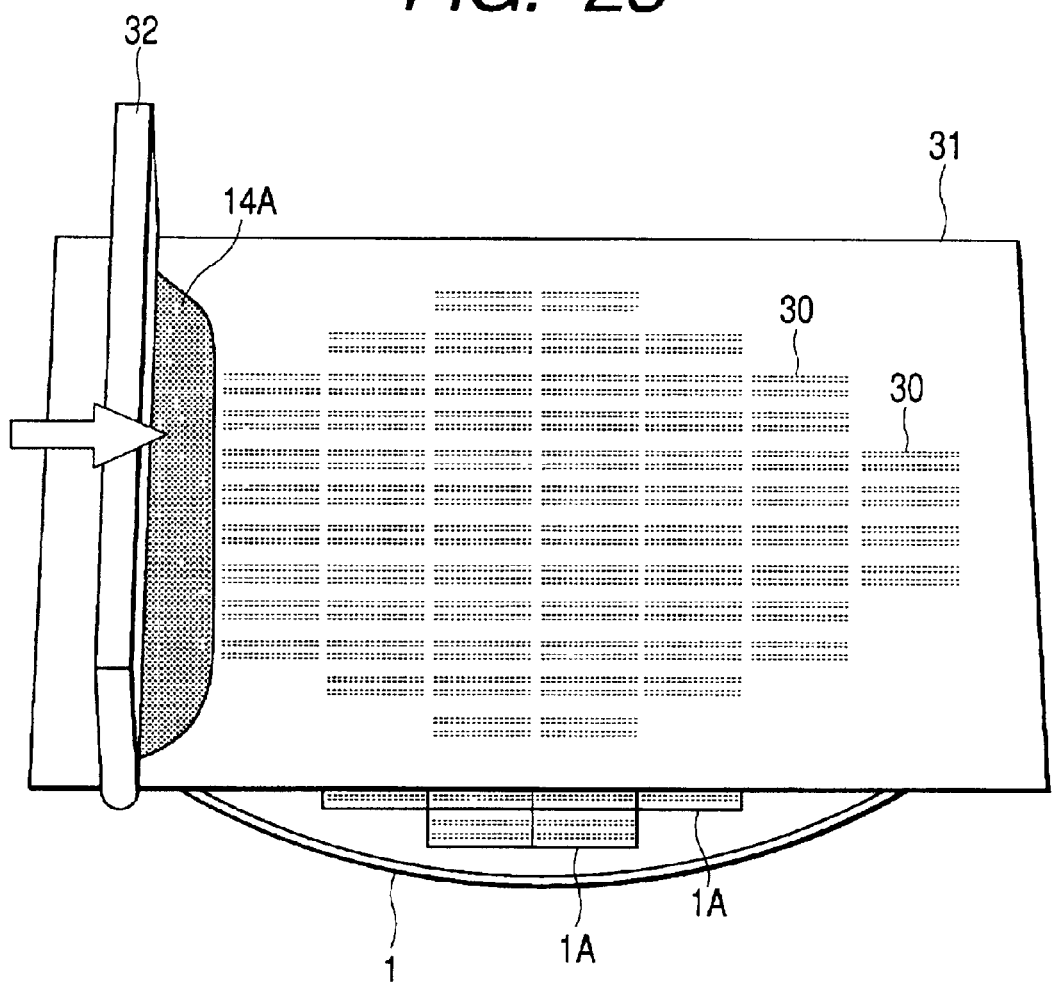
FIG. 23 is a perspective view showing a method of forming solder bumps by using a solder printing method.

FIG. 1 is a perspective view showing a completion state of a CSP formed by applying a wafer process in a semiconductor integrated circuit device according to Embodiment 1, i.e., a so-called wafer level CSP (to be referred to as a WL-CSP hereinafter) which is a scheme in which a packaging step is completed in a wafer state, FIG. 2 is a perspective view showing rerouting (rerouting layers) of the WL-CSP and bonding pads BP, FIG. 3 is an enlarged plan view showing a main part of the WL-CSP, FIG. 4 is a sectional view showing the WL-CSP along an A—A line in FIG. 3, FIG. 5 is a manufacturing flow chart showing an example of the steps in manufacturing the semiconductor integrated circuit device shown in FIGS. 1 to 4, and FIGS. 6 to 25 are diagrams showing a method of manufacturing a semiconductor integrated circuit device according to Embodiment 1. FIG. 6 is a plan view showing a semiconductor wafer which has a DRAM (Dynamic Random Access Memory) serving as an integrated circuit element and formed on a major surface and which is obtained before rerouting layers are formed, FIG. 7 is an enlarged plan view showing a chip area of the semiconductor wafer shown in FIG. 6, FIG. 8 is a sectional view of a main part of a chip area shown in FIG. 7, FIG. 9 is a sectional view of a main part of a chip area showing a state in which an insulating interlayer is formed on the semiconductor wafer shown in FIGS. 6 to 8, FIG. 10 is a plan view of a chip area corresponding to the step in FIG. 9, FIGS. 11 to 13 are sectional views of main parts of chip areas until rerouting layers are formed, FIG. 14 is a plan view of a chip area corresponding to the step in FIG. 13, FIGS. 15(a) to 15(d) are plan views showing connection states between bonding pads for selecting functions and bump lands by rerouting layers, FIG. 16 is a diagram for explaining the functions corresponding to FIGS. 15(a) to 15(d), FIG. 17 is a block diagram showing input circuits connected to the bonding pads for selecting functions, FIGS. 18(a) and 18(b) are plan views showing examples in which connections between bonding pads for selecting functions and bump lands are switched to each other, FIG. 19 is a plan view showing recognition marks and product names formed by the same wiring material as the material of the rerouting layers, FIGS. 20 to 22 and FIG. 24 are sectional views of main parts of chip areas showing the steps until the solder bump forming step, FIG. 23 is a perspective view showing a method of forming solder bumps by using a solder printing method, and FIG. 25 is a perspective view showing the dicing step for a semiconductor wafer.

The WL-CSP according to Embodiment 1 shown in FIGS. 1 to 4 has a plurality of solder bumps 14 and an uppermost protection layer 12 which insulates the solder bumps 14 from each other on a major surface of a semiconductor chip (for example, a single crystal silicon chip) 1B having dimensions, e.g., a long side=8.7 mm, a short side=5.7 mm, and a thickness=about 725 μm. Although not shown, a DRAM (Dynamic Random Access Memory) is formed on the major surface of the semiconductor chip 1B.

As shown in FIGS. 2 to 4, four lines of a plurality of bonding pads BP constituted by a part of a wiring on the uppermost layer 4 are formed at the central portion of the major surface of the semiconductor chip 1B. The upper side of the wiring on the uppermost layer 4 is covered with a surface protection (passivation) layer 3 except for the upper sides of the bonding pads BP. On the upper side of the surface protection layer 3, rerouting layers 2 are formed through a photosensitive polyimide layer 5 serving as an organic passivation layer. In addition, the upper sides of the rerouting layers 2 are covered with an uppermost protection layer 12 except for bump lands 2A serving as one terminals of the rerouting layers 2.

The other terminals of the rerouting layers 2 are electrically connected to the bonding pads BP through open holes 6 formed in the photosensitive polyimide layer 5 serving as an organic passivation film. Solder bumps 14 constituting external connection terminals of a WPP are formed on the upper sides of the bump lands 2A serving as one terminals of the rerouting layers 2. As will be described later, parts of the rerouting layers 2 which connect the external connection terminals (solder bumps 14) and the bonding pads BP to each other are formed by selecting a rerouting pattern for each product type.

The steps of a method of manufacturing the WL-CSP constituted as described above will be sequentially described below by using FIGS. 5 to 25.

As is apparent from the manufacturing flow chart shown in FIG. 5, the manufacturing method according to Embodiment 1 is as follows. That is, a semiconductor wafer 1 to which a wafer test and a probe test have been performed is stocked, product types are fixed, and a rerouting pattern is selectively formed for each product type. Thereafter, the semiconductor wafer 1 is cut into a plurality of semiconductor chips 1B, so that WL-CSPs shown in FIGS. 1 to 4 are formed. This manufacturing method will be described below in detail with reference to the manufacturing flow in FIG. 5.

A semiconductor wafer (to be referred to as a wafer hereinafter) 1 formed of single crystal silicon as shown in FIGS. 6 to 8 is prepared. FIG. 6 is an entire plan view of the wafer 1, FIG. 7 is a plan view showing an area (chip area 1A) of one chip of the wafer 1, and FIG. 8 is a sectional view of a main part of the chip area 1A.

As shown in FIG. 6, a major surface of the wafer 1 is partitioned into a plurality of chip areas 1A, and a DRAM is formed in each of the chip areas 1A. As shown in FIG. 7, the DRAM is constituted by a plurality of memory cell arrays (MARY) and peripheral circuit units PC arranged therebetween. Four lines of a plurality of bonding pads BP are arranged at the central portion of the chip area 1A.

Although not shown, a plurality of word lines and a plurality of bit lines which extend in directions crossing each other at a right angle in the memory cell arrays (MARY) of the DRAM. A memory cell constituted by one MISFET (Metal Insulator Semiconductor Field Effect Transistor) and one capacitor (capacitor element) is formed at each of the nodes between the word lines and the bit lines. Two metal wiring layers are formed on the upper side of the memory cell. On the other hand, the peripheral circuit units PC are constituted by an n-channel MISFET, a p-channel MISFET, three metal wiring layers formed thereon, and the like. The MISFETs and the metal wiring layers constituting the DRAM are formed by the known wafer process.

As shown in FIG. 8, the bonding pads BP arranged at the central portion of the chip area 1A are formed such that the surface protection (passivation) layer 3 covering the surface of the wafer 1 is etched to form open holes and to partially expose the wiring on the uppermost layer 4. The surface protection layer 3 is constituted by an insulating layer obtained by stacking a silicon oxide layer having, e.g., a film thickness of about 0.3 $\mu$m and a silicon nitride layer having a film thickness of about 1.3 $\mu$m. The wiring on the uppermost layer 4 (and bonding pads BP) is constituted by an Al (aluminum) layer or an Al alloy layer having, e.g., a film thickness of about 0.8 $\mu$m.

The wafer 1 is subjected to tests (wafer test and probe test) in which probes are brought into contact with the bonding pads BP to decide whether the chip areas 1A are good or defective. Thereafter, the wafer 1 is temporarily stocked in this state until a product type is fixed. This product type means specifications having different bit (or word) configurations such as a ×32-bit structure and a ×64-bit structure or different operation modes such as a DDR (Double Data Rate) mode and a synchronous mode, or specifications in which connections between the bonding pads BP and the rerouting layers 2 are partially changed depending on a request of a client.

In the manufacturing method according to Embodiment 1, a large number of wafers 1 having been subjected to the final step of the wafer process (pre-process), i.e., a wafer test and a probe test are stocked in units of lots (several ten wafers/lot). A necessary lot is picked when a product type and its quantity, and the rerouting layers 2 having a pattern corresponding to the product type are formed in each of the wafers of the picked lot. In case of small-quantity many-type production or in case of sample production, a required number of wafers may be picked from the lot, and the rerouting layers 2 of a pattern corresponding to the product type may be formed.

Figure 10:
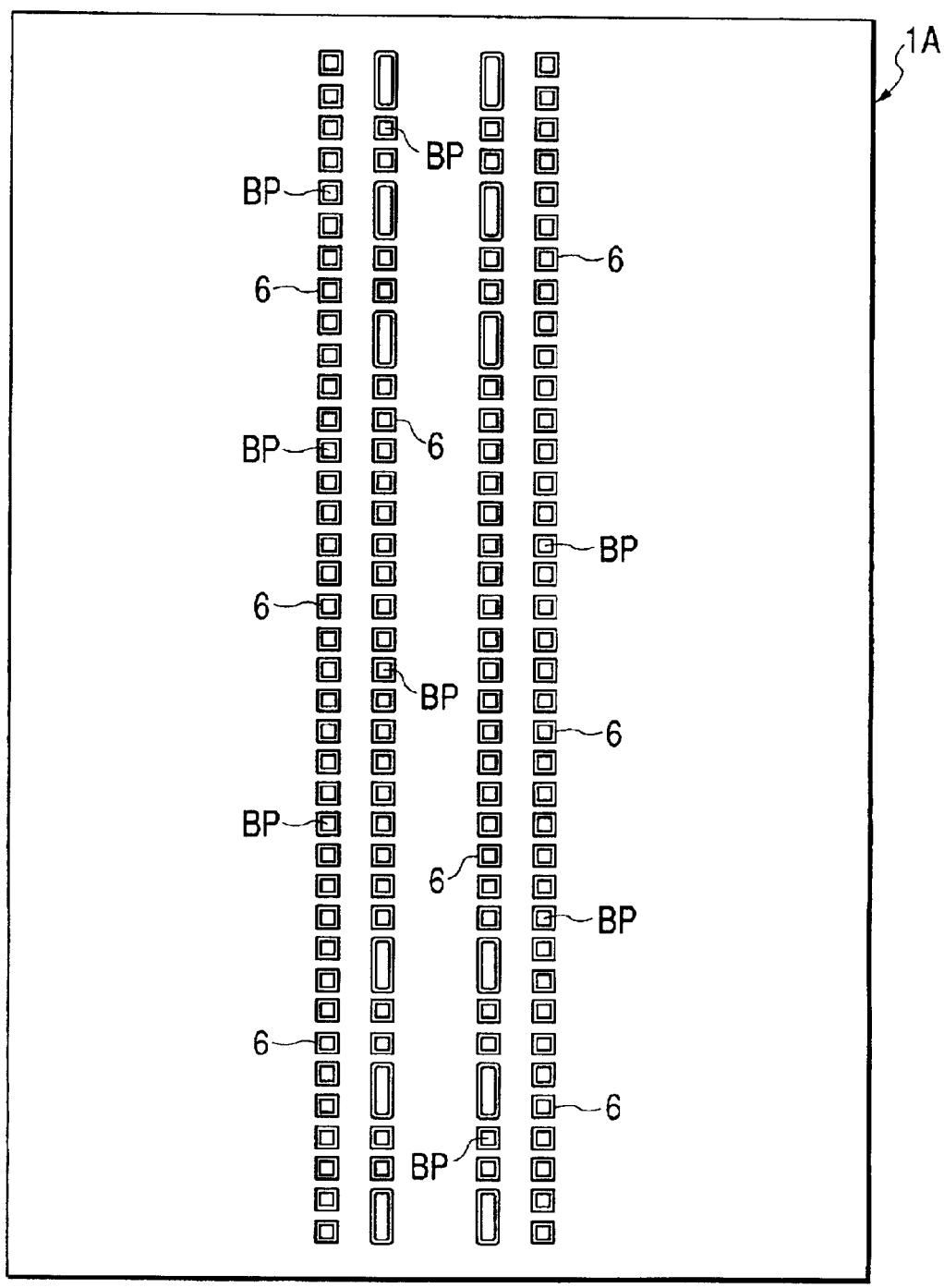
FIG. 10 is a plan view of a chip area showing a state in which an insulating interlayer on the semiconductor wafer.

In order to form the rerouting layers 2 in the chip area 1A of the wafer 1, as shown in FIGS. 9 and 10, a photosensitive polyimide layer 5 having a film thickness of about 35 $\mu$m is formed by spin coating on the upper side of the surface protection layer 3 coating the surface of the wafer 1. After the coating, the resultant structure is baked (for example, for 300 seconds at 92° C.), and open holes 6 are formed in the photosensitive polyimide layer 5 on the upper sides of the bonding pads BP. In order to form the open holes 6, the photosensitive polyimide layer 5 in an area from which the upper portions of the bonding pads BP are removed is exposed and baked (for example, for 60 seconds at 112° C.) to be half-hardened. Unexposed (unhardened) portions of the upper portions of the bonding pads BP are removed by development. The photosensitive polyimide layer 5 and the surface protection layer 3 formed thereunder function as an insulating interlayer which insulates the wiring on the uppermost layer 4 and the rerouting layers 2 from each other.

The wafer 1 is baked to completely harden the half-hardened photosensitive polyimide layer 5 to form a layer having a film thickness of, e.g., 15 $\mu$m, as shown in FIG. 11, a seed layer 7 for plating is formed on the upper side of the photosensitive polyimide layer 5 including the surfaces of the bonding pads BP exposed to the bottoms of the open holes 6. The seed layer 7 for plating is constituted by a Cr (chromium) layer deposited by, e.g., sputtering and having a film thickness of about 50 nm to 150 nm and a Cu (copper) layer having a thickness of about 0.1 $\mu$m to 0.7 $\mu$m.

As shown in FIG. 12, a photoresist layer 8 having an area for forming rerouting layers are formed on the upper side of the seed layer 7 for plating, and a metal layer 9 is formed by electrolytic plating on the surface of the seed layer 7 for plating in the area for forming rerouting layers. The metal layer 9 is constituted by a Cu layer having, e.g., a thickness of about 3 $\mu$m to 15 $\mu$m and an Ni (nickel) layer having a thickness of about 2 $\mu$m to 5 $\mu$m.

Figure 13:
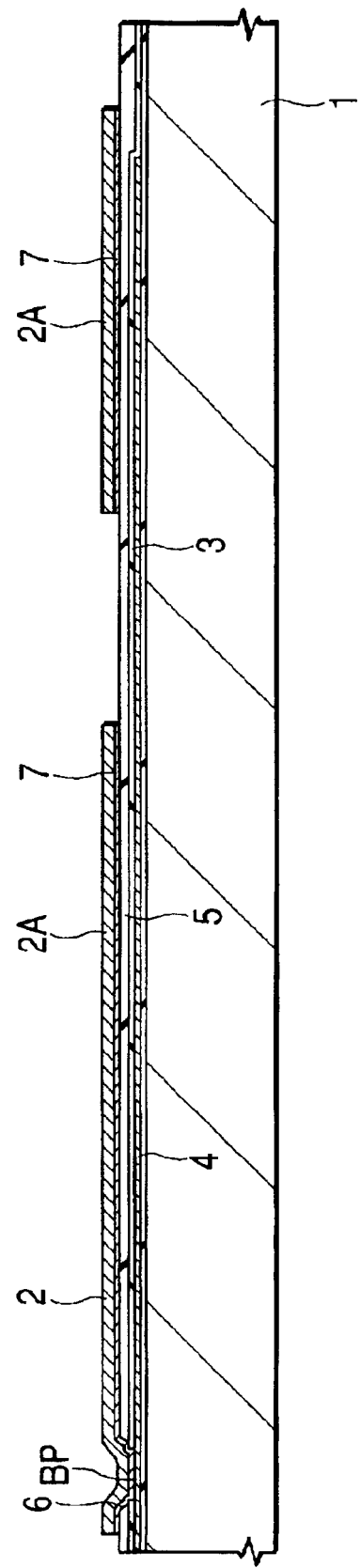
FIG. 13 is a sectional view of a main part of the chip area showing the rerouting forming step.
Figure 14:
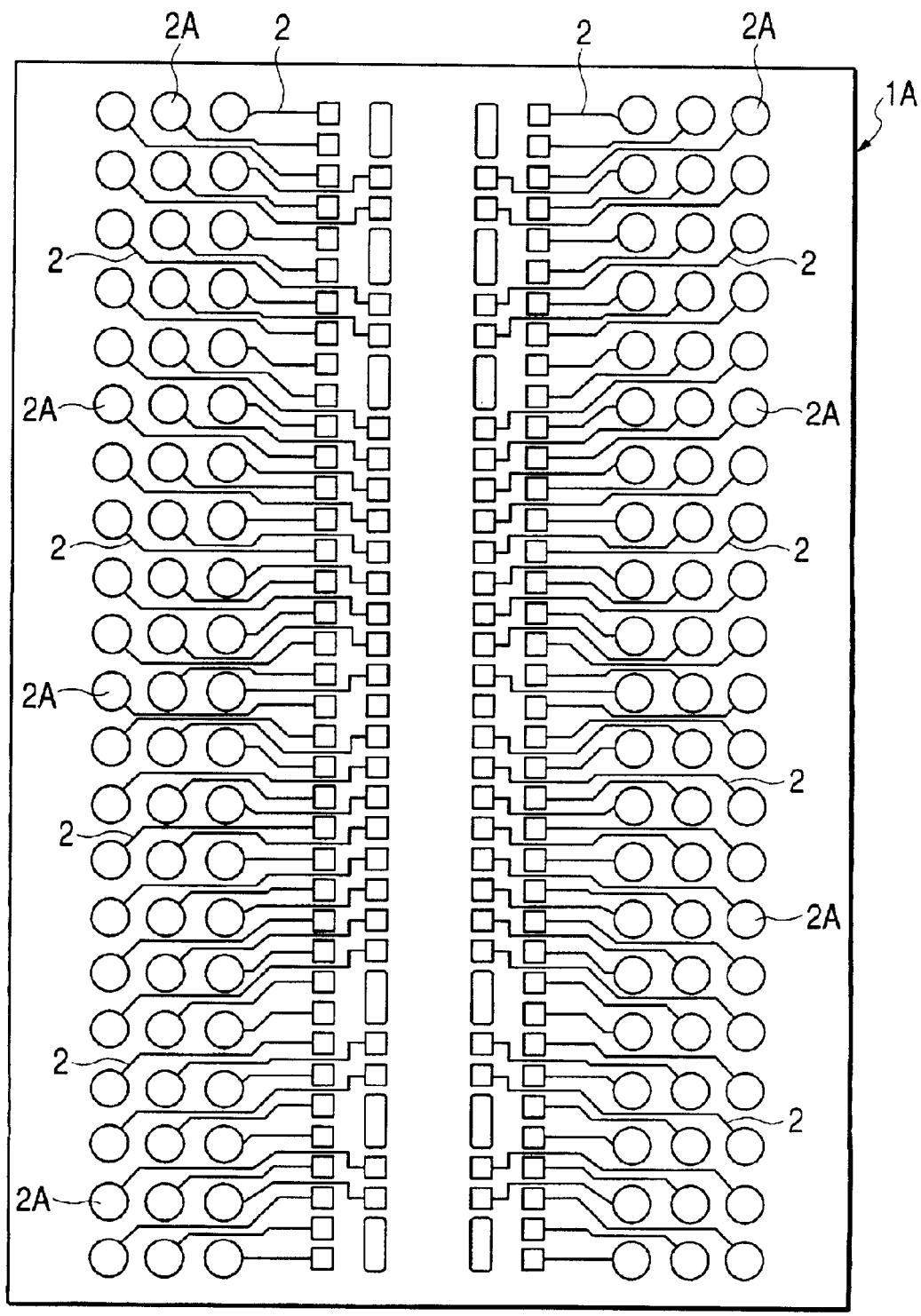
FIG. 14 is a plan view of the chip area showing the rerouting forming step.

The photoresist layer 8 is removed, and the seed layer 7 for plating formed under the photoresist layer 8 is removed by wet etching, so that rerouting layers 2 constituted by the metal layer 9 are formed as shown in FIGS. 13 and 14. When the seed layer 7 for plating formed under the photoresist layer 8 is removed by wet etching, the surface of the metal layer 9 is also etched. However, no problem is posed because the film thickness of the metal layer 9 is considerably larger than the film thickness of the seed layer 7 for plating.

In this manner, the rerouting layers 2 are formed by electrolytic plating in Embodiment 1. When the rerouting layers 2 are formed by such electrolytic plating, the rerouting layers 2 can be easily increased in thickness and micropatterned in comparison with a case in which a metal layer deposited on the upper side of the photosensitive polyimide layer 5 by sputtering is etched to form rerouting layers 2.

A method of switching product types by changing the pattern of the rerouting layers 2 will be described by using FIGS. 15 to 17.

FIGS. 15(a) to 15(d) show connection states between the rerouting layers 2 for supplying a power supply voltage (Vdd) and the rerouting layers 2 for supplying a reference voltage (Vss) and between the bonding pad BP1 and BP2. In the cases in FIGS. 15(a) and 15(b), the rerouting layers 2 for supplying the power supply voltage (Vdd) are connected to a bonding pad BP1. In the cases in FIGS. 15(c) and 15(d), the rerouting layers 2 for supplying the reference voltage (Vss) are connected to the bonding pads BP1. In the cases in FIGS. 15(a) and 15(c), the rerouting layers 2 for supplying the power supply voltage (Vdd) are connected to bonding pads BP2. In the cases in FIGS. 15(b) and 15(d), the rerouting layers 2 for supplying the reference voltage (Vss) is connected to the bonding pads BP2.

As shown in FIG. 17, a bonding option selection circuit 22 is connected to the bonding pads BP1 and BP2 through ESD (Electro-Static Discharge) protection circuit and input buffer circuit 20 and 21. In the bonding option selection circuit 22, an internal signal output to a next-stage circuit (not shown) is set at a high level or a low level depending on whether inputs supplied from the bonding pads BP1 and BP2 are set at a high level (Vdd) or a low level (Vss). This internal signal is used to control an address buffer, a pre-decoder, and a main amplifier. The internal signal determines a bit structure and an action (operation) mode.

When the power supply voltage (Vdd) is supplied to the bonding pad BP1, the bit structure is a ×32-bit structure. When the reference voltage (Vss) is supplied to the bonding pad BP1, a bit structure is a ×64-bit structure. When the power supply voltage (Vdd) is supplied to the bonding pad BP2, an action (operation) mode is a DDR (Double Data Rate) mode. When the reference voltage (Vss) is supplied to the bonding pad BP2, an action (operation) mode is a synchronous mode.

Figure 15A:
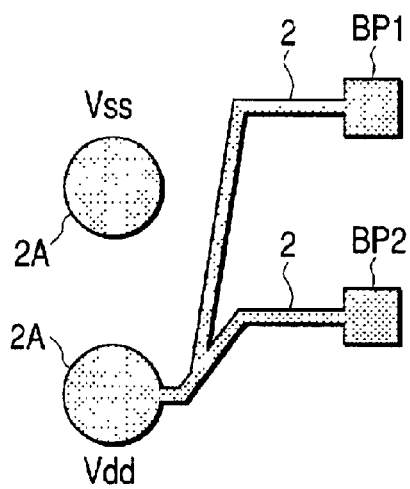
FIGS. 15(a) to 15(d) are plan views showing connection states between bonding pads for selecting functions and bump lands by rerouting, wherein DRAM having a ×32-bit structure and a DDR mode is realized in the case in FIG. 15(a), a DRAM having a ×32-bit structure and a synchronous mode is realized in the case in FIG. 15(b), a DRAM having a ×64-bit structure and a DDR mode is realized in the case in FIG. 15(c), and a DRAM having a ×64-bit structure and a synchronous mode is realized in the case in FIG. 15(d).
Figure 15C:
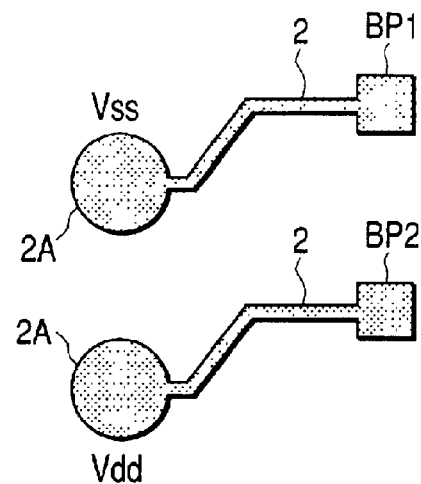
Figure 15B:
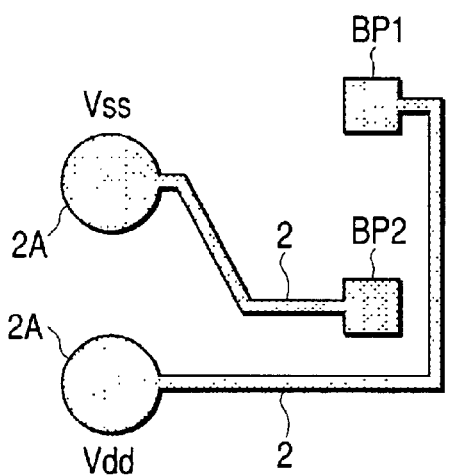
Figure 15D:
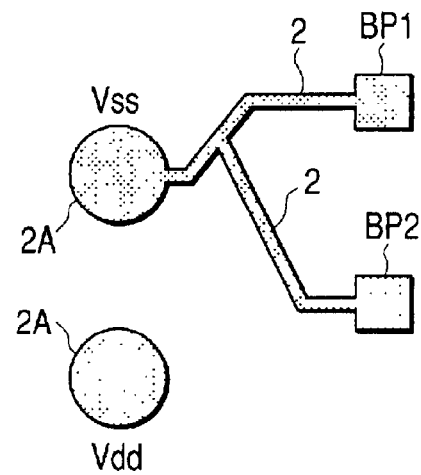
Figures 16, 17:
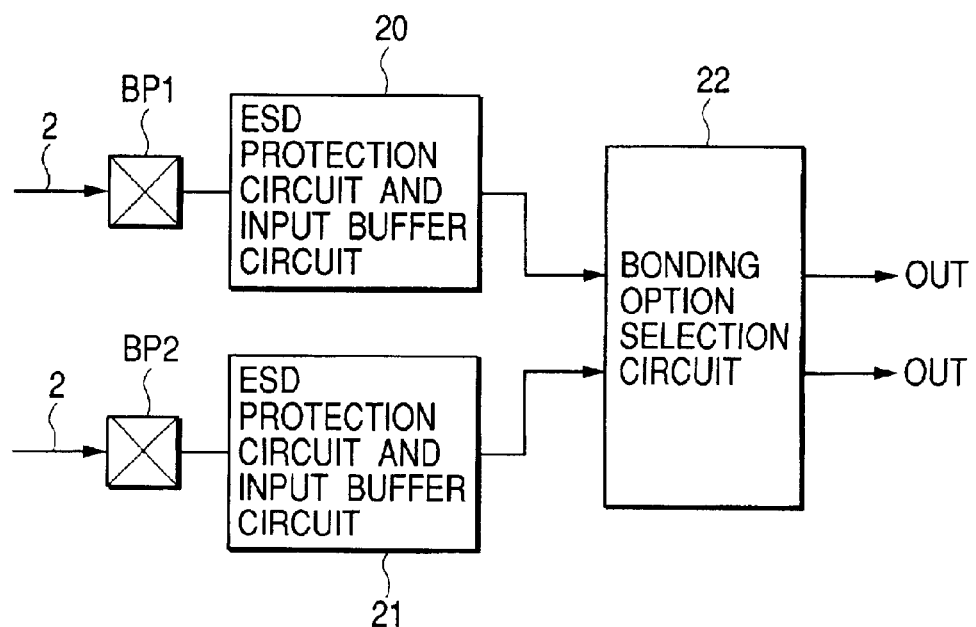
FIG. 16 is a diagram for explaining the functions corresponding to FIGS. 15(a) to 15(d).
FIG. 17 is a block diagram showing input circuits connected to the bonding pads for selecting functions.

In this case, a DRAM having a ×32-bit structure and a DDR mode is realized in the case in FIG. 15(a), and a DRAM having a ×32-bit structure and a synchronous mode is realized in the case in FIG. 15(b). In addition, a DRAM having a ×64-bit structure and a DDR mode is realized in the case in FIG. 15(c), and a DRAM having a ×64-bit structure and a synchronous mode is realized in the case in FIG. 15(d).

FIGS. 18(a) and 18(b) show examples in which connections between the bonding pad BP for supplying a power supply voltage (Vdd) and the bonding pad for supplying a reference voltage (Vss) and the two rerouting layers 2 are switched to each other by client option. In this manner, a WL-CSP can also be mounted on a mounting substrate on which a wiring layout is partially changed.

When the rerouting layers 2 are formed, as shown in FIG. 19, an alignment mark 10, a product name 11, and the like can be simultaneously formed by using a rerouting material (metal layer 9). The alignment mark 10 is used as a position recognition mark used when solder bumps are connected to one terminals (bump lands) of the rerouting layers 2 in the following steps. The product name 11 can be constituted together with the character pattern or the numeral pattern, or can also be constituted by a graphic pattern such as a bar code in place of the character pattern or the numeral pattern.

The manufacturing steps performed after the rerouting layers 2 are formed will be described below. As shown in FIG. 20, an uppermost protection layer 12 constituted by a photosensitive polyimide layer having a film thickness of about 5 $\mu$m to 25 $\mu$m after final hardening is formed on the upper sides of the rerouting layers 2. Subsequently, the uppermost protection layers 12 on the upper portions of one terminals of the rerouting layers 2 are removed to expose bump lands 2A. In order to expose the bump lands 2A, the photosensitive polyimide layer in an area except for the upper portions of one terminals of the rerouting layers 2 are exposed and half-hardened, and unexposed (unhardened) portions of the upper portions of one terminals of the rerouting layers 2 are removed by development. As the material of the uppermost protection layer 12, a solder resist can also be used in place of the photosensitive polyimide resin.

The surfaces of the bump lands 2A are subjected to a pre-process such as ashing to remove a natural oxide film or pollutants. Thereafter, as shown in FIG. 21, plated gold layers 13 each having a film thickness of about 20 nm to 100 nm are formed by using electrolytic plating on the surfaces of the bump lands 2A. Then, as shown in FIG. 22, solder bumps 14 each having a diameter of about 200 $\mu$m to 450 $\mu$m and serving as external connection terminals are formed on the upper sides of the bump lands 2A. The solder bumps 14 are constituted by a Pb (lead) free solder (melting point= 220° C. to 230° C.) consisting of, e.g., 98.5% of Sn (tin), 1% of Ag (silver), and 0.5% of Cu. Prior to the step of forming the solder bumps 14 on the upper sides of the bump lands 2A, the rear surface of the wafer 1 may be polished to further decrease the thickness of the wafer 1.

In order to form the solder bumps 14 on the upper sides of the bump lands 2A, as shown in FIG. 23, a mask 31 for solder printing in which open holes 30 corresponding to the arrangement of the bump lands 2A on the surface of the wafer 1 are formed, is aligned to the wafer 1 to overlap the wafer 1, and a solder paste 14A is printed by squeeze 32. Alignment between the mask 31 for solder printing and the wafer 1 is performed by using the alignment mark 10. Since the alignment mark 10 formed simultaneously with the formation of the rerouting layers 2 are not offset from the bump lands 2A which are one terminals of the rerouting layers 2, the bump lands 2A and the open holes 30 corresponding to the bump lands 2A can be aligned to each other at a high accuracy.

Figure 24:
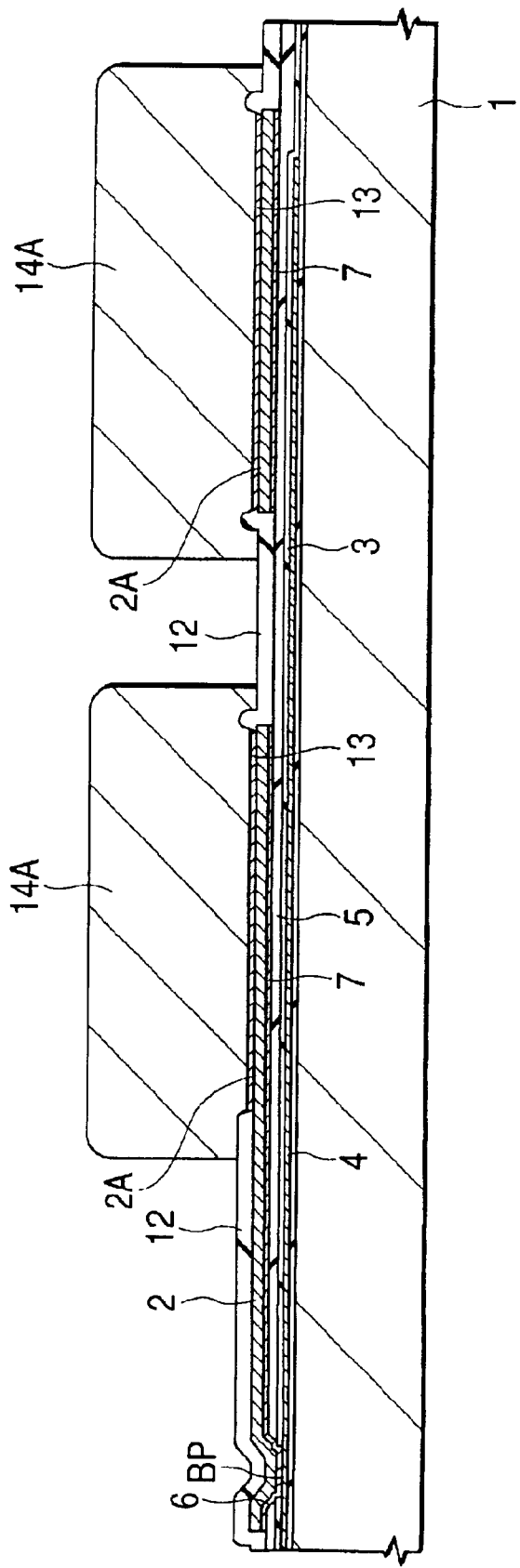
FIG. 24 is a sectional view of a main part of a chip area showing the solder bump forming step.
Figure 25:
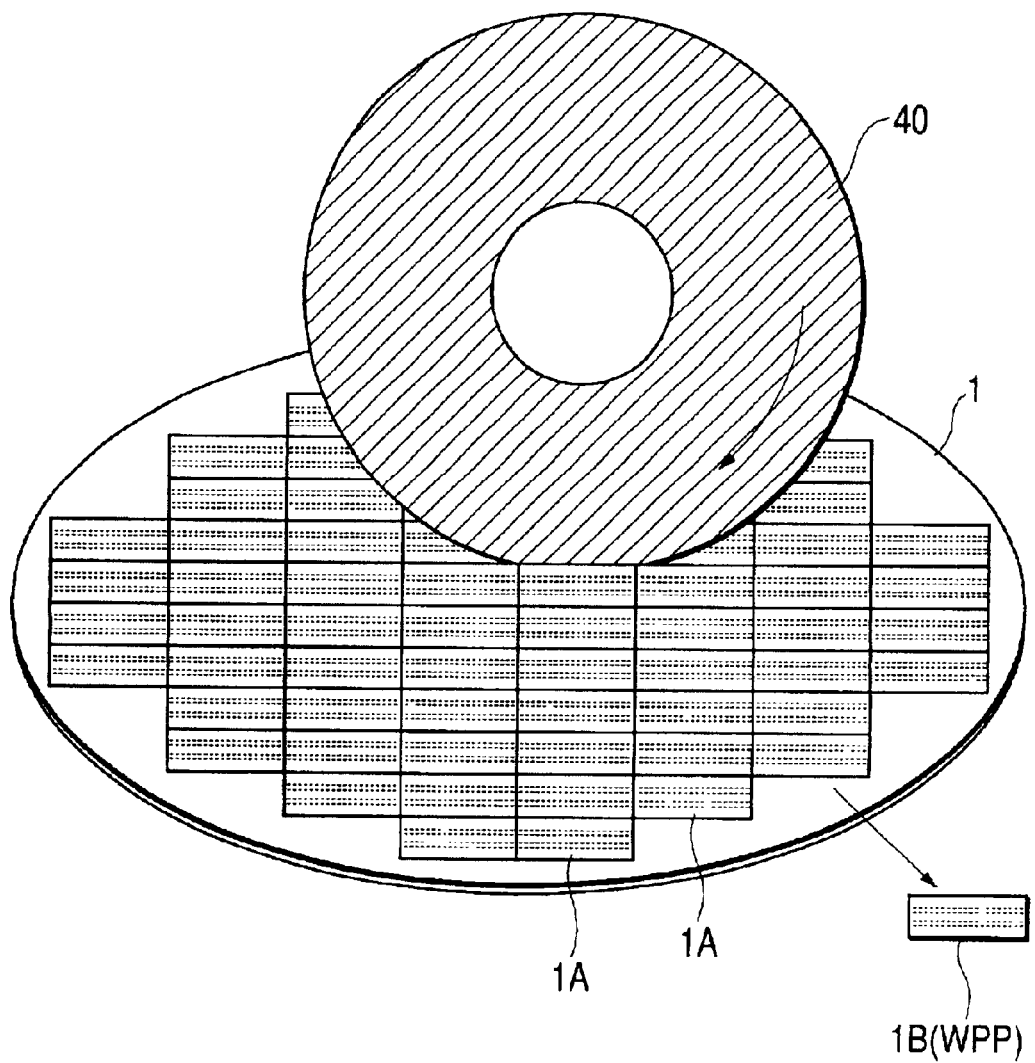
FIG. 25 is a perspective view showing the dicing step for a semiconductor wafer.

As shown in FIG. 24, the solder paste 14A immediately after the printing is flatly printed in an area larger than the area of the bump lands 2A. Thereafter, the wafer 1 is heated at a temperature of about 240° C., and the solder paste 14A is reflowed, so that spherical solder bumps 14 as shown in FIG. 22 are formed. The solder bumps 14 which are external connection terminals can also be formed by plating in place of printing. Solder balls which are shaped to be spherical are supplied onto the bump lands 2A. Thereafter, the wafer 1 may be heated to reflow the solder balls as external connection terminals.

Thereafter, after the wafer 1 is subjected to a burn-in test to decide whether the chip areas 1A are good or defective, as shown in FIG. 25, the respective chip areas 1A are cut and separated into chips by using a dicing blade 40, so that the WL-CSP (semiconductor chip 1B) as shown in FIGS. 1 to 4 can be obtained. The WL-CSP obtained as described above is subjected to various final tests for performance or appearance as needed, and is stored in a tray zig to be shipped.

According to Embodiment 1, the following effects can be obtained.

(1) Since product types can be easily switched in units of wafers by using rerouting layers, the development period of a wafer level CSP can be shortened.

(2) By using rerouting layers, selections of a plurality of functions such as selections of bit configurations or operation modes can be easily performed in units of wafers.

(3) Therefore, the manufacturing method can rapidly cope with a client request.

(4) Stock generated by anticipated production can be reduced.

(5) The manufacturing cost of a wafer level CSP can be reduced by the items (1) to (4).

(6) When product types are switched, processing need not be performed to each chip. From this point of view, a development period can be shortened, and rapid coping with a client request can be achieved.

(7) Since an alignment mark formed in formation of rerouting layers is not offset from the rerouting layer, so that bumps having accurate positions can be formed.

Embodiment 2

Figure 26:
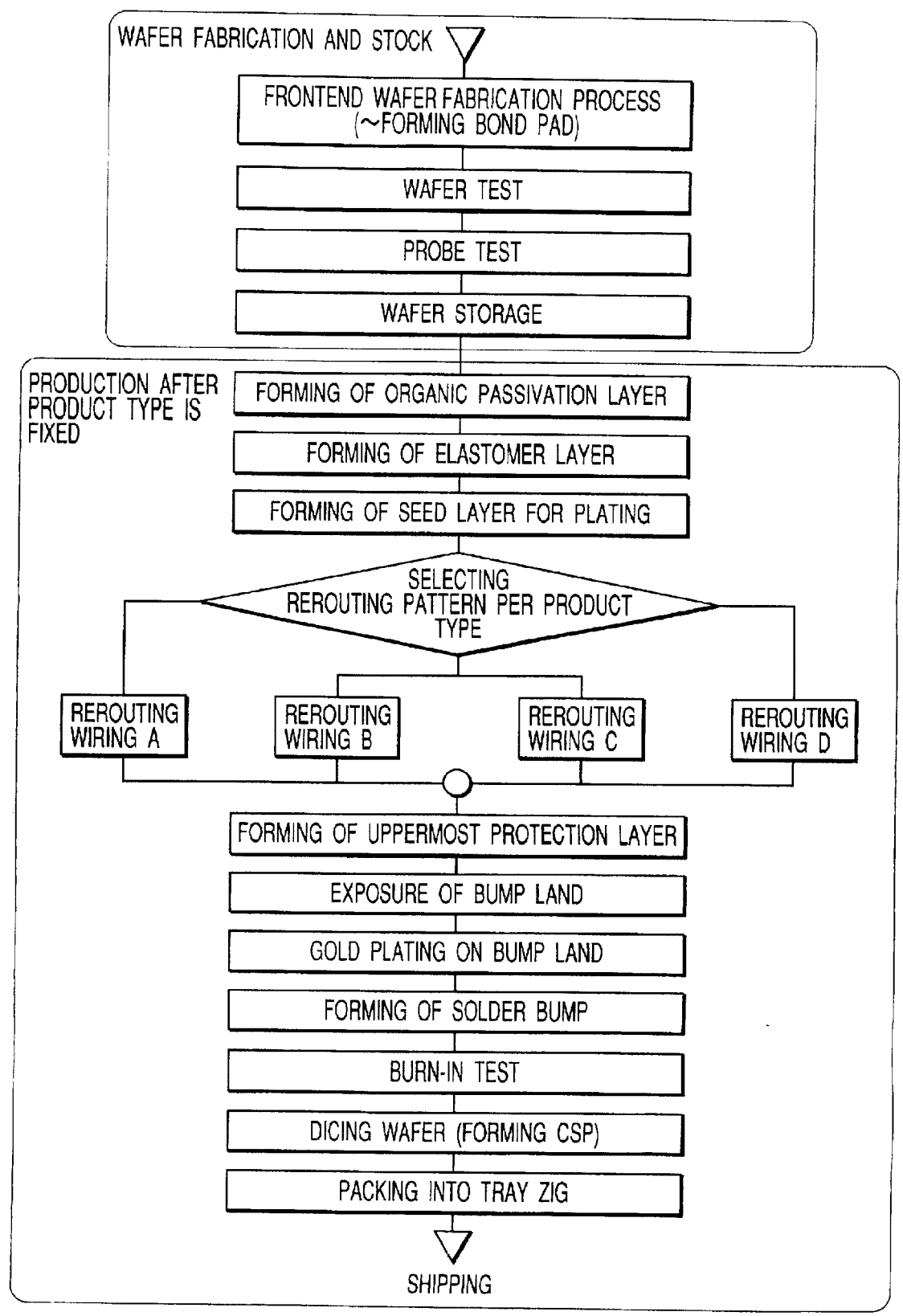
FIG. 26 is a flow chart showing the steps in manufacturing a semiconductor integrated circuit device according to another embodiment of the present invention.

FIG. 26 is a flow chart of the steps in manufacturing a semiconductor integrated circuit device, i.e., a WL-CSP according to Embodiment 2, FIG. 27 is a sectional view of a main part of a wafer in a semiconductor wafer holding state shown in the manufacturing flow chart in FIG. 26. FIGS. 28 to 34 are sectional views showing main parts of the steps of an organic passivation layer after a product type is fixed to the step of forming bumps.

In Embodiment 2, as is apparent from the manufacturing flow chart in FIG. 26, a semiconductor wafer 1 to which a wafer test and a probe test are performed is stocked, product types are fixed, and a rerouting pattern is selectively formed for each product type. Thereafter, the semiconductor wafer 1 is cut into a plurality of semiconductor chips, and the semiconductor chips are separated from each other, so that WL-CSPs are formed. The steps performed until the wafer is stocked are substantially the same as those in Embodiment 1. FIG. 27 is a sectional view of a main part of the wafer 1 on which the entire surface of a wiring on the uppermost layer 4 is covered with a surface protection layer 3 except for the upper portion of bonding pads BP. A large number of wafers 1 described above are stocked in units of lots. A necessary lot is picked when a product type and its quantity, and the following steps are started.

As shown in FIG. 28, a photosensitive polyimide layer 5 is formed on the surface of the wafer 1 by, e.g., spin coating, and open holes 6A are formed in the photosensitive polyimide layer 5 on the upper sides of the bonding pads BP by the same method as that in Embodiment 1.

Figure 29:
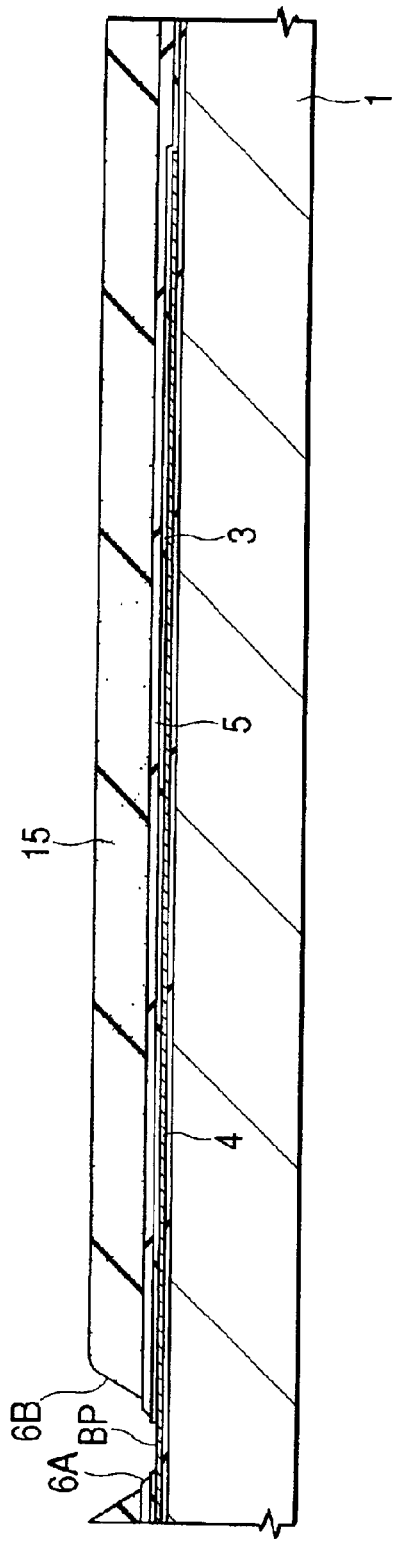
FIG. 29 is a sectional view of a main part of the chip area showing the rerouting forming step.

As shown in FIG. 29, an elastomer layer 15 formed of an low-elasticity resin and a film thickness of about 75 $\mu$m is formed on the upper side of the photosensitive polyimide layer 5 by printing. The elastomer layer 15 is formed to have open holes 6B each having diameters larger than the diameters of the open holes 6A of the photosensitive polyimide layer 5 on the upper portions of the bonding pads BP.

Figure 30:
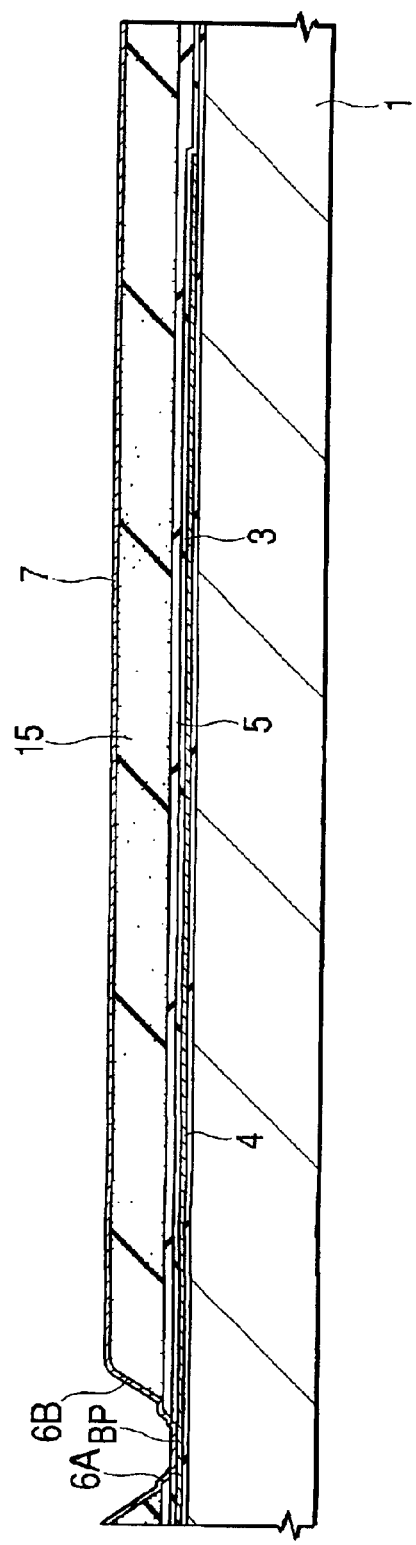
FIG. 30 is a sectional view of a main part of the chip area showing the rerouting forming step.

As shown in FIG. 30, a seed layer 7 for plating is formed on the upper side of the elastomer layer 15 including the surfaces of the bonding pads BP exposed to the bottoms of the open holes 6B. Then, as shown in FIG. 31, a photoresist layer 8 having a rerouting forming area opened therein is formed on the upper side of the seed layer 7 for plating. Thereafter, as shown in FIG. 32, an metal layer 9 is formed on the surface of the seed layer 7 for plating in the rerouting forming area by electrolytic plating. After the photoresist layer 8 is removed, the seed layer 7 for plating under the photoresist layer 8 is removed by wet etching, and, as shown in FIG. 33, rerouting layers 2 constituted by the metal layer 9 are formed. At this time, for example, rerouting patterns corresponding to types such as patterns of the rerouting layers 2 shown in FIGS. 15(a) to 15(d) in Embodiment 1 are formed.

In this manner, as in Embodiment 2, by changing the patterns of the rerouting layers 2 in a wafer state, products of types having different bit configurations or different operation modes can be manufactured from the wafer 1 in which the same DRAMs are formed.

As shown in FIG. 34, solder bumps 14 are formed on the surfaces of bump lands 2A by the same method as that in Embodiment 1. Thereafter, each chip area 1A is cut into chips, and the chips are separated from each other, so that WL-CSPs (semiconductor chips 1B) can be obtained.

In a WL-CSP according to Embodiment 2, since the elastomer layer 15 formed of a low-elasticity resin is formed between the wiring on the uppermost layer 4 and the rerouting layers 2, thermal stress generated when the WL-CSP is mounted on a mounting substrate or in actual use of the WL-CSP after the mounting can be effectively moderated by the elastomer layer 15. In this manner, stress acting on the connection portions (solder bumps 14) between the WL-CSP and the mounting substrate is further moderated, and the lifetime of the connection of the solder bumps 14 is elongated.

In the WL-CSP according to Embodiment 1 which does not have a stress moderation layer such as the elastomer layer 15, the step of filling a filling resin (underfill resin) between the WL-CSP and the mounting substrate must be performed as a countermeasure against stress. However, in the steps in manufacturing a WL-CSP according to Embodiment 2, the step of filling an underfill resin can be omitted. In this manner, the step of mounting a WL-CSP on a mounting substrate is simplified, and the WL-CSP mounted on the mounting substrate can be easily repaired.

The effects in Embodiment 2 described above are as follows.

(1) Since product types can be easily switched in units of wafers by using rerouting layers, the development period of a wafer level CSP can be shortened.

(2) By using rerouting layers, selections of a plurality of functions can be easily performed in units of wafers.

(3) Therefore, the manufacturing method can rapidly cope with a client request.

(4) Stock generated by anticipated production can be reduced.

(5) The manufacturing cost can be reduced by the items (1) to (4).

(6) When product types are switched, processing need not be performed to each chip. From this point of view, a development period can be shortened, and rapid coping with a client request can be achieved.

(7) Thermal stress generated when a WL-CSP is mounted on a mounting surface or thermal stress generated in actual use of the WL-CSP after the WL-CSP is mounted can be moderated by the elastomer layer 15.

(8) The step of filling an underfill resin can be omitted in mounting, and the step of mounting a WL-CSP can be simplified.

Embodiment 3

Figure 35:
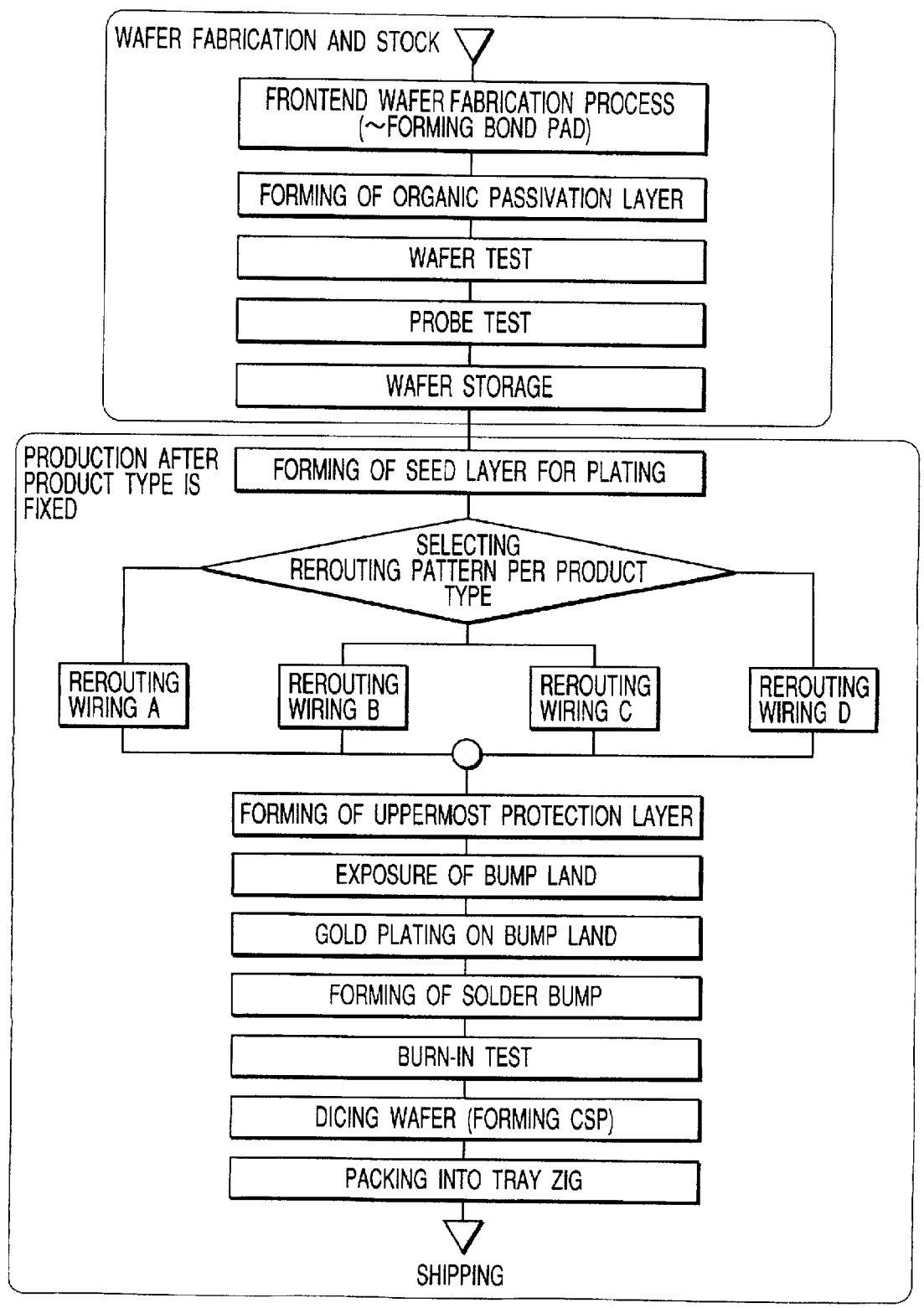
FIG. 35 is a flow chart showing the steps in manufacturing a semiconductor integrated circuit device according still another aspect of the present invention.
Figure 36:
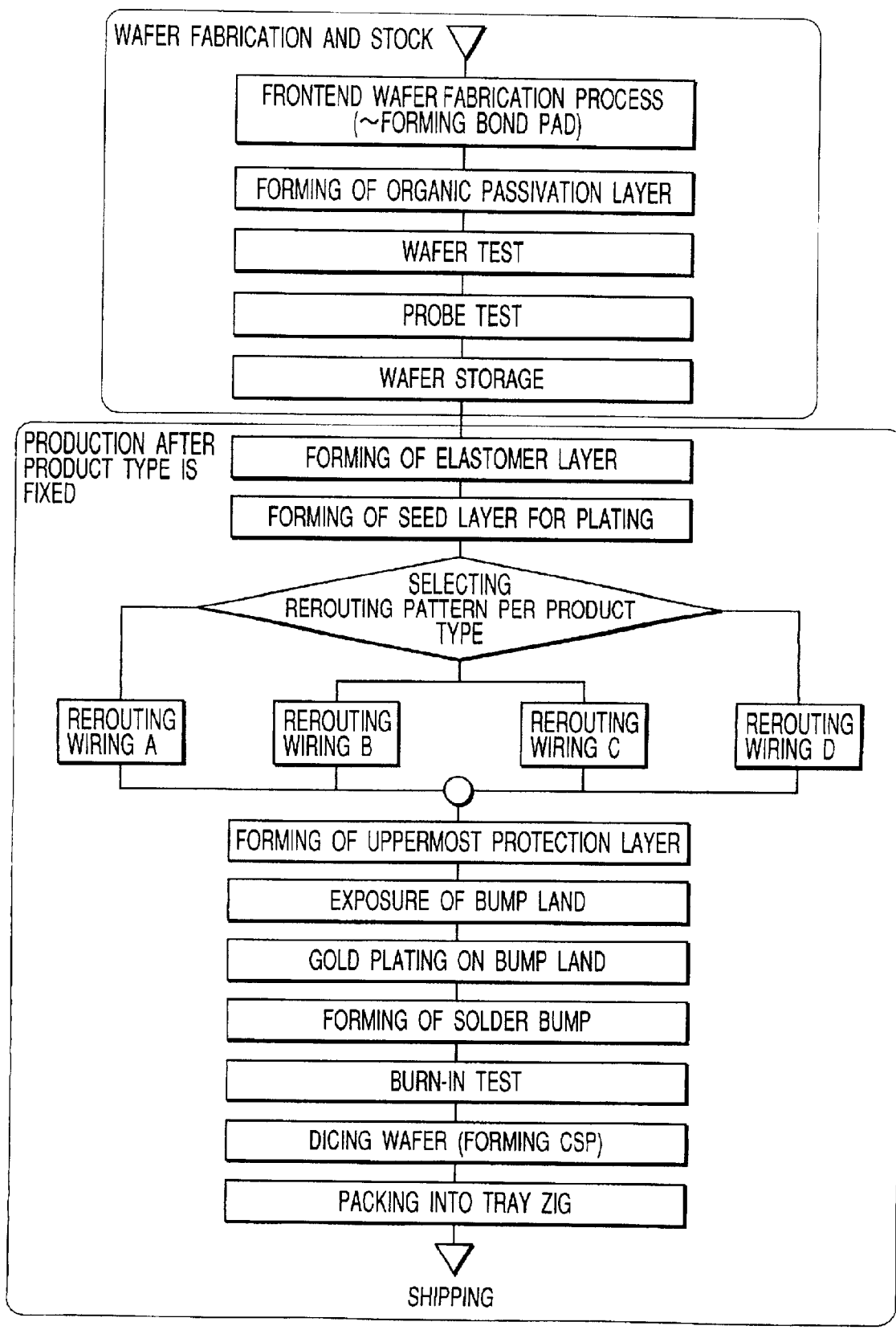
FIG. 36 is a flow chart showing the steps in manufacturing a semiconductor integrated circuit device according still another aspect of the present invention.
Figure 37:
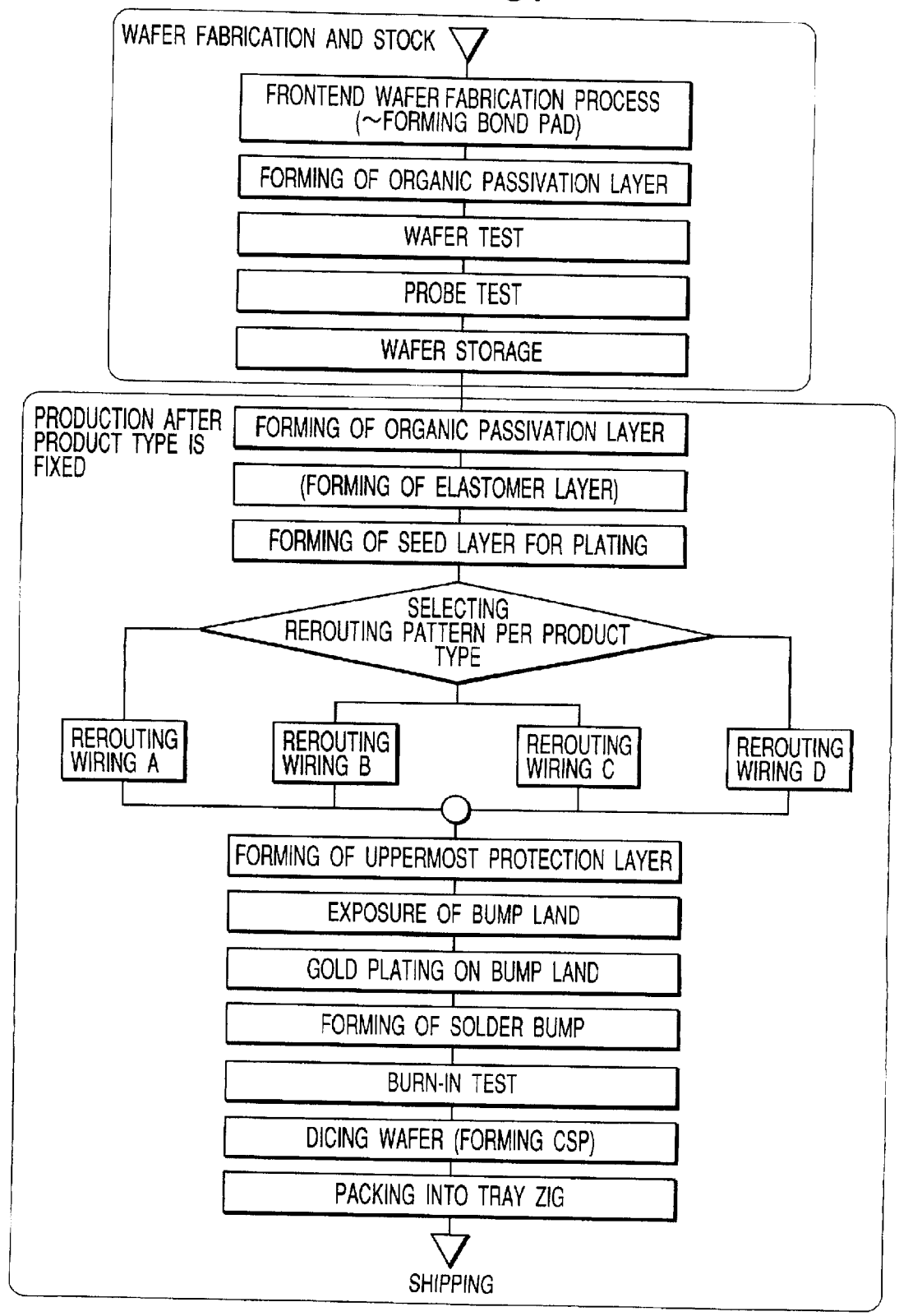
FIG. 37 is a flow chart showing the steps in manufacturing a semiconductor integrated circuit device according still another aspect of the present invention.

FIGS. 35, 36, and 37 are manufacturing flow charts showing methods of manufacturing semiconductor integrated circuit devices according to Embodiment 3, i.e., WL-CSPs. In each of the manufacturing methods shown in FIGS. 36, 37, and 38, as in Embodiments 1 and 2, a semiconductor wafer is stocked in advance, a product type is fixed, and rerouting layers depending on the product type are formed. Unlike Embodiments 1 and 2, an organic passivation layer is formed before the semiconductor wafer is stocked.

When the organic passivation layer is formed in advance as described above, damage to a semiconductor wafer when the semiconductor wafer is conveyed and stocked can be reduced.

The manufacturing method shown in FIG. 36 is a method in which rerouting layers are formed on the organic passivation layer after a product type is fixed. The steps performed until a product is completed after a product type is fixed can be more reduced in number.

In the manufacturing method shown in FIG. 37, an elastomer is formed after a product type is fixed, and rerouting layers are formed on the elastomer. A stress moderation effect by an elastomer can be obtained when a product (WL-CSP) is mounted.

Figure 38:
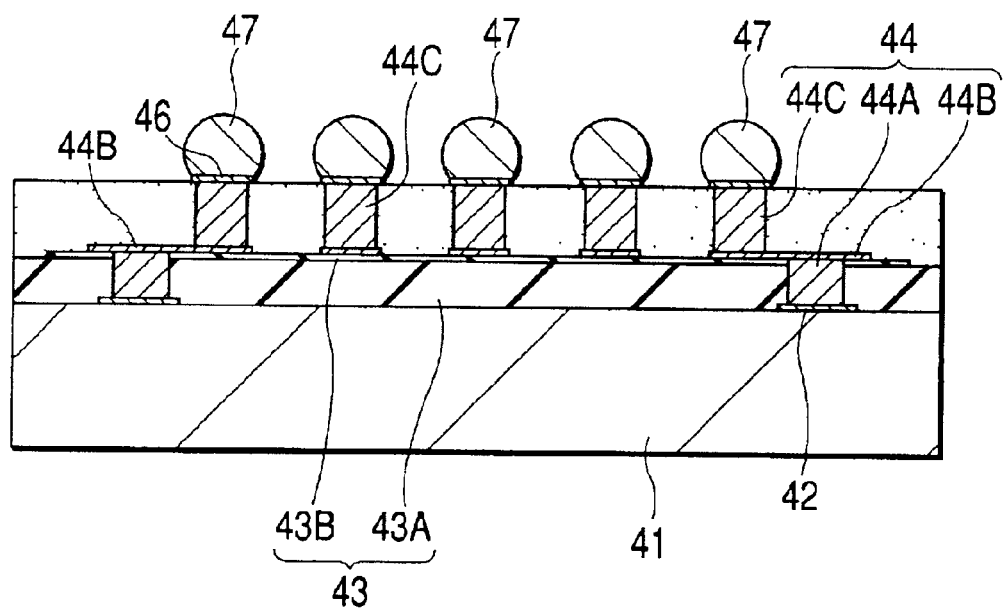
FIG. 38 is a sectional view showing a method of manufacturing a semiconductor integrated circuit device according to still another embodiment of the present invention.

In the manufacturing method shown in FIG. 38, a second organic passivation layer is formed after the product type is fixed, and rerouting layers are formed on the second organic passivation layer. The film thickness is increased by the organic passivation layer formed as described above and the second organic passivation layer to advantageously moderate stress generated when a product is mounted. In addition, in order to make moderation of stress in mounting more reliable, after an elastomer layer is formed on the second organic passivation layer, rerouting layers may be formed on the elastomer layer.

Embodiment 4

FIG. 38 is a sectional view of a semiconductor integrated circuit device, i.e., a WL-CSP according to Embodiment 4. In the WL-CSP shown in FIG. 38, bonding pads 42 formed on a peripheral portion of one major surface of a semiconductor chip 41 are connected to solder bumps 47 with rerouting layers 44. The rerouting layers 44 are formed of copper, and are constituted by wiring portions 44A and 44B and a copper post (columnar part) 44C. Such a structure is also stocked in a wafer state, rerouting layers having different patterns are formed depending on product types after the product types are fixed, so that a plurality of WL-CSPs of different types can be manufactured from the wafer on which LSIs of one type are formed.

Embodiment 5

Figure 39:
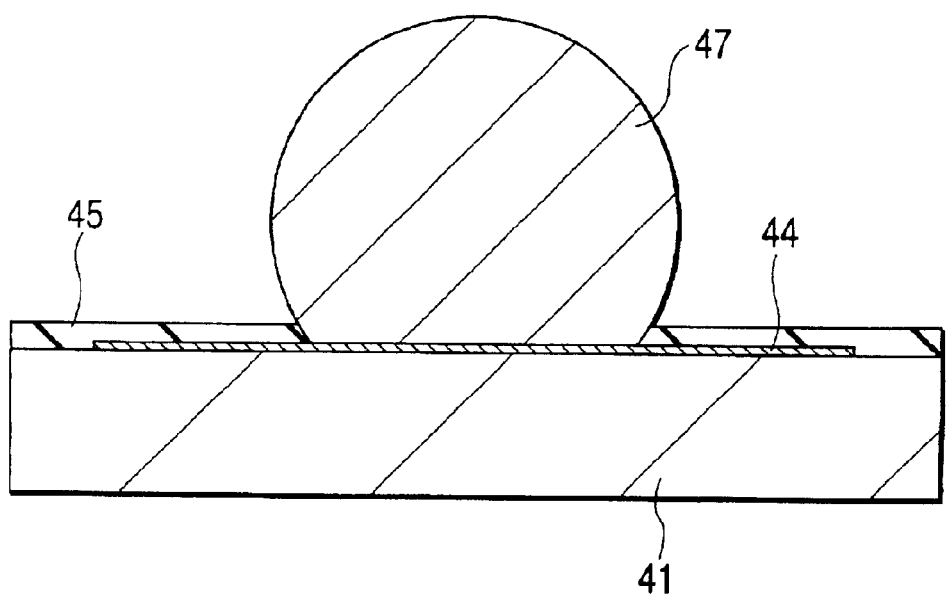
FIG. 39 is a sectional view showing a method of manufacturing a semiconductor integrated circuit device according to still another embodiment of the present invention.

FIG. 39 is a sectional view of a semiconductor integrated circuit device, i.e., a WL-CSP according to Embodiment 5. The WL-CSP shown in FIG. 39 has a structure in which bonding pads (not shown) formed on a major surface of a semiconductor chip 41 are connected to solder bumps 47 with rerouting layers consisting of Al/NiV/Cu. In the method of manufacturing a WL-CSP, a wafer is stocked in a wafer state, and rerouting patterns depending on product types after the product types are fixed are formed.

Embodiment 6

Figure 40:
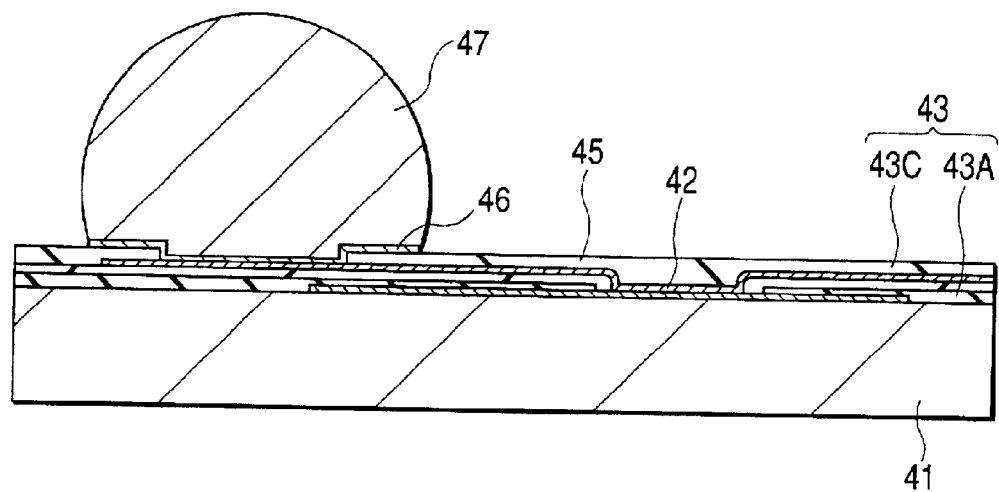
FIG. 40 is a sectional view showing a method of manufacturing a semiconductor integrated circuit device according to still another embodiment of the present invention.

FIG. 40 is a sectional view of a semiconductor integrated circuit device, i.e., a WL-CSP according to Embodiment 6. The WL-CSP shown in FIG. 40 has a structure in which bonding pads 42 formed on a major surface of a semiconductor chip 41 are connected to solder bumps 47 with rerouting layers formed of AL.

Even when the WL-CSP having the above structure is manufactured, a semiconductor wafer is stocked in a wafer state and the rerouting layers consisting of AL and having patterns depending on production types after the product types are fixed are formed, so that the object of the present invention can be achieved.

Embodiment 7

Figure 41:
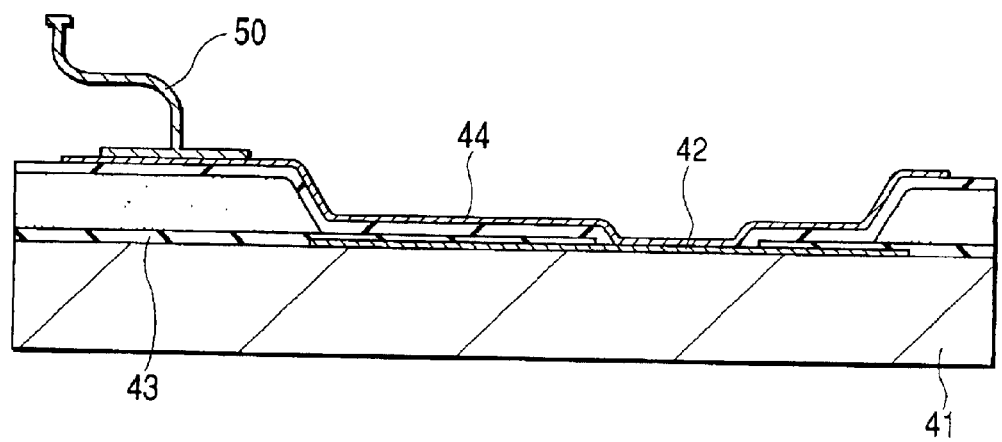
FIG. 41 is a sectional view showing a method of manufacturing a semiconductor integrated circuit device according to still another embodiment of the present invention.

FIG. 41 is a sectional view of a semiconductor integrated circuit device, i.e., a WL-CSP according to Embodiment 7. The WL-CSP shown in FIG. 41 has a structure in which micro-springs 50 are used in place of solder bumps as external connection terminals. Also, in this case, after product types are fixed, rerouting layers 44 having different patterns depending on the product types are fixed, so that a plurality of WL-CSPs of different product type can be manufactured from a wafer on which LSIs of one type are formed.

Each of Embodiments 1 to 7 describes a method of selecting a function such as a bit configuration or an operation mode by partially changing rerouting patterns. However, the following Embodiments 8–10 will describe a method of selecting the characteristics of a semiconductor integrated circuit device by changing rerouting patterns.

Embodiment 8

In Embodiment 8, a method of switching driverabilities (driving forces) of an output buffer which are one of the characteristics of the semiconductor integrated circuit device by changing rerouting patterns will be described.

General-purpose LSIs such as DRAMs or microcomputers are mounted on various electronic devices having different external loads. In this case, when the driverability of an output buffer formed in the LSI is not optimized for an external load, noise or an increase in power consumption may be caused. In order to prevent the noise or the increase in power consumption, it is effective to optimize the driverability of the output buffer, i.e., the value of an output impedance ($Z_0$) of a signal transmission line depending on an external load.

As a method of switching the driverabilities of the output buffer, the following method may be considered. That is, for example, several I/O driver circuits having different driverabilities are prepared in a chip, Al wiring patterns in the chip are changed depending on a load of an electronic device on which the chip is to be mounted, so that an I/O driver circuit having an optimum driverability is selected. However, in this method, wafers of several types having different Al wiring patterns must be prepared. For this reason, the wafer process (pre-process) becomes cumbersome disadvantageously.

As another method of selecting an I/O driver circuit having an optimum driverability, the following method may be considered. That is, bonding pads are connected to a plurality of I/O driver circuit, respectively, and an I/O driver circuit is selected by switching the bonding wires. However, in this method, since the number of bonding pads increases, the area of a bonding pad area in the chip disadvantageously increases.

The following method is also be considered. That is, a resistor having a variable resistance is arranged on a substrate on which a chip is to be mounted, and a resistance input from a dedicated bonding pad (input pin) connected to the resistor is detected by the chip, so that an I/O driver circuit is selected. However, in this method, the dedicated bonding pad (input pin) must be disadvantageously formed on the chip, and a circuit for detecting the resistance must be disadvantageously arranged. In addition, since the resistor must be formed on the substrate, the load of design for a mounting substrate increases disadvantageously.

As a method of selecting an I/O driver circuit having an optimum driverability without the above disadvantages, Embodiment 8 uses a method in which, when rerouting layers are formed on a wafer, the patterns of the rerouting layers are partially changed. A concrete example of a method of selecting an I/O driver circuit by changing the rerouting patterns will be described below.

Figure 42:
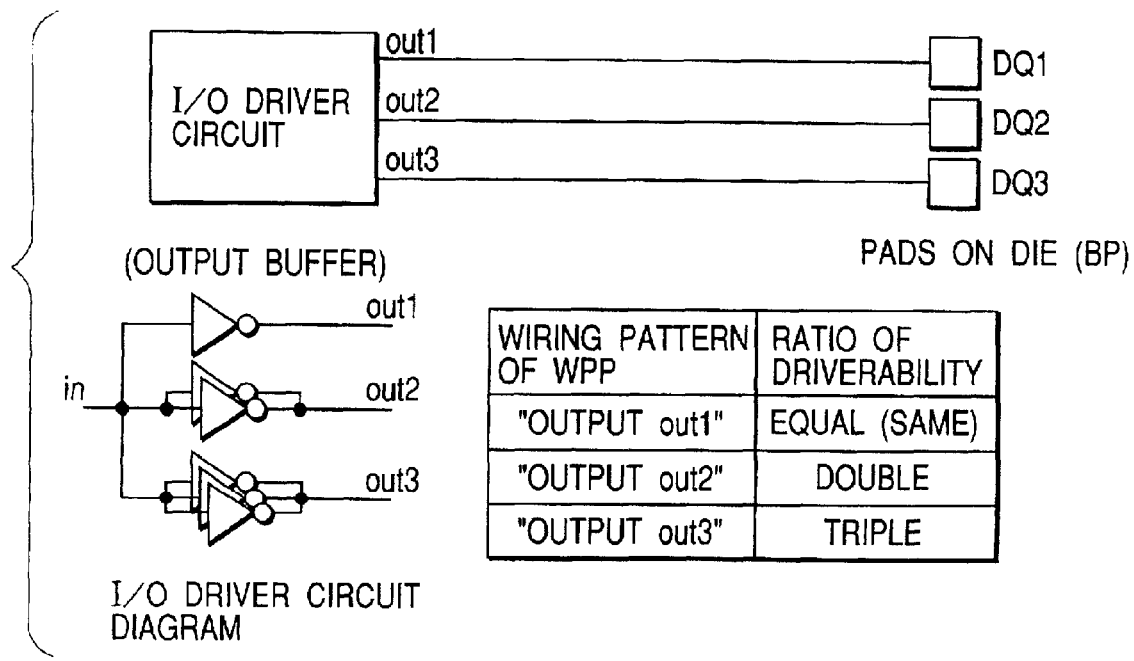
FIG. 42 is a schematic diagram showing an example of an I/O driver circuit.

FIG. 42 shows an example of an I/O driver circuit formed in a WL-CSP (semiconductor chip). This I/O driver circuit has, for example, three output buffers having different driverabilities. Outputs (out1, out2, and out3) from these output buffers are connected to bonding pads BP(DQ1), BP(DQ2), and BP (DQ3) through Al alloy wires, respectively. The values of driverabilities output from the I/O driver circuits satisfy the following conditions. That is, the output (out2) is two times the output (out1), and the output (out3) is three times the output (out1).

Figure 43:
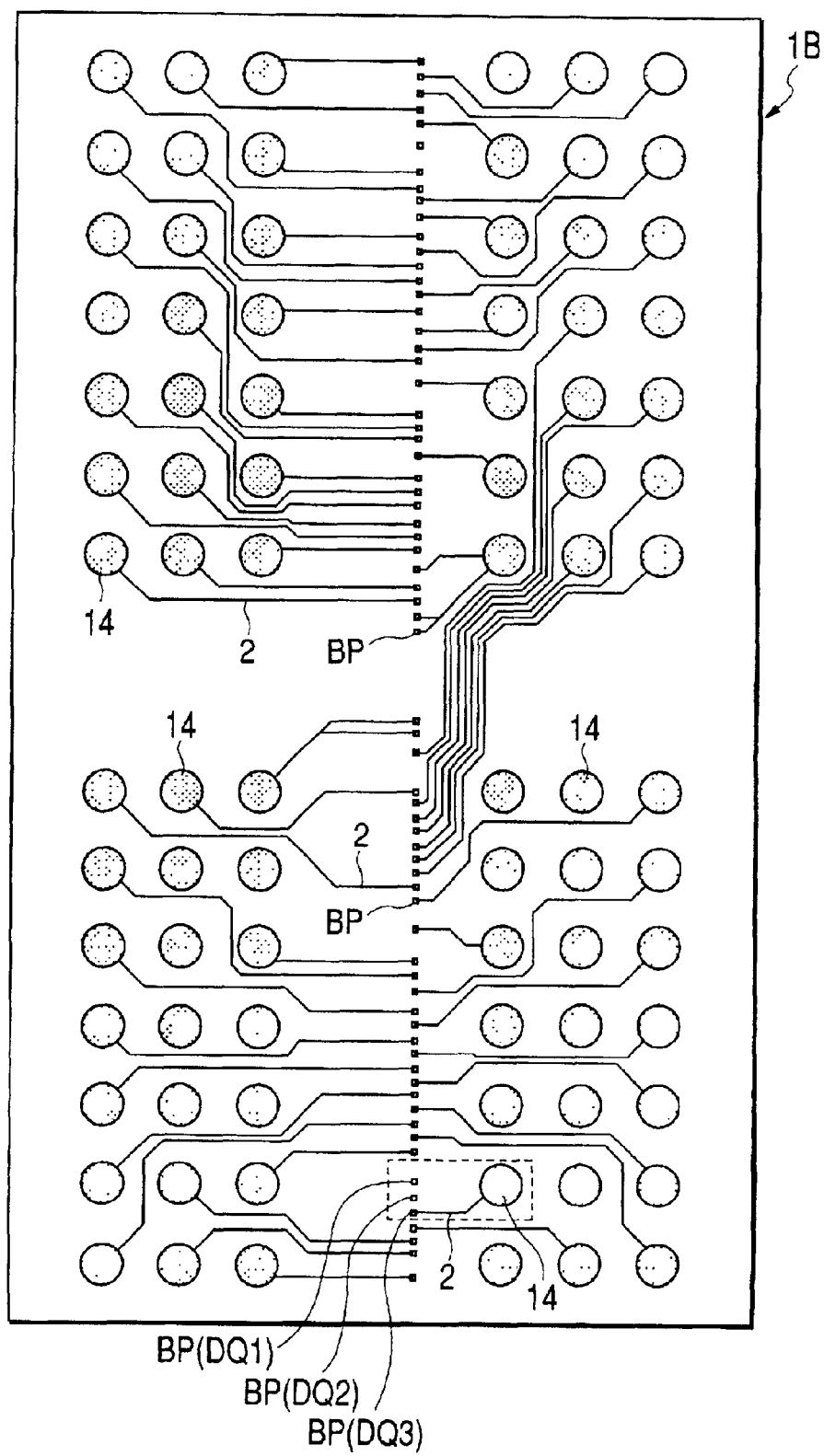
FIG. 43 is a plan view of a semiconductor chip showing a semiconductor integrated circuit device according to still another embodiment of the present invention.

FIG. 43 is a plan view of a semiconductor chip 1B showing a WL-CSP according to Embodiment 8 on which the bonding pads BP (DQ1, DQ2, and DQ3) and rerouting layers 2 are formed. FIG. 44 is an enlarged view showing a part of FIG. 43.

Figure 44A:
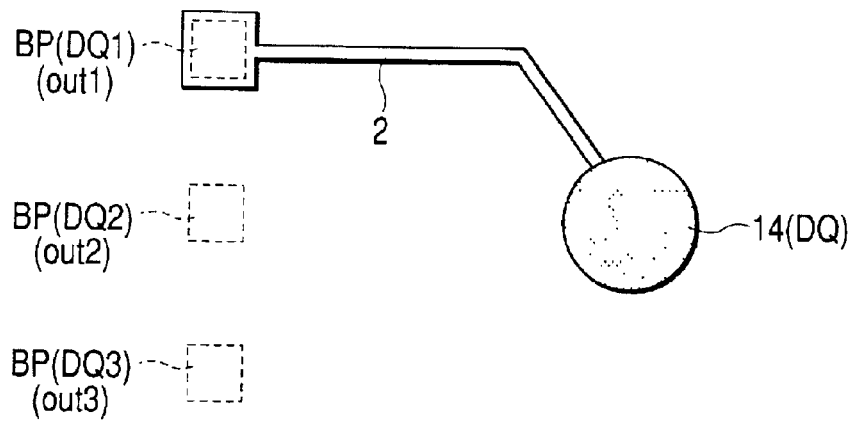
FIGS. 44(a) to 44(c) are plan views showing a method of selecting an I/O driver circuit.
Figure 44B:
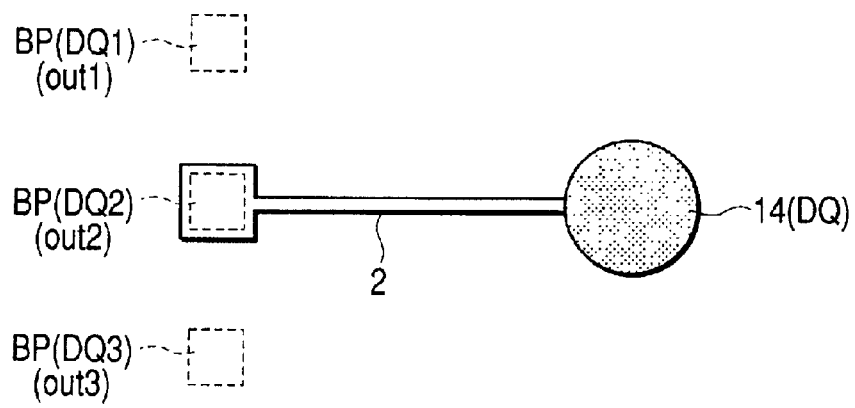
Figure 44C:
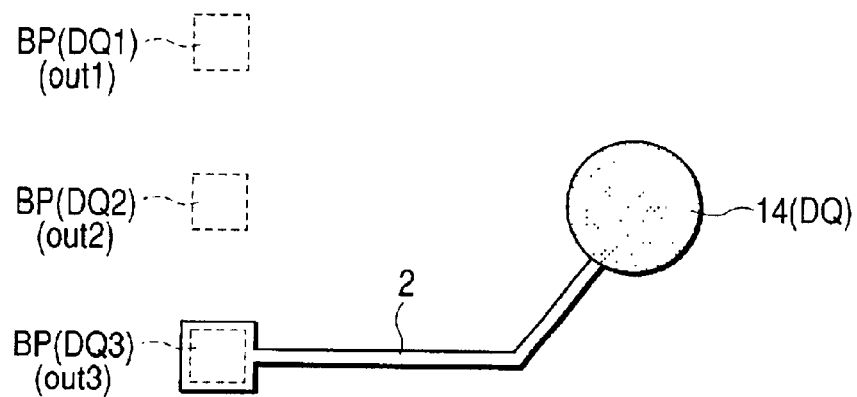

As shown in FIGS. 44(a) to 44(c), in order to switch the driverabilities of the WL-CSP, each of solder bumps 14 (external connection terminals) constituting DQ pins may be electrically connected to one of the bonding pads BP (DQ1, DQ2, and DQ3) by the rerouting layer 2. For example, in FIG. 44(a), each of the solder bumps 14 constituting DQ pins is connected to the bonding pad BP (DQ1) through the rerouting layer 2. In this case, since the solder bump 14 constituting the DQ pin is connected to the output (out1) through the bonding pad BP (DQ1), the driverability of the WL-CSP is minimum. In addition, in the case in FIG. 44(b), the DQ pin (solder bump 14) is connected to the bonding pad BP (DQ2) through the rerouting layer 2. In this case, since the DQ pin (solder bump 14) is connected to the output (out2) through the bonding pad BP (DQ2), the driverability of the WL-CSP is two times the driverability obtained in the case in FIG. 44(a). In the case shown in FIG. 44(c), the DQ pin (solder bump 14) is connected to the bonding pad BP (DQ3) through the rerouting layer 2. In this case, since the DQ pin (solder bump 14) is connected to the output (out3) through the bonding pad BP (DQ3), the driverability of the WL-CSP is three times the driverability obtained in the case in FIG. 44(a).

Figure 45:
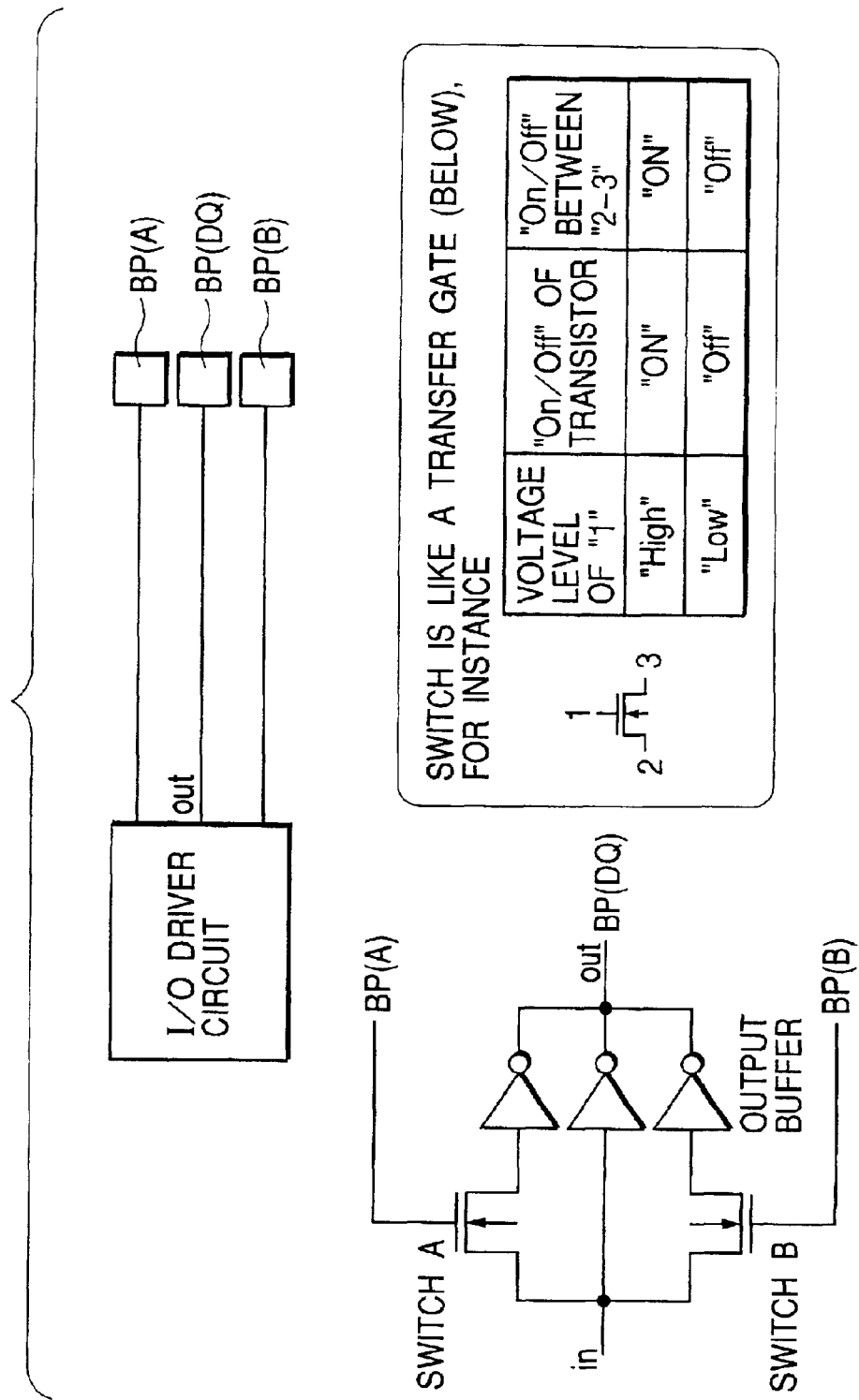
FIG. 45 is a schematic diagram showing another example of an I/O driver circuit.

FIG. 45 shows another example of an I/O driver circuit. In this I/O driver circuit, three output buffers having equal driverabilities are connected in parallel to each other. One bonding pad BP (DQ) is connected to the output (out) of the I/O driver circuit through an Al alloy wire. A switch A is connected to one of the three output buffers, and a switch B is connected to the other output buffer. Each of the switches A and B is constituted by, e.g., an n-channel MOS transistor. A bonding pad BP (A) is connected to the gate electrode of the n-channel MOS transistor constituting the switch A through an Al alloy wire, and a bonding pad BP (B) is connected to the gate electrode of the n-channel MOS transistor constituting the switch B through an Al alloy wire.

When a high-level voltage (Vdd) is input to the switch A through the bonding pad BP (A), the n-channel MOS transistor is turned on. When a low-level voltage (Vss) is input to the switch A, the n-channel MOS transistor is turned off. Similarly, when a high-level voltage (Vdd) is input to the switch B through the bonding pad BP (B), the n-channel MOS transistor is turned on. When a low-level voltage (Vss) is input to the switch B, the n-channel MOS transistor is turned off. Thereafter, when both the switches A and B are in an OFF state, a signal is output from only one output buffer, to which switches A and B are not connected, of the three output buffers to the bonding pad BP (DQ). for this reason, the driverability of the WL-CSP is minimum. When any one of the switches A and B is in an ON state, and the other is in an OFF state, signals are output from the two output buffers to the bonding pad BP (DQ). for this reason, the driverability of the WL-CSP is two times the driverability obtained when both the switches A and B are in an OFF state. When both the switches A and B are in an ON state, signals are output from the three output buffers to the bonding pad BP (DQ), the driverability of the WL-CSP is three times the driverability obtained when both the switches A and B are in an OFF state.

Figure 46A:
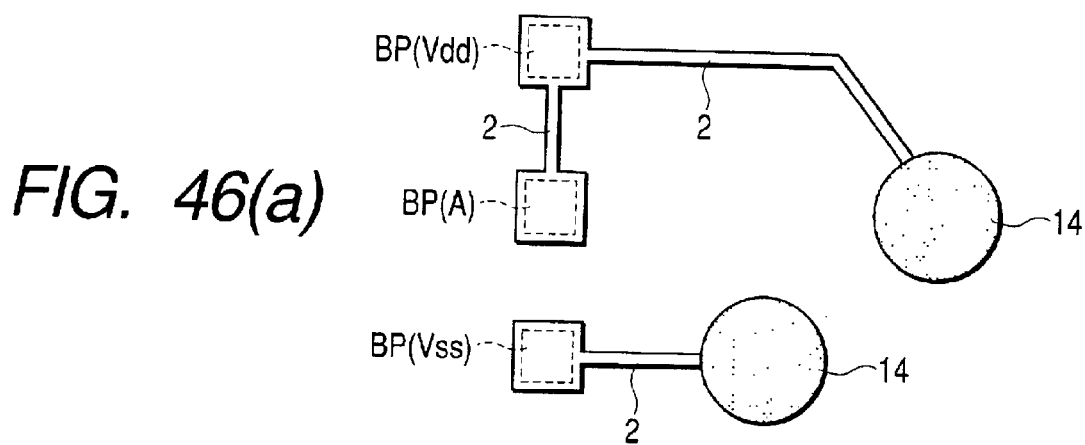
FIGS. 46(a) to (c) are plan views showing a method of selecting a driverability.
Figure 46B:
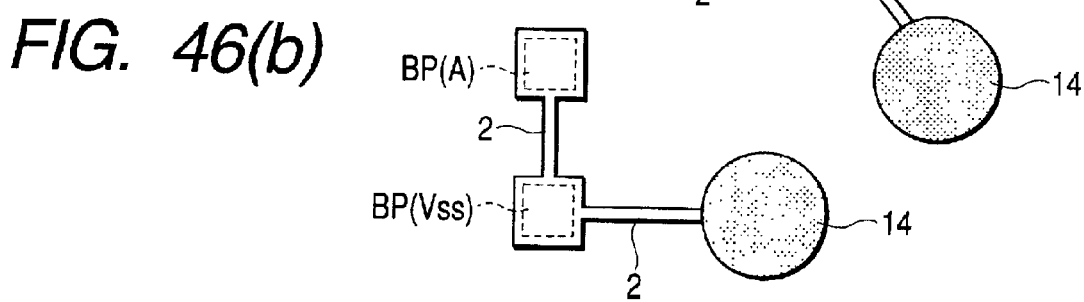

In order to switch the driverabilities of the WL-CSP, any one of a high-level voltage (Vdd) and a low-level voltage (Vss) is input to the bonding pad BP (A) connected to the switch A and the bonding pad BP (B) is connected to the switch B by using rerouting layer 2. For example, in order to turn on the switch A, as shown in FIG. 46(a), the bonding pad BP (A) connected to the switch A and the bonding pad BP (Vdd) for the power supply voltage (Vdd) are connected to each other through the rerouting layer 2. In order to turn off the switch A, as shown in FIG. 46(b), the bonding pad BP (A) connected to the switch A and the bonding pad BP (Vss) connected to a reference voltage (Vss) are connected to each other through the rerouting layer 2.

Figure 46C:
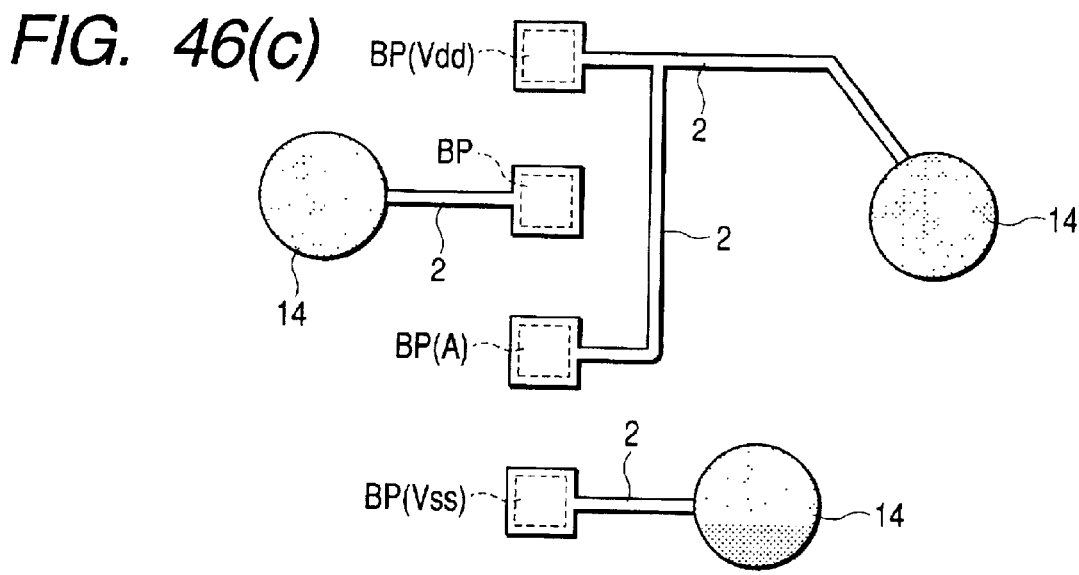

For example, as shown in FIG. 46(c), when another bonding pad BP for a signal is present between the bonding pad BP (A) connected to the switch A and the bonding pad BP (Vdd) for the power supply voltage (Vdd), another rerouting layer 2 connected to the bonding pad BP (Vdd) may be branched to be connected to the bonding pad BP (A) to turn on the switch A.

Although not shown, in order to turn on the switch B, the bonding pad BP (B) connected to the switch B is connected to the bonding pad BP (Vdd) for the power supply voltage (Vdd) through the rerouting layer 2. In order to turn off the switch B, the bonding pad BP (B) connected to the switch B is connected to the bonding pad BP (Vss) for the reference voltage (Vss) through the rerouting layer 2.

Figure 47:
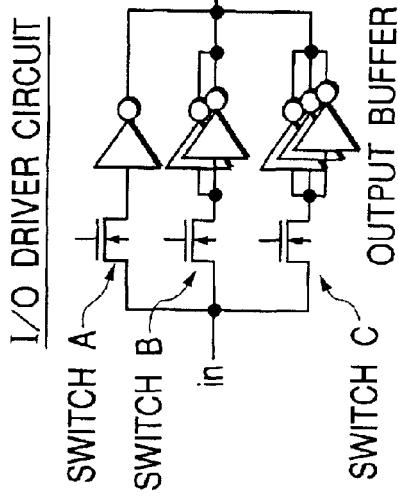
FIG. 47 is a schematic diagram showing still another example of an I/O driver circuit.

In the above example, although the driverabilities of the output buffers are switched in three steps, driverabilities can be switched in four or more steps, as a matter of course. For example, an I/O driver circuit shown in FIG. 47 is obtained by combining the I/O driver circuit shown in FIG. 42 and the I/O driver circuit shown in FIG. 45. More specifically, in this I/O driver circuit, the switches A, B, and C are connected to three output buffers having different driverabilities. For this reason, when the three switches A, B, and C are turned on/off by using the rerouting layers 2, the driverabilities of the output buffers can be switched in six steps in the range of one time to six times. For example, in an example shown in FIG. 48(a), a bonding pad BP (A) connected to the switch A is connected to a bonding pad BP (Vdd) for a power supply voltage (Vdd) through the rerouting layer 2, and a bonding pad BP(B) connected to the switch B and a bonding pad BP (C) connected to the switch C are connected to a bonding pad BP (Vss) for a reference voltage (Vss) through another rerouting layer 2. In this case, the switch A is turned on, and the switches B and C are turned off, so that a signal is output from on an output buffer to which the switch A is connected and which has a minimum driverability to a bonding pad BP (DQ). Therefore, the driverability of the WL-CSP is minimum. On the other hand, as in an example shown in FIG. 48(b), when the three bonding pads BP (A, B, and C) are connected to the bonding pad BP (Vdd) for the power supply voltage (Vdd) through the rerouting layers 2, all the three switches A, B, and C are turned on. In this case, since signals are output from the three output buffers to the bonding pad BP (DQ), the driverability of the WL-CSP is maximum.

In the above embodiment, a switch is constituted by one n-channel MOS transistor. However, an arbitrary element or circuit such as a p-channel MOS transistor or a CMOS circuit which is turned on/off by inputting a high/low-level signal can be used as the switch.

In this manner, according to this embodiment, only the patterns of the rerouting layers 2 are changed, so that the driverabilities of the output buffers can be easily switched.

Embodiment 9

Embodiment 8 describes a method of switching the driverabilities of the output buffers by changing rerouting patterns. However, in Embodiment 9, a method of switching voltages (I/O voltages) of output buffers will be described below.

When the voltage of a signal output from an LSI is not optimized for an external load, an unnecessary voltage amplitude is generated by a signal transmission path, so that noise or an increase in power consumption may be caused. When the voltage amplitude is large, a high-speed operation of the circuit may be prevented. In order to prevent the noise or the increase in power consumption or to realize the high-speed operation, it is effective that an operation voltage of the LSI, i.e., an I/O voltage is optimized according to an external load to decrease the voltage amplitude of the output signal.

In Embodiment 9, as a method of selecting an optimum I/O voltage, a method of changing rewiring patterns when the rewiring patterns are formed on a wafer is used. A concrete example of a method of switching operation voltages by changing the rerouting patterns will be described below.

Figure 49:
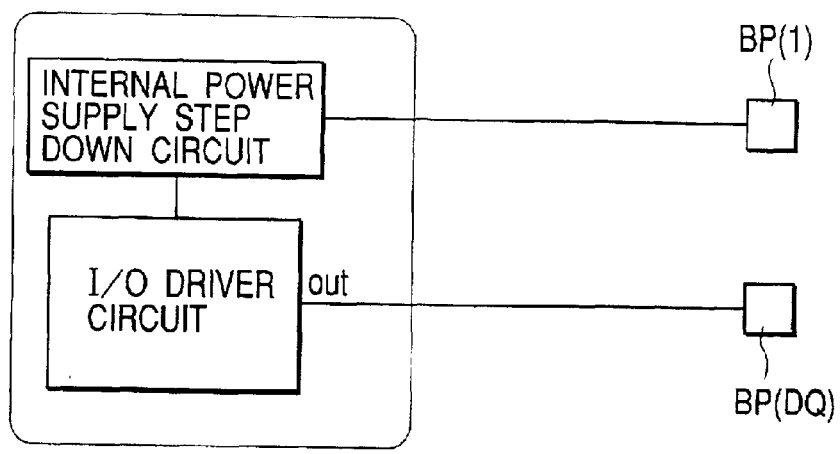
FIG. 49 is a schematic diagram showing an I/O voltage variable circuit.

FIG. 49 is a block diagram of a variable voltage amplitude circuit for I/O buffer formed in a WL-CSP. The variable voltage amplitude circuit for I/O buffer is constituted by an I/O driver circuit and an internal power supply step down circuit connected thereto. A bonding pad BP (DQ) is connected to the I/O driver circuit through an Al alloy wire, and a bonding pad BP1 is connected to the internal power supply step down circuit through an Al alloy wire.

Figure 50:
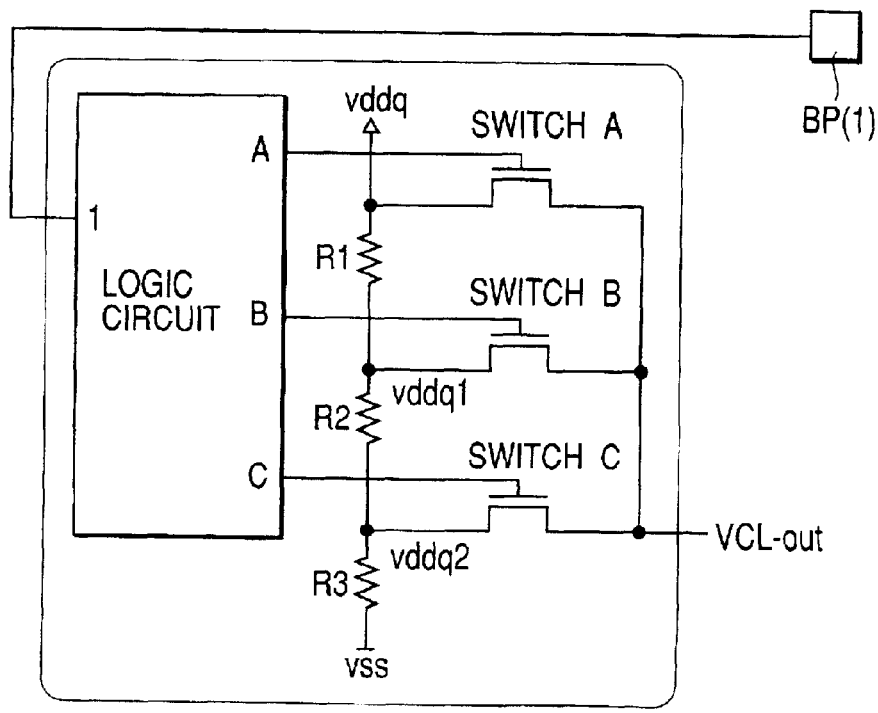
FIG. 50 is a schematic diagram showing an internal voltage-driver circuit of the I/O voltage variable circuit shown in FIG. 49.

FIG. 50 is a block diagram showing an example of the configuration of the internal power supply step down circuit. This internal power supply step down circuit is constituted by a logic circuit constituted by, e.g., a CMOS gate or the like, switches (a, b, and c) constituted by n-channel MOS transistors, and resistors (R1, R2, and R3). To the logic circuit, a high-level (Vdd) or low-level (Vss) voltage is input through the bonding pad BP1, or no voltage is input. As shown in a logic diagram in FIG. 51, a high-level or low-level voltage is output from an output (A, B, or C) of the logic circuit depending on the above three states.

On the other hand, three resistors (R1, R2, and R3) are connected in series with each other between a power supply voltage (vddq) and a reference voltage (vss). Voltages divided by these resistors (R1, R2, and R3) are generated as voltages vddq, vddq1, and vddq2, respectively. For example, it is assumed that vddq=3.3 V, R1=100 kΩ, R2=87.5 kΩ, and R3=225 kΩ are satisfied. In this case, voltages vddq1=2.5 V and vddq2=1.8 V are obtained.

The switches (a, b, and c) are connected to these resistors (R1, R2, and R3), respectively, and the switches (a, b, and c) are turned on/off depending on voltage levels (high or low) of the outputs (A, B, and C) of the logic circuit. In accordance with the combination of the ON/OFF states of these switches (a, b, and c), any one of the three voltages (vddq, vddq1, and vddq2) is output a final voltage (VCL-out), and an I/O voltage of the I/O driver circuit is determined.

Figure 52:
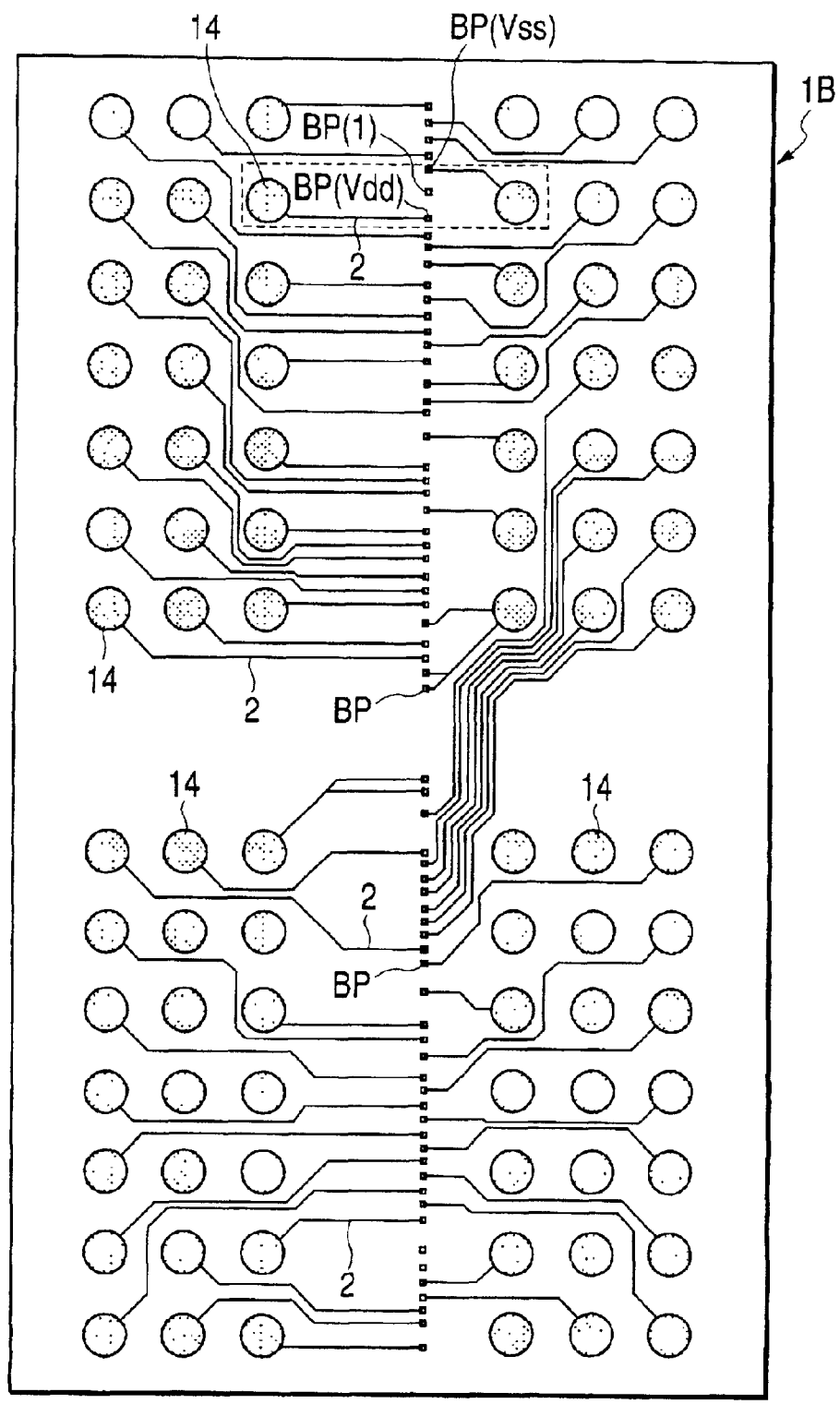
FIG. 52 is a plan view of a semiconductor chip showing a semiconductor integrated circuit device according to still another embodiment of the present invention.
Figure 53A:
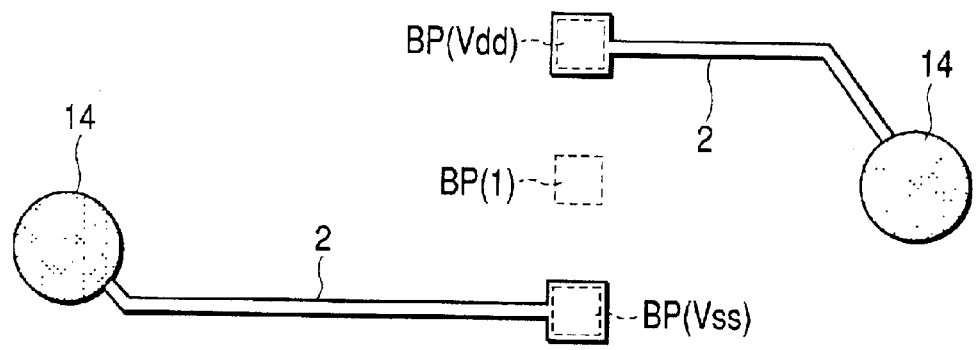
FIG. 53(a) is a plan view showing a method of selecting an I/O voltage.
Figure 53B:
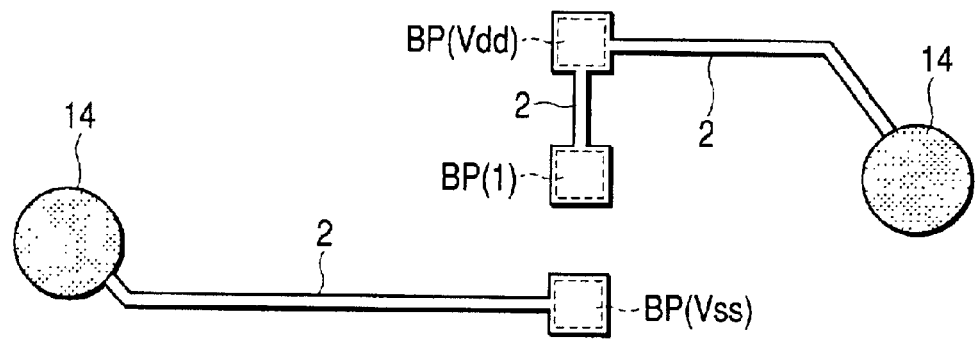
FIG. 53(b) is a plan view showing another method of selecting an I/O voltage.
Figure 53C:
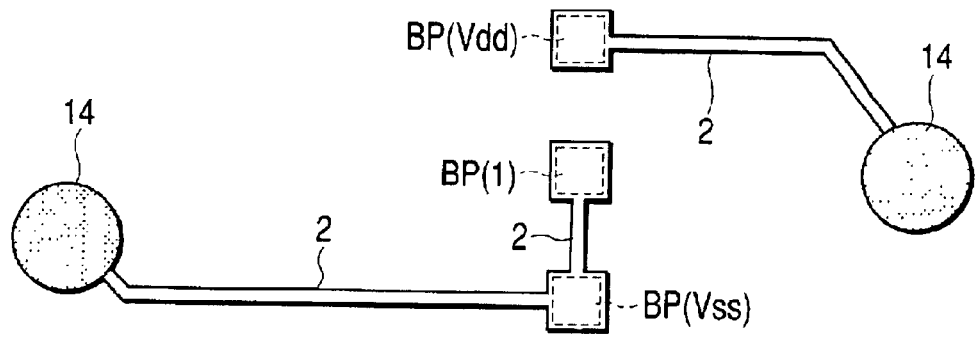
FIG. 53(c) is a plan view showing a still another method of selecting an I/O voltage.

FIG. 52 is a plan view of a semiconductor chip 1B showing a WL-CSP according to Embodiment 9 in which the bonding pad BP1 and the rerouting layers 2 are formed. FIG. 53 is an enlarged view showing a part of FIG. 52.

In order to switch the I/O voltages of the WL-CSP, the bonding pad BP (Vdd) for the power supply voltage (Vdd) or the bonding pad BP (Vss) for the reference voltage (Vss) and the bonding pad BP1 connected to the logic circuit are set in a connection state by the rerouting layer 2 or are set in a disconnect state.

For example, as shown in FIG. 53($a$), when the bonding pad BP1 is set in a disconnect state (no input), as is apparent from the logic diagram shown in FIG. 51, only the switch a of the three switches (a, b, and c) of the internal power supply step down circuit is turned on, and vddq=3.3 V is set as an output voltage (VCL-out). For this reason, the I/O voltage of the I/O drive circuit is 3.3 V as maximum. As shown in FIG. 53($b$), when the bonding pad BP (Vdd) is connected to the bonding pad BP1 through the rerouting layer 2 (high-level), only the switch b of the internal power supply step down circuit is turned on, and vddq1=2.5 V is set as the output voltage (VCL-out), the I/O voltage of the I/O drive circuit is vddq2=2.5 V. As shown in FIG. 53($c$), when the bonding pad BP (Vss) is connected to the bonding pad BP1 through the rerouting layer 2 (low level), only the switch c is turned on, vddq1=1.8 V is set as the output voltage (VCL-out). For this reason, the I/O voltage is 1.8 V.

In this manner, when the patterns of the rerouting layers 2 connected to the bonding pad BP1 are changed, a signal output from the WL-CSP can be optimized for an external load. In this manner, since a voltage amplitude of a signal transmission path can be decreased, noise or a power consumption can be reduced, and a high-speed operation can be realized. In this example, I/O voltages are switched in three steps. However, the I/O voltages can be switched in four or more steps as a matter of course. As a switch, an arbitrary element or circuit which is turned on/off by inputting a high-level/low-level signal.

According to this embodiment, the I/O voltages of output buffers can be easily switched by only changing the patterns of the rerouting layers 2.

Embodiment 10

In Embodiment 10, a method of switching slew rates of output buffers by changing rerouting patterns will be described below.

In general, as the voltage waveform of a pulse wave of a signal output from an LSI is smooth, i.e., the waveform increases in inclination, the delay of the signal increases, but noise is reduced. Therefore, in order to give priority to a reduction in noise rather than an operation speed, the inclination (slew rate) of the voltage waveform of the signal is desirably increased. On the other hand, when noise can be neglected, it is desirable that the slew rate is reduced to increase an operation speed.

In Embodiment 10, as a method of selecting an optimum slew rate, a method of changing the patterns of rerouting layers when the rerouting layers are formed on a wafer is used. A concrete example of a method of switching slew rates by changing rerouting patterns will be described below.

Figure 54:
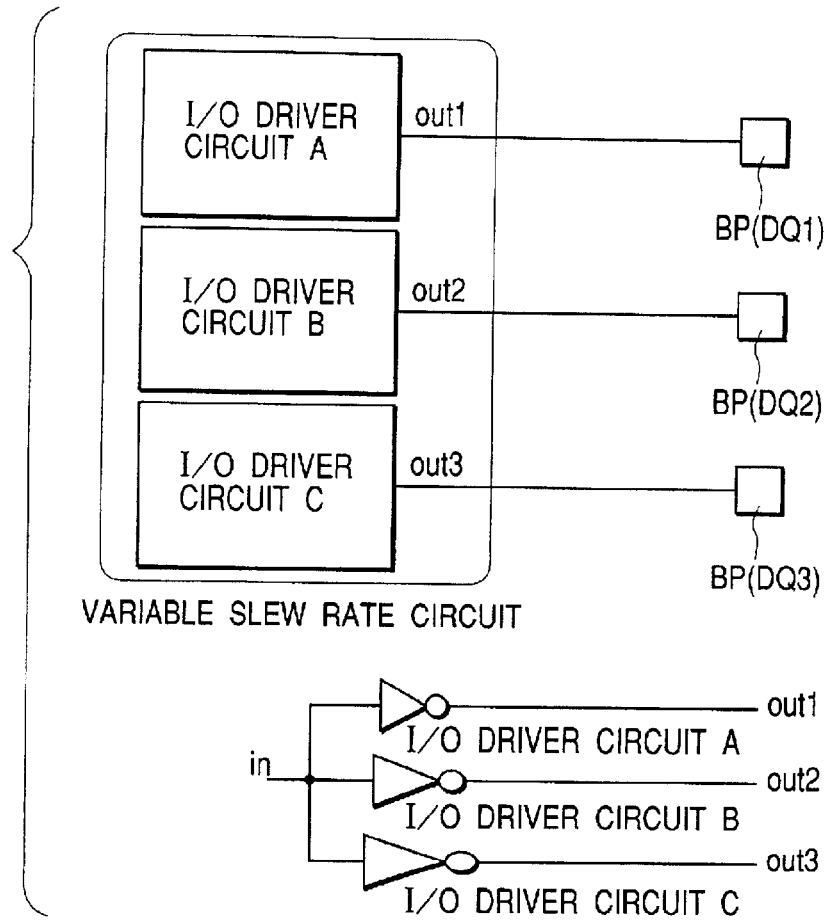
FIG. 54 is a schematic diagrams showing an example of a variable slew rate circuit.

FIG. 54 is a block diagram of a variable slew rate circuit formed in the WL-CSP. The variable slew rate circuit is constituted by three I/O driver circuits (A, B, and C) having different slew rates. Outputs (out1, out2, and out3) of the I/O driver circuits (A, B, and C) are connected to bonding pads BP (DQ1), BP (DQ2), and BP (DQ3) through Al alloy wires.

Figure 55:
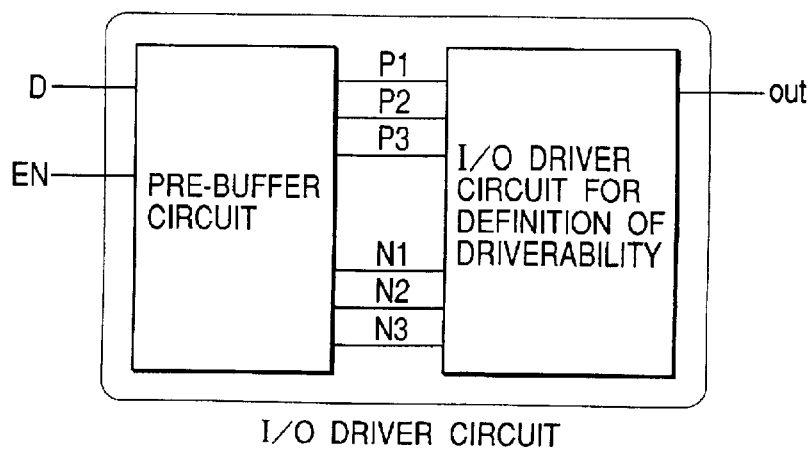
FIG. 55 is a schematic diagram showing an I/O driver circuit in the variable slew rate circuit shown in FIG. 54.
Figure 56:
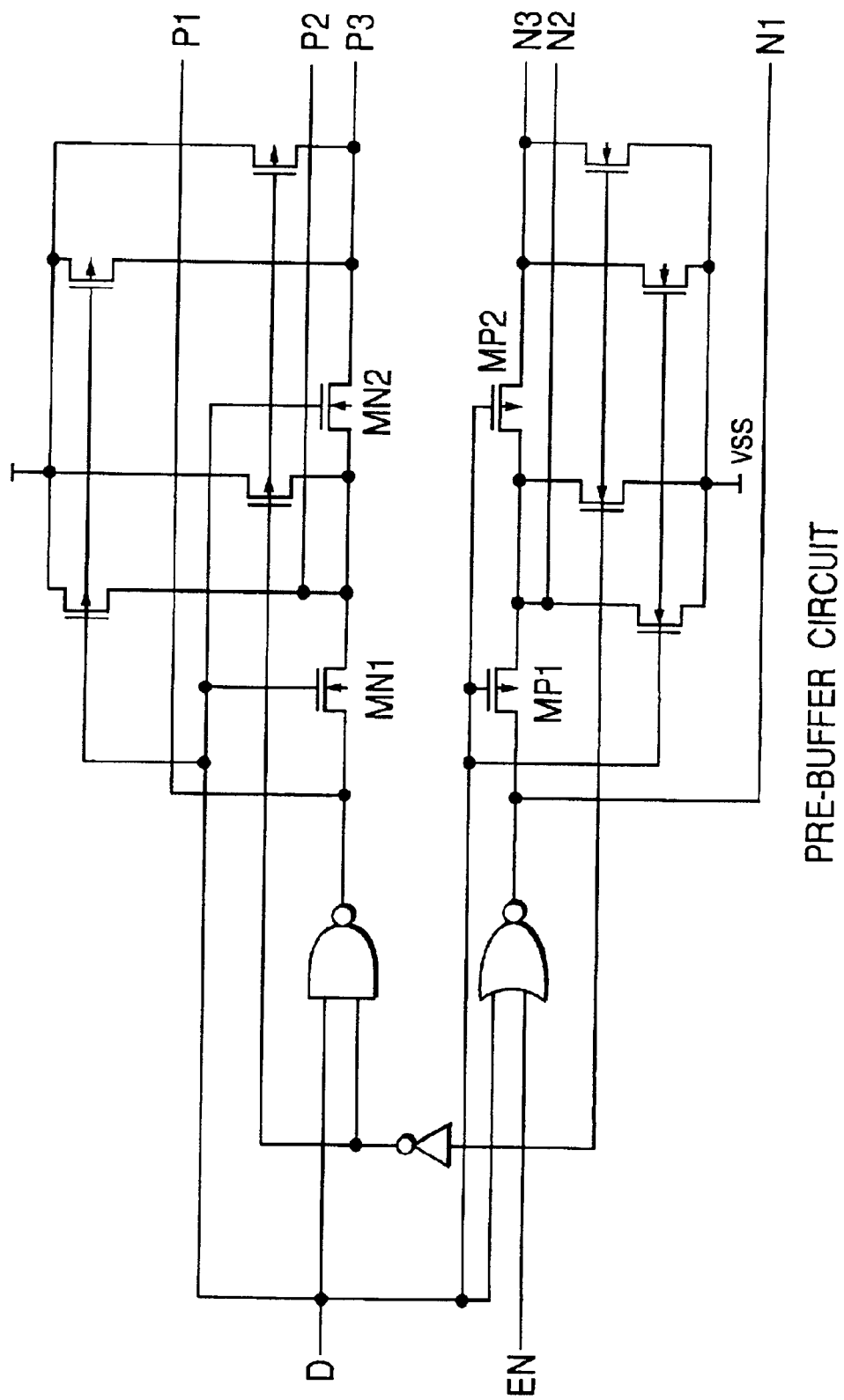
FIG. 56 is a diagram of a pre-buffer circuit of the I/O driver circuit shown in FIG. 55.

As shown in FIG. 55, each of the three I/O driver circuits (A, B, and C) is constituted by a pre-buffer circuit and an I/O driver circuit for definition of driverability. The pre-buffer circuit is constituted by a circuit shown in FIG. 56, and the I/O driver circuit for definition of driverability is constituted by a circuit as shown in, e.g., FIG. 57. The D terminal of the pre-buffer circuit is a signal input terminal. Reference symbol EN denotes an enable terminal which turns on/off an output from the I/O driver circuit for definition of driverability.

Figure 58:
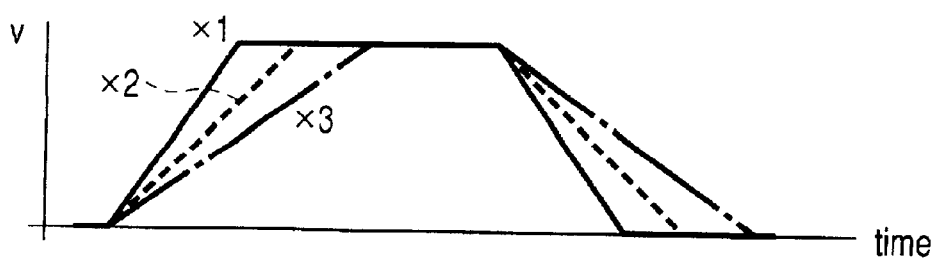
FIG. 58 is a diagram for explaining a slew rate.

FIG. 58 shows W/L ratios (W=gate length and L=gate width) of the n-channel MOS transistors (MN1 and MN2) and the p-channel MOS transistors (MP1 and MP2) formed on the I/O drive circuits (A, B, and C). As shown in FIG. 58, the W/L ratios of the MOS transistors (MN1, MN2, MP1, and MP2) of the I/O driver circuit B are almost half the W/L ratios of the MOS transistors (MN1, MN2, MP1, and MP2) of the I/O driver circuit A. The W/L ratios of the MOS transistors (MN1, MN2, MP1, and MP2) of the I/O driver circuit C are one-third of the W/L ratios of the MOS transistors (MN1, MN2, MP1, and MP2) of the I/O driver circuit A. Since the driverability of the MOS transistor is in proportion to the W/L ratio, the driverabilities of the MOS transistors (MN1, MN2, MP1, and MP2) of the I/O driver circuit B are two times the driverabilities of the MOS transistors (MN1, MN2, MP1, and MP2) of the I/O driver circuit C, and the driverabilities of the MOS transistors (MN1, MN2, MP1, and MP2) of the I/O driver circuit A are three times the driverabilities of the MOS transistors (MN1, MN2, MP1, and MP2) of the I/O driver circuit C. Therefore, timing errors between three outputs (P1, P2, and P3) of the pre-buffer circuits of the I/O driver circuits A, B, and C increase in the order named. Similarly, timing errors between three outputs (N1, N2, and N3) of the pre-buffer circuits of the I/O driver circuits A, B, and C increase in the order named.

Figure 57:
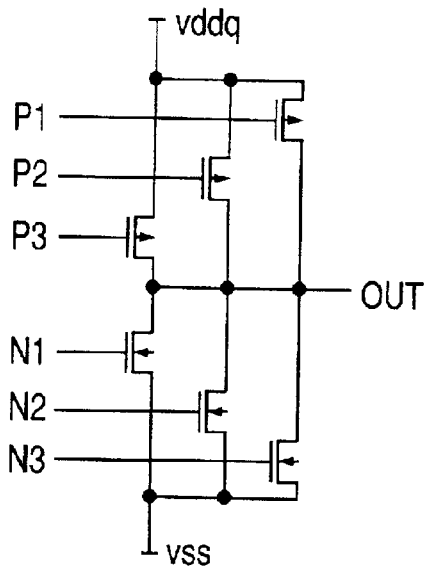
FIG. 57 is a diagram of a final-stage buffer circuit of an I/O driver circuit shown in FIG. 55.

The I/O driver circuit for definition of driverability as shown in FIG. 57 is constituted by a circuit obtained by connecting pre-stage, intermediate-stage and post-stage CMOS transistors in parallel to each other. The inclination (slew rate) of the voltage waveform of an output signal changes according to the differences of timings at which these CMOS transistors of three stages. As described above, the timing error between outputs of the pre-buffer circuit of the I/O driver circuit B is two times the timing error between outputs from the pre-buffer circuit of the I/O driver circuit A, and the timing error between outputs of the pre-buffer circuit of the I/O driver circuit C is three times the timing error between outputs from the pre-buffer circuit of the I/O driver circuit A. Therefore, the slew rate of the I/O driver circuit B is two times the slew rate of the I/O driver circuit A, and the slew rate of the I/O driver circuit C is three times the slew rate of the I/O driver circuit C.

Figure 59:
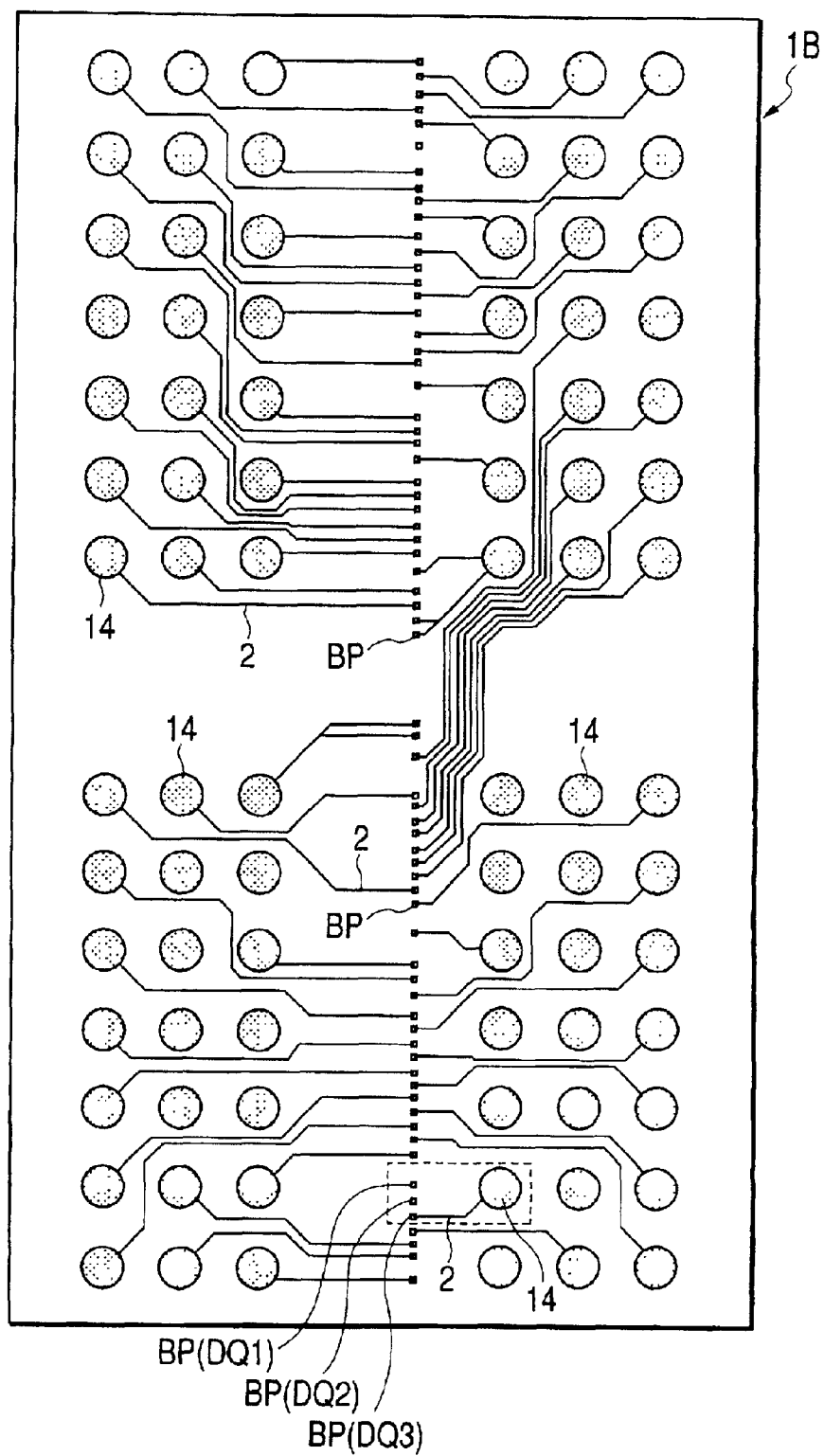
FIG. 59 is a plan view of a semiconductor chip showing a semiconductor integrated circuit device according to still another embodiment of the present invention.

FIG. 59 is a plan view of a semiconductor chip 1B showing a WL-CSP according to Embodiment 10 in which the bonding pads BP (DQ1), BP (DQ2), and BP (DQ3) connected to the outputs (out1, out2, and out3) of the I/O driver circuits (A, B, and C) and the rerouting layers 2 are formed. FIG. 60 is an enlarged view showing a part of FIG. 59.

Figure 60A:
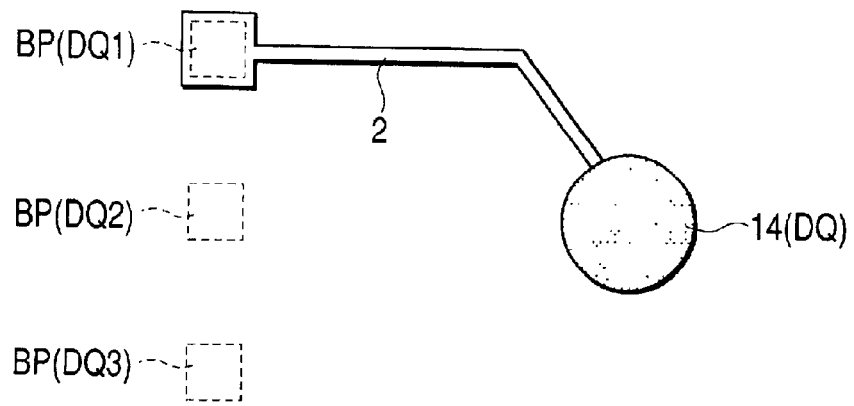
FIG. 60(a) is a plan view showing a method of selecting a slew rate.
Figure 60B:
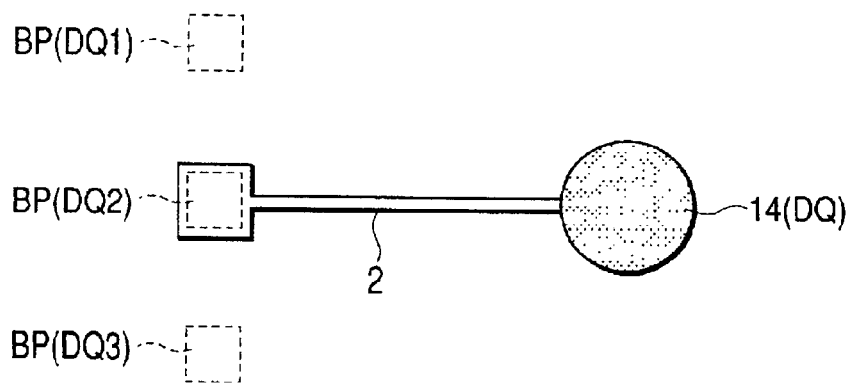
FIG. 60(b) is a plan view showing another method of selecting a slew rate.
Figure 60C:
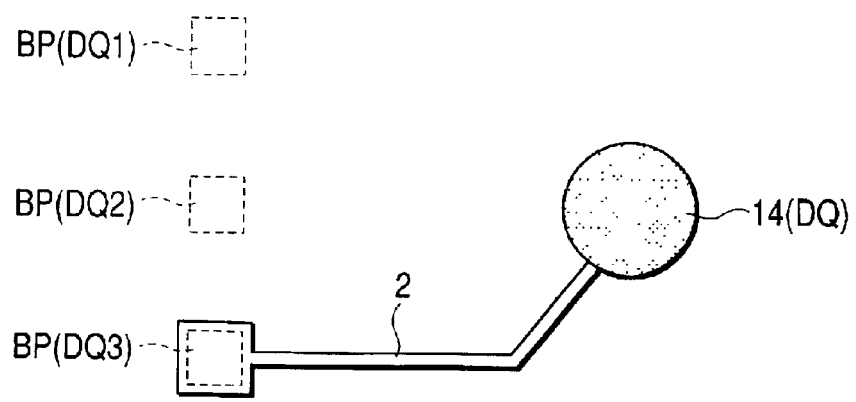
FIG. 60(c) is a plan view showing a still another method of selecting a slew rate.

As shown in FIGS. 60(a) to 60(c), in order to switch inclinations (slew rates) of the voltage waveforms of signals output from a WL-CSP, a solder bump 14 (external connection terminal) constituting a DQ pin and any one of the bonding pads BP (DQ1, DQ2, and DQ3) may be electrically connected to each other with the rerouting layer 2. For example, in the case in FIG. 60(a), the solder bump 14 constituting the DQ pin is connected to the bonding pad BP (DQ1) through the rerouting layer 2. In this case, since the solder bumps 14 constituting the DQ pin is connected to the output (out1) of the I/O driver circuit A through the bonding pad BP (DQ1), the slew rate of the WL-CSP is minimum. In the case shown in FIG. 60(b), the DQ pin (solder bump 14) is connected to the bonding pad BP (DQ2) through the rerouting layer 2. In this case, since the DQ pin (solder bump 14) is connected to the output (out2) of the I/O driver circuit B through the bonding pad BP (DQ2), the slew rate of the WL-CSP is two times the slew rate obtained in the case shown in FIG. 60(a). In the case in FIG. 60(c), the DQ pin (solder bump 14) is connected to the bonding pad BP (DQ3) through the rerouting layer 2. In this case, since the DQ pin (solder bump 14) is connected to the output (out3) of the I/O driver circuit C through the bonding pad BP (DQ3), the slew rate of the WL-CSP is three times the slew rate obtained in the case in FIG. 60(a).

Figure 61:
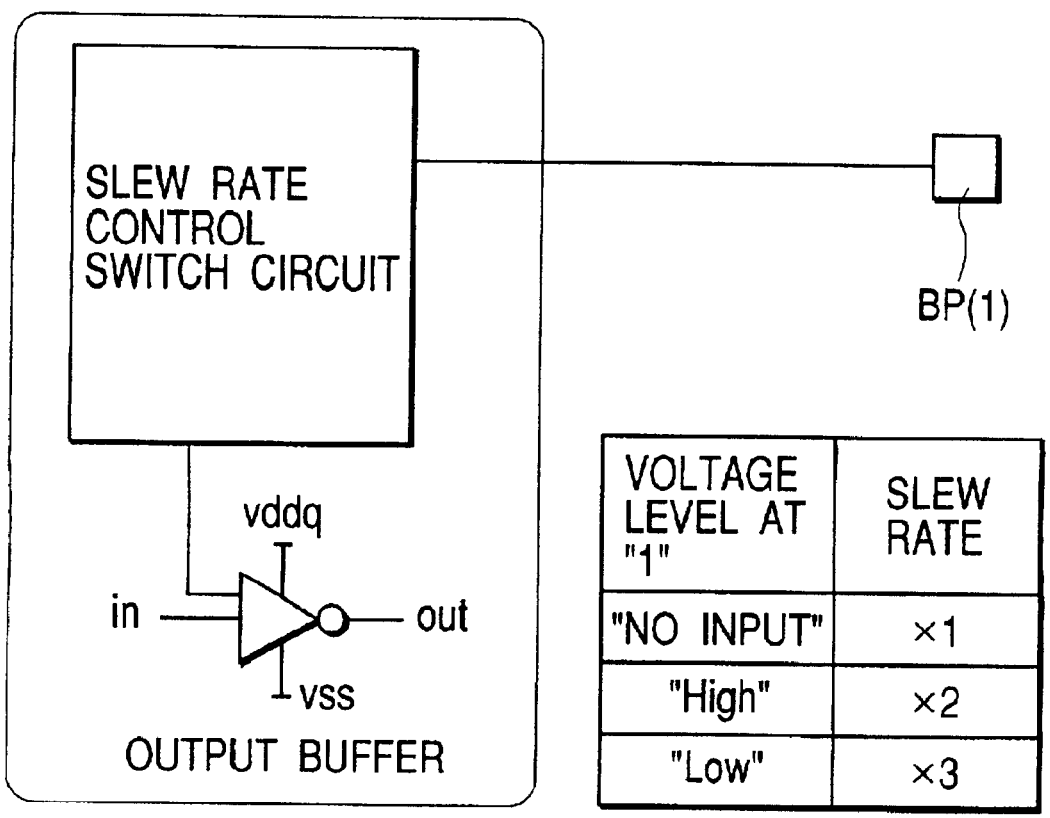
FIG. 61 is a schematic diagram showing another example of a variable slew rate circuit.

FIG. 61 shows another example of the variable slew rate circuit. This variable slew rate circuit is constituted by one output buffer and a slew rate control switch circuit connected to the input side of the output buffer. To the slew rate control switch circuit, a high-level (Vdd) or low-level (Vss) voltage is input through the bonding pad BP1, or no voltage is input. Signals having different slew rates are output from the output buffers depending on the three states.

Figure 62A:
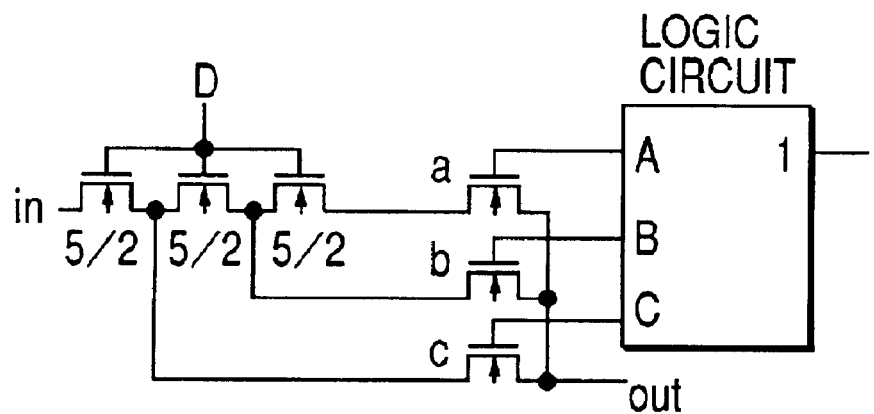
FIG. 62(a) is a block diagram showing slew rate control switch circuits of the variable slew rate circuit shown in FIG. 61

As shown in FIG. 62(a), the slew rate control switch circuit is constituted by a logic circuit, three switches (a, b, and c) constituted by n-channel MOS transistors, and three n-channel MOS transistors having equal W/L ratios. To the logic circuit, a high-level (Vdd) or low-level (Vss) voltage is input through the bonding pad BP1, or no voltage is input. As shown in the logic circuit in FIG. 63, high-level or low-level voltages are output from the outputs (A, B, and C) of the logic circuit depending on the three states, and the ON/OFF states of the three switches (a, b, and c) are switched, so that the slew rates of the output signals are set to be one time, two times, and three times.

Figure 62B:
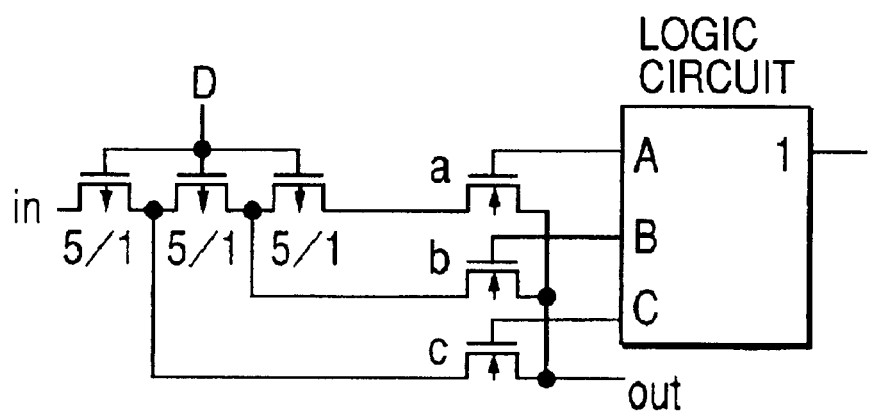
FIG. 62(b) is also a block diagram showing slew rate control switch circuits of the variable slew rate circuit shown in FIG. 61.

As shown in FIG. 62(b), the slew rate control switch circuit may be constituted by a logic circuit, switches (a, b, and c) constituted by p-channel MOS transistors, and p-channel MOS transistors having equal W/L ratios. The circuit shown in FIG. 62(a) may be combined to the circuit shown in FIG. 62(b).

In this example, in order to switch slew rates of the WL-CSP, the bonding pad BP (Vdd) for a power supply voltage (Vdd) or the bonding pad BP (vss) for a reference voltage (Vss) the bonding pad BP1 connected to the logic circuit are connected to each other with the rerouting layer 2, or are set in a disconnect state.

Figure 64A:
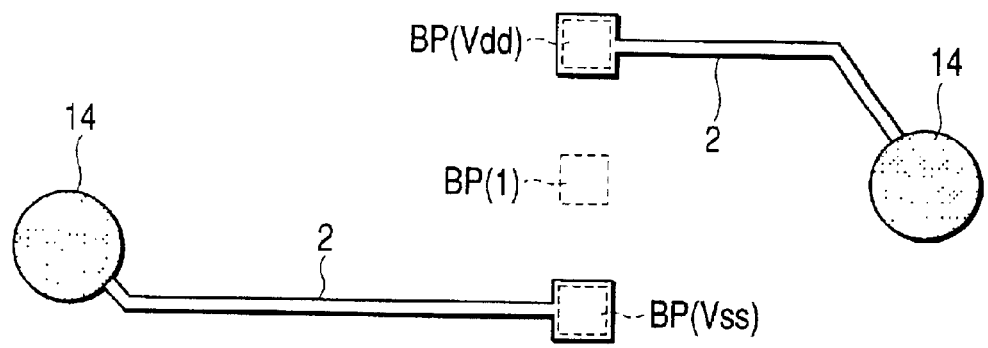
FIG. 64(a) is a plan view showing a method of selecting a slew rate.
Figure 64B:
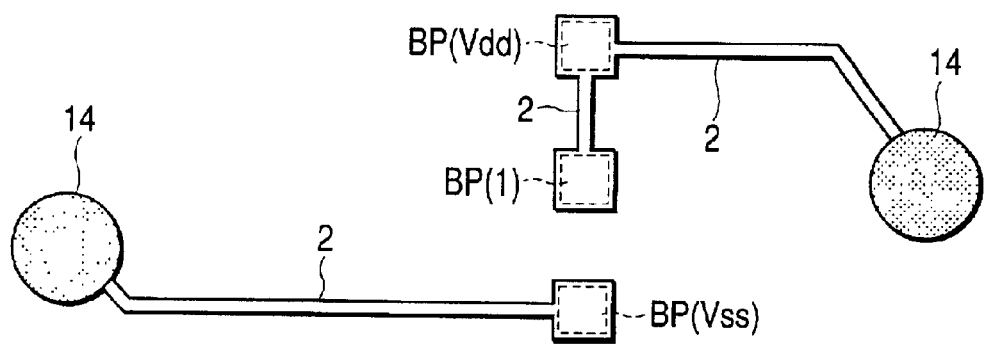
FIG. 64(b) is a plan view showing another method of selecting a slew rate.
Figure 64C:
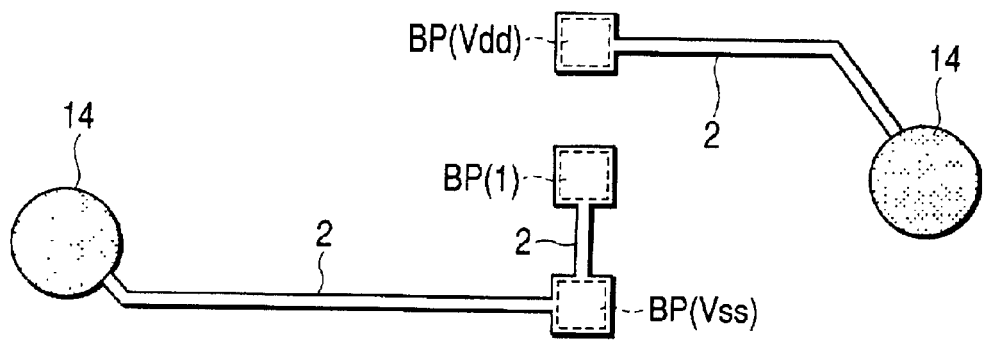
FIG. 64(c) is a plan view showing a still another method of selecting a slew rate.

For example, as shown in FIG. 64(a), when the bonding pad BP1 is set in a disconnect state (no input), only the switch a of the three switches (a, b, and c) of the slew rate control switch circuit is turned on from the logic circuit in FIG. 63. For this reason, the slew rate of an output signal is minimum (one time). As shown in FIG. 64(b), when the bonding pad BP (Vdd) is connected to the bonding pad BP1 through the rerouting layer 2 (high level), only the switch b of the three switches (a, b, and c) of the slew rate control switch circuit is turned on. For this reason, the slew rate of an output signal is two times. As shown in FIG. 64(c), when the bonding pad BP (Vss) is connected to the bonding pad BP1 through the rerouting layer 2 (low level), only the switch c of the three switches (a, b, and c) of the slew rate control switch circuit is turned on, the slew rate of an output signal is maximum (three times).

As described above, since the slew rate of a signal output from the WL-CSP can be changed by changing the pattern of the rerouting layer 2 connected to the bonding pad BP1, noise of the output signal can be reduced. In this example, although slew rates are switched in three steps, the slew rates can be switched in four or more steps as a matter of course. As the switch, an arbitrary element or circuit is turned on/off by inputting a high-level/low-level signal.

According to this embodiment, the slew rates of the output buffers can be easily switched by changing only the patterns of the rerouting layers 2.

The invention made by the present inventor has been described on the basis of Embodiments 1 to 10. However, the present invention is not limited to these embodiments, and the present invention can be variably changed without departing from the spirit and scope of the invention.

For example, a wafer test and a probe test are not performed before a wafer is stocked, and the wafer test and the probe test may be performed before rerouting layers are formed after a product type is fixed. In this case, a surface protection layer 3 covering the surface of the wafer 1 the product type of which is fixed is selectively etched to expose a bonding pad BP serving as a part of an wiring on the uppermost layer 4. Subsequently, a probe is brought into contact with the bonding pad BP to perform a test for deciding whether chip areas 1A are good or defective (wafer test and probe test). In this manner, after the product type is fixed, the bonding pad BP is exposed to perform a wafer test and a probe test, so that a natural oxide film can be prevented from being formed on the surface of the bonding pad BP or from being adhered with particles in holding the wafer 1.

Embodiment 1 has been described by using a center-pad type WL-CSP. However, the present invention can also be applied to a peripheral-pad type WL-CSP.

In addition, the present invention can be applied to not only a DRAM but also various memories such as an SRAM, an EEPROM, a flash memory, and a programmable logic array using a nonvolatile storage element, and various logic LSIs such as a microcomputer and a microprocessor.

What is claimed is:

1. A semiconductor integrated circuit device comprising: a semiconductor substrate having a major surface; a circuit element formed on the major surface of the semiconductor substrate and constituting an integrated circuit having a plurality of functions or a plurality of characteristics; an electrode formed on the major surface and connected to the circuit element; a first wiring, formed on the same surface on which the electrode is formed, for connecting the circuit element and the electrode to each other; an insulating layer covering the first wiring and the circuit element and formed to expose the electrode; a second wiring formed on the insulating layer and constituted by a layer different from the layer of the first wiring; and an external connection terminal arranged on the insulating layer,
wherein one of the plurality of functions of the integrated circuit or one of the plurality of characteristics of the integrated circuit is selected by a connection state between the electrode and the external connection terminal through the second wiring.

2. A semiconductor integrated circuit device according to claim 1, wherein the plurality of functions are a plurality of bit configurations or a plurality of operation modes, and the plurality of characteristics are a plurality of output impedances, a plurality of operation voltages, or a plurality of slew rates.

3. A semiconductor integrated circuit device according to claim 1, wherein one of the plurality of functions or one of the plurality of characteristics is selected by supplying a power supply voltage from the external connection terminal to the electrode, supplying a reference voltage, or setting the electrode and the external connection terminal in a disconnect state.

4. A semiconductor integrated circuit device according to claim 1, wherein the second wiring is constituted by a metal layer formed on an insulating layer by a thin film technique.

5. A semiconductor integrated circuit device according to claim 1, wherein the second wiring is constituted by a copper layer or a copper alloy layer.

6. A semiconductor integrated circuit device according to claim 1, wherein the second wiring is partially constituted by a copper post.

7. A semiconductor integrated circuit device according to claim 1, wherein the external connection terminal is constituted by a bump electrode.

8. A semiconductor integrated circuit device according to claim 1, wherein the external connection terminal is constituted by a wire electrode.

9. A semiconductor integrated circuit device according to claim 1, wherein the external connection terminal includes a plurality of external connection terminals, the electrode includes a plurality of electrodes, and an interval between the plurality of external connection terminals is designed to be larger than an interval between the plurality of electrodes.

10. A semiconductor integrated circuit device comprising: a semiconductor substrate; a plurality of semiconductor elements formed on one major surface of the semiconductor substrate and constituting an integrated circuit; a plurality of first conductive layers electrically connected to the plurality of semiconductor elements; an organic insulating layer formed on the plurality of first conductive layers; a second conductive layer extending on the organic insulating layer; and a plurality of external connection terminals formed on the organic insulating layer,
wherein the semiconductor integrated circuit device has a plurality of functions or a plurality of characteristics, and one of the plurality of functions or, one of the plurality of characteristics is selected by a connection state between the first conductive layers and the external connection terminals.

11. A semiconductor integrated circuit device according to claim 10, wherein the plurality of functions are a plurality of bit configurations or a plurality of operation modes, and the plurality of characteristics are a plurality of output impedances, a plurality of operation voltages, or a plurality of slew rates.

12. A semiconductor integrated circuit device according to claim 10, wherein one of the plurality of functions or one of the plurality of characteristics is selected by supplying a power supply voltage from the external connection terminals to the first conductive layers, supplying a reference voltage, or setting the first conductive layers and the external connection terminals in a disconnect state.

13. A semiconductor integrated circuit device according to claim 12, wherein when the power supply voltage or the reference voltage is supplied from the external connection terminals to the first conductive layers, the power supply voltage or the reference voltage is supplied through the second conductive layer.

14. A semiconductor integrated circuit device according to claim 10, wherein the organic insulating layer includes an elastomer layer.

15. A semiconductor integrated circuit device according to claim 10, wherein the organic insulating layer is formed of a polyimide resin.

16. A semiconductor integrated circuit device comprising: a semiconductor substrate having a major surface; a circuit element formed on the major surface of the semiconductor substrate and constituting a semiconductor integrated circuit; an electrode formed on the major surface and connected to the circuit element; a first wiring, formed or the same surface on which the electrode is formed, for connecting the circuit element and the electrode to each other; an insulating layer covering the first wiring and the circuit element and formed to expose the electrode; a second wiring formed on the insulating layer and constituted by a layer different from the layer of the first wiring; an external connection terminal arranged on the insulating layer; and an alignment pattern formed on the insulating layer and formed of the same material as that of the second wiring.

17. A semiconductor integrated circuit device comprising: a semiconductor substrate having a major surface; a circuit element formed on the major surface of the semiconductor substrate and constituting a semiconductor integrated circuit; an electrode formed on the major surface and connected to the circuit element; a first wiring, formed on the same surface on which the electrode is formed, for connecting the circuit element and the electrode to each other; an insulating layer covering the first wiring and the circuit element and formed to expose the electrode; a second wiring formed on the insulating layer and constituted by a layer different from the layer of the first wiring; an external connection terminal arranged on the insulating layer; and a product information pattern formed on the insulating layer and formed of the same material as that of the second wiring.

18. A semiconductor integrated circuit device according to claim 17, wherein the external connection terminal includes a plurality of external connection terminals which are formed at such positions that the external connection terminals interpose the electrode, and the production information pattern is formed at a position which is farther away from the electrode than the external connection terminal.

19. A semiconductor integrated circuit device according to claim 17, wherein the product information pattern includes a product name corresponding to selection of a function or an operation of the semiconductor integrated circuit.

* * * * *